(12) United States Patent
Ohara et al.

(10) Patent No.: US 10,311,791 B2
(45) Date of Patent: Jun. 4, 2019

(54) PIXEL CIRCUIT, DISPLAY DEVICE, AND METHOD FOR DRIVING SAME

(71) Applicant: Sharp Kabushiki Kaisha, Sakai, Osaka (JP)

(72) Inventors: Masanori Ohara, Sakai (JP); Hideki Uchida, Sakai (JP); Katsuhiro Kikuchi, Sakai (JP); Satoshi Inoue, Sakai (JP); Yuto Tsukamoto, Sakai (JP); Eiji Koike, Sakai (JP); Kazuo Takizawa, Sakai (JP); Noboru Noguchi, Sakai (JP); Noritaka Kishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/579,989

(22) PCT Filed: Jun. 29, 2016

(86) PCT No.: PCT/JP2016/069234
§ 371 (c)(1),
(2) Date: Dec. 6, 2017

(87) PCT Pub. No.: WO2017/010286
PCT Pub. Date: Jan. 19, 2017

(65) Prior Publication Data
US 2018/0174507 A1 Jun. 21, 2018

(30) Foreign Application Priority Data

Jul. 10, 2015 (JP) ................................. 2015-139253

(51) Int. Cl.
*G09G 3/325* (2016.01)
*G09G 3/3233* (2016.01)
(Continued)

(52) U.S. Cl.
CPC ............ *G09G 3/325* (2013.01); *G09G 3/3233* (2013.01); *G09G 3/3266* (2013.01); *H01L 51/50* (2013.01);
(Continued)

(58) Field of Classification Search
CPC ........ G09G 3/325; G09G 3/20; G09G 3/3233; H01L 51/50
See application file for complete search history.

(56) References Cited

U.S. PATENT DOCUMENTS

2001/0043180 A1* 11/2001 Mori ..................... G09G 3/3648
345/87
2006/0066254 A1* 3/2006 Sasaki .................. G09G 3/3233
315/169.3
(Continued)

FOREIGN PATENT DOCUMENTS

JP 4637070 B2 2/2011
WO 2014/021201 A1 2/2014

*Primary Examiner* — Carolyn R Edwards
(74) *Attorney, Agent, or Firm* — Keating & Bennett, LLP

(57) ABSTRACT

The purpose of the present invention is to suppress the fluctuation of a data line voltage that occurs when an analog voltage signal is sampled and held in a data line in a display device provided with a current-driven display element. Transistors (SWr, SWG, SWb) of each demultiplexer (252) are successively switched on, for each predetermined period, in a selection period of a write control line (SW_LR(i)). In a period when the transistor (SWr) is switched on, an analog video signal (Dj) from a data voltage output unit circuit (211*d*) is applied to a data line (SLrj) and a pixel circuit (50*r*). When the transistor SWr is then switched off, the voltage held by the data line (SLrj) decreases below the voltage of the analog video signal (Dj) due to a parasitic capacitance (Cssdr). However, the voltage of a voltage fluctuation compensation line (G3_Cnt (i)) changes from a low level to a high level within the selection period. This
(Continued)

causes the voltage of the data line (SLrj) to rise via a capacitor (Ccnt), and the decrease in voltage to be compensated for.

10 Claims, 28 Drawing Sheets

(51) Int. Cl.
    *H01L 51/50*         (2006.01)
    *G09G 3/3266*      (2016.01)

(52) U.S. Cl.
    CPC ............ *G09G 2300/0819* (2013.01); *G09G 2310/0278* (2013.01); *G09G 2310/0286* (2013.01); *G09G 2310/0289* (2013.01); *G09G 2310/0294* (2013.01); *G09G 2310/0297* (2013.01); *G09G 2310/06* (2013.01); *G09G 2320/0219* (2013.01); *G09G 2320/0276* (2013.01); *G09G 2320/0295* (2013.01); *G09G 2330/12* (2013.01); *G09G 2360/16* (2013.01)

(56) References Cited

U.S. PATENT DOCUMENTS

| | | | |
|---|---|---|---|
| 2007/0118781 A1 | 5/2007 | Kim | |
| 2012/0299978 A1* | 11/2012 | Chaji | G09G 3/3291 345/690 |
| 2013/0300724 A1* | 11/2013 | Chaji | G09G 3/3233 345/212 |
| 2014/0354704 A1* | 12/2014 | Pak | G09G 3/3291 345/690 |
| 2015/0213757 A1 | 7/2015 | Takahama et al. | |

* cited by examiner

PIXEL CIRCUIT, DISPLAY DEVICE, AND METHOD FOR DRIVING SAME

TECHNICAL FIELD

The present invention relates to a display device, and more particularly, relates to a display device including a display element driven by a current of an organic EL display device and the like, a driving method of the display device, and a pixel circuit in such a display device.

BACKGROUND ART

In the related art, a display element provided in a display device includes an electro-optical element with the brightness being controlled by an applied voltage and an electro-optical element with the brightness being controlled by a flowing current. A representative electro-optical element with the brightness being controlled by the applied voltage includes a liquid crystal display element. On the other hand, a representative electro-optical element with the brightness being controlled by the flowing current includes an organic Electro Luminescence (EL) element. The organic EL element is also called an Organic Light-Emitting Diode (OLED). An organic EL display device using an organic EL element that is a self-emitting electro-optical element can easily realize various features such as thinning, low power consumption, and high luminance, as compared to a liquid crystal display device requiring a backlight, a color filter and the like. Therefore, in recent years, active development of organic EL display devices are under progress.

As a scheme for driving the organic EL display device, passive matrix schemes (also called "simple matrix schemes") and active matrix schemes are known. An organic EL display device employing the passive matrix scheme, which is simple in structure, is difficult to achieve an increase in size and high definition. On the other hand, an organic EL display device employing the active matrix scheme (hereinafter, referred to as "active-matrix organic EL display device") can easily realize an increase in size and high definition, as compared to the organic EL display device employing the passive matrix scheme.

In the active-matrix organic EL display device, a plurality of pixel circuits are formed in a matrix. The pixel circuit of the active-matrix organic EL display device typically includes an input transistor configured to select a pixel and a drive transistor configured to control supply of a current to the organic EL element. Note that current flowing from the drive transistor to the organic EL element may be hereinafter called "drive current".

In the active-matrix display device, a plurality of data lines (also called "source lines"), a plurality of scanning signal lines (also called "gate lines") intersecting the plurality of data lines, and a plurality of pixel circuits arrayed in matrix along the plurality of data lines and the plurality of scanning signal lines are formed in a display unit. To cope with higher definition of a display image, a Source Shared Driving (SSD) scheme for driving more data lines while suppressing an increase in drive circuits is employed in some such active-matrix display devices. Here, the SSD scheme is a scheme in which the plurality of data lines in the display unit are grouped into a plurality of sets of data line groups where one set is formed of a predetermined number (two or more) of data lines, and an analog video signal is applied in time division manner to the predetermined number of data lines in each set.

When the SSD scheme is employed in the active-matrix display device, an analog video signal is applied to each data line via a switched-on analog switch, and a level of a control signal of the analog switch is then changed so that the analog switch is switched off, as a result of which voltage of the analog video signal is held in the data line. While the voltage of the analog video signal is thus held in each data line, any one of the plurality of scanning signal lines is activated (selected), and the voltage of the data line is thereby written, as pixel data, into the pixel circuit connected to the activated scanning signal line.

Note that the active-matrix organic EL display device employing the SSD scheme is disclosed, for example, in PTL 1. In this organic EL display device, a color display is performed based on a RGB tri-color. At that time, data lines in a display panel are grouped into a plurality of sets where one set is formed of three data lines including an R data line that is a data line to which a pixel circuit corresponding to a red pixel is connected, a G data line that is a data line to which a pixel circuit corresponding to a green pixel is connected, and a B data line that is a data line to which a pixel circuit corresponding to a blue pixel is connected, and one demultiplexer is arranged for each set. Each demultiplexer is configured to receive a data signal output from a data driver (data line drive circuit), and apply the data signal in time division manner to the R data line, the G data line, and the B data line connected to the demultiplexer.

CITATION LIST

Patent Literature

PTL 1: JP 4637070 B
PTL 2: WO 2014/021201

SUMMARY OF INVENTION

Technical Problem

As mentioned before, in the active-matrix organic EL display device employing the SSD scheme, the analog video signal is applied to each data line via the switched-on analog switch, and the level of the control signal of the analog switch is then changed so that the analog switch is switched off, as a result of which voltage of the analog video signal is held in the data line. In the display device in which the analog voltage signal is thus sampled and held by the analog switch, a phenomenon occurs where due to a parasitic capacitance, the voltage held in the data line decreases or increases from the original voltage of the analog video signal (this phenomenon is called "field through phenomenon"). This phenomenon is described with reference to FIG. 41 and FIG. 42, below.

FIG. 41 is a circuit diagram illustrating, in such a display device, a configuration of a portion corresponding to one data line SLk (hereinafter, referred to as "unit sample hold circuit") out of a sample hold circuit configured to sample the voltage of the analog video signal to be held in each data line SLi (i=1 to N). The unit sample hold circuit includes an N-channel type field effect transistor SWk as the analog switch (hereinafter, abbreviated as "Nch transistor"), and a parasitic capacitance Cgd formed between a gate terminal of the Nch transistor SWk and one conduction terminal connected to the data line SLk. An analog video signal Sv1 is applied to the other conduction terminal of the Nch transistor SWk, and a control signal Sck for controlling switch on/off of the Nch transistor SWk is applied to the gate terminal of the Nch Transistor SWk. The sampling circuit of the analog video signal Sv1 is configured by such an Nch transistor SWk (including the parasitic capacitance Cgd), and the unit sample hold circuit is configured by the sampling circuit and a capacitance (total capacitance formed by the data line SLk and another electrode) Csl of the data line SLk.

In the sampling circuit, when the analog switch is switched on, an on voltage (when the analog switch is configured by the Nch transistor, a high-level voltage (hereinafter, referred to as "H-level voltage")) is applied, as the control signal Sck, to the gate terminal of the Nch transistor SWk, and when the analog switch is switched off, an off voltage (when the analog switch is configured by the Nch transistor, a low-level voltage (hereinafter, referred to as "L-level voltage")) is applied, as the control signal Sck, to the gate terminal of the Nch transistor SWk.

As illustrated in FIG. 42, when the H-level voltage VCH is applied, as the control signal Sck, to the gate terminal of the Nch transistor SWk, the Nch transistor SWk is switched on, and the analog video signal Sv1 is applied, via the Nch transistor SWk, to the data line SLk. As a result, a voltage of the data line SLk (hereinafter, referred to as "data line voltage") Vsl is equivalent to a voltage Vv1 of the analog video signal Sv1. Subsequently, when the voltage applied to the gate terminal of the Nch transistor SWk as the control signal Sck changes from the H-level voltage VCH to the L-level voltage VCL, the Nch transistor SWk is switched off. At this time, a voltage change (VCH→VCL) in the gate terminal of the Nch transistor SWk affects the data line voltage Vsl via the parasitic capacitance Cgd. This results in a phenomenon, that is, a field through phenomenon in which the data line voltage Vsl is decreased from the voltage Vv1 of the analog video signal Sv1 in accordance with the voltage change. The amount of decrease of the voltage Vv1 of the analog video signal Sv1 by the field through phenomenon, that is, a field through voltage $\Delta Vsl$ can be expressed by the following equation provided that the voltage change in the gate terminal occurs instantaneously (provided that the Nch transistor SWk is instantaneously transitioned to the switched-off state).

$$\Delta Vsl = \{Cgd/(Csl+Cgd)\}(VCH-VCL)$$

Note that in the above example, the Nch transistor is used as the analog switch, and thus, the data line voltage Vsl decreases from the original voltage Vv1 due to the field through phenomenon; however, when a P-channel type field effect transistor (hereinafter, referred to as "Pch transistor") is used as the analog switch, the data line voltage Vsl increases from the original voltage Vv1 due to the field through phenomenon.

In display devices in which the analog voltage signal is sampled and held by the analog switch (active-matrix organic EL display device of SSD scheme, for example), as described above, the data line voltage Vsl fluctuates (decreases or increases) due to the field through phenomenon, and thus, it is not possible to sufficiently satisfactorily display an image represented by an input signal applied from outside. Meanwhile, when the data line voltage Vsl decreases due to such a field through phenomenon, a configuration may be possible where the voltage of the data signal is previously adjusted higher than usual so that this voltage decrease is compensated. However, this configuration may cause an increase in power consumption.

Therefore, an object of the present invention is to provide an active-matrix display device including a current-driven display element, the display device capable of suppressing a fluctuation of a data line voltage due to a field through phenomenon occurring when an analog voltage signal is sampled and held in a data line.

Solution to Problem

A first aspect of the present invention relates to a display device including: the plurality of data lines through which to transmit a plurality of analog voltage signals representing an image to be displayed; the plurality of write control lines intersecting the plurality of data lines; and a plurality of display elements driven by a current and arranged in matrix along the plurality of data lines and the plurality of write control lines, the display device including a function of measuring a drive current to be applied to each display element, and a pixel circuit being arranged to correspond to any one of a plurality of data lines and correspond to any one of a plurality of write control lines.

The pixel circuit includes: an electro-optical element with a brightness controlled by a current, the electro-optical element being one of the plurality of display elements;

a voltage holding capacity configured to hold a data voltage for controlling a drive current of the electro-optical element;

an input transistor including a control terminal connected to a corresponding write control line, the input transistor being a switching element configured to control a voltage supply from a corresponding data line to the voltage holding capacity;

a drive transistor configured to apply a drive current corresponding to the data voltage to the electro-optical element;

a monitor control transistor including a control terminal connected to a predetermined monitor control line arrayed along the corresponding write control line, the monitor control transistor being arranged between the drive transistor and the corresponding data line to allow a current flowing through the drive transistor to pass through;

a voltage fluctuation compensation transistor including a control terminal connected to a predetermined voltage fluctuation compensation line arrayed along the corresponding write control line and a first conduction terminal connected to the corresponding data line, the voltage fluctuation compensation transistor being connected in series to the monitor control transistor; and a voltage fluctuation compensation capacity formed between the first conduction terminal in the voltage fluctuation compensation transistor and the control terminal in the voltage fluctuation compensation transistor.

A second aspect of the present invention relates to a display device including: a plurality of data lines through which to transmit a plurality of analog voltage signals representing an image to be displayed; a plurality of write control lines intersecting the plurality of data lines; and a plurality of display elements driven by a current and arranged in matrix along the plurality of data lines and the plurality of write control lines, the display device including a function of measuring a drive current to be applied to each display element. The display device includes:

the plurality of pixel circuits according to the first aspect of the present invention, the plurality of pixel circuits arranged in matrix along the plurality of data lines and the plurality of write control lines with each of the plurality of pixel circuits being corresponded to any one of the plurality of data lines and corresponded to any one of the plurality of write control lines;

a plurality of monitor control lines arrayed along the plurality of write control lines to correspond to each of the plurality of write control lines;

a plurality of voltage fluctuation compensation lines arrayed along the plurality of write control lines to correspond to each of the plurality of write control lines;

a plurality of connection control transistors corresponding to each of the plurality of data lines, each of the plurality of connection control transistors including a first conduction terminal connected to a corresponding data line, a second conduction terminal configured to receive an analog voltage signal to be applied to the corresponding data line, and a control terminal configured to receive a connection control signal controlling switching on and off;

a data line drive circuit configured to apply the analog voltage signal to the second conduction terminal of each of the plurality of connection control transistors;

a write control line drive circuit configured to selectively drive the plurality of write control lines;

a monitor control line drive circuit configured to selectively drive the plurality of monitor control lines;

a voltage fluctuation compensation line drive circuit configured to selectively drive the plurality of voltage fluctuation compensation lines;

a current measurement circuit configured to measure, via the plurality of data lines and the plurality of connection control transistors, a drive current to be applied to a display element in each pixel circuit; and a drive control unit configured to control the plurality of connection control transistors, the write control line drive circuit, the monitor control line drive circuit, and the voltage fluctuation compensation line drive circuit, wherein the data line drive circuit includes a predetermined number of output terminals respectively corresponding to a plurality of sets of data line groups obtained by grouping the plurality of data lines where one set is formed of a predetermined number of two or more data lines, each output terminal is connected to a second conduction terminal of a predetermined number of connection control transistors corresponding to a predetermined number of data lines of a corresponding set.

The drive control unit generates a predetermined number of connection control signals respectively corresponding to a predetermined number of data lines of each set and respectively applies the predetermined number of connection control signals to the control terminals of the predetermined number of connection control transistors corresponding to a predetermined number of data lines of each set to thereby successively switch on the predetermined number of connection control transistors of each set for each predetermined period in a first selection period during which any one of the plurality of write control lines is in a selected state.

In the first selection period, the voltage fluctuation compensation line drive circuit changes, after the plurality of connection control transistors are changed from an on state to an off state, a voltage to be applied to a voltage fluctuation compensation line corresponding to a write control line in the selected state from a first voltage to a second voltage to thereby change a voltage of the corresponding voltage fluctuation compensation line opposite in direction to a change of a voltage to be applied to the control terminals of the plurality of connection control transistors to change the plurality of connection control transistors from an on state to an off state.

With respect to a third aspect of the present invention, in the second aspect of the present invention, the voltage fluctuation compensation line drive circuit returns, in a period during which the plurality of write control lines are in a non-selected state after the first selection period, the voltage of the voltage fluctuation compensation line corresponding to the write control line in the selected state in the first selection period from the second voltage to the first voltage.

With respect to a fourth aspect of the present invention, in the second aspect of the present invention, the voltage fluctuation compensation line drive circuit returns, in a period during which a write control line selected subsequently to the write control line in the selected state in the first selection period is in the selected state, the voltage of the voltage fluctuation compensation line corresponding to the write control line in the selected state in the first selection period from the second voltage to the first voltage, before the connection control transistor first changing from an on state to an off state starts the change to the off state.

With respect to a fifth aspect of the present invention, in the second aspect of the present invention, there is further provided a voltage source configured to supply the first and second voltages to the voltage fluctuation compensation line drive circuit, wherein a difference between the first voltage and the second voltage is changeable.

With respect to a sixth aspect of the present invention, in any one of the second to fifth aspects of the present invention, the first and second voltages are set to cancel out a voltage fluctuation in the plurality of data lines occurring as a result of the plurality of connection control transistors being changed from an on state to an off state in the first selection period, by a change from the first voltage to the second voltage of the voltage of the corresponding voltage fluctuation compensation line.

With respect to a seventh aspect of the present invention, in the second to sixth aspects of the present invention, upon measurement of a drive current to be applied to a display element in a pixel circuit corresponding to any one write control line of the plurality of write control lines, the drive control unit is configured to:

control, in a non-selection period during which the plurality of write control lines are in a non-selected state, the non-selection period occurring immediately after a second selection period during which the one write control line is selected, the monitor control line drive circuit and the voltage fluctuation compensation line drive circuit to cause a monitor control transistor and a voltage fluctuation compensation transistor in the pixel circuit corresponding to the one write control line to be switched on; and apply the predetermined number of connection control signals to each of control terminals of a predetermined number of connection control transistors corresponding to a predetermined number of data lines of each set to thereby successively switch on the predetermined number of connection control transistors of each set for each predetermined period in the non-selection period, wherein the current measurement circuit measures a current flowing through a drive transistor in the pixel circuit corresponding to the one write control line via a switched-on transistor out of the monitor control transistor, the voltage fluctuation compensation transistor, and the predetermined number of connection control transistors of each set.

With respect to an eighth aspect of the present invention, in the second to seventh aspects of the present invention, a transistor included in each pixel circuit and the plurality of connection control transistors are thin film transistors with a channel layer formed of an oxide semiconductor.

Other aspects of the present invention are apparent from the description relating to the above-described first to eighth aspects of the present invention and each embodiment described below, and thus, the description thereof is omitted.

Advantageous Effects of Invention

In the display device provided with the pixel circuit according to the first aspect of the present invention, when, after the analog voltage signal indicating the pixel data to be written into the pixel circuit is applied via the connection control transistor as the switching element from a data-side drive circuit to a data line corresponding to the pixel circuit, the connection control transistor is switched off due to a parasitic capacitance of the connection control transistor, and the voltage held in the data line fluctuates from the voltage of the analog voltage signal (when the connection control transistor is of N channel type, the voltage of the data line decreases, and when it is of P channel type, the voltage of the data line increases). However, when a change of a voltage opposite in direction to a change of a voltage applied to a control terminal of the connection control transistor to change the connection control transistor from an on state to an off state is applied to the voltage fluctuation compensation line arrayed along the write control line corresponding to the pixel circuit, the voltage change works in a direction to cancel out the voltage fluctuation of the data line via a voltage fluctuation compensation capacity in the pixel circuit. As a result, the voltage fluctuation of the data line occurring when the connection control transistor is changed to the off state is compensated. Thus, it is not necessary to correct the analog data signal voltage in advance in order to compensate for such a data line voltage fluctuation. When the connection control transistor is an N-channel type, the voltage of the data line decreases when the connection control transistor is changed to the off state, and thus, in a case where the analog voltage signal is corrected beforehand for the compensation, the voltage of the analog voltage signal increases above the original voltage, resulting in an increase in power consumption. According to the first aspect of the present invention, it is possible to suppress such an increase in power consumption.

Furthermore, in the display device provided with the pixel circuit, when measuring a current flowing through the drive transistor (drive current to be applied to the display element) to compensate for a variation in characteristics of the drive transistor in the pixel circuit, the monitor control line and the voltage fluctuation compensation line arrayed along the write control line corresponding to the pixel circuit are both in the selected state (active), and the current measurement circuit arranged in the display device measures the current flowing through the drive transistor via the monitor control transistor, the voltage fluctuation compensation transistor, and the data line in the pixel circuit. On the other hand, in such a current measurement, when the pixel circuit is not subject to current measurement, the monitor control line and the voltage fluctuation compensation line arrayed along the write control line corresponding to the pixel circuit are both in the non-selected state (non-active), and the monitor control transistor and the voltage fluctuation compensation transistor connected in series in the pixel circuit are both switched off. Thus, according to the first aspect of the present invention, it is possible to surely suppress a leakage current flowing out to the data line or flowing in from the data line in a pixel circuit other than the pixel circuit to be measured by the current measurement circuit, and it is also possible to highly accurately measure the current of the drive transistor of the pixel circuit to be measured.

According to the second aspect of the present invention, in the first selection period during which any one of the plurality of write control lines is in the selected state, the predetermined number of connection control transistors of each set are successively switched on for each predetermined period, and when, in the first selection period, the analog voltage signal from each output terminal of the data line drive circuit is applied to the data line corresponding to the switched-on connection control transistor so that the connection control transistor is changed the off state, and the analog voltage signal is held as the pixel data voltage in the data line. At this time, due to the parasitic capacitance of the connection control transistor, the voltage held in the data line fluctuates from the voltage of the analog voltage signal (when the connection control transistor is of N channel type, the voltage of the data line decreases and when it is of P channel type, the voltage of the data line increases). In the first selection period, after the plurality of connection control transistors including the connection control transistor are changed from an on state to an off state, the voltage of the voltage fluctuation compensation line corresponding to the write control line in the selected state is changed opposite in direction to the change of the voltage applied to the control terminals to change the plurality of connection control transistors from an on state to an off state (changed from the first voltage to the second voltage). The voltage change of the voltage fluctuation compensation line works in the direction to cancel out the voltage fluctuation of the data line via the voltage fluctuation compensation capacity in the pixel circuit corresponding to the data line. As a result, the voltage fluctuation of the data line occurring when the connection control transistor is changed to switched off is compensated. Thus, it is not necessary to correct the analog data signal voltage in advance in order to compensate for such a data line voltage fluctuation. When the connection control transistor is of N channel type, the voltage of the data line decreases when the connection control transistor is changed to the off state, and thus, in a case where the analog voltage signal is corrected in advance for the compensation, the voltage of the analog voltage signal increases above the original voltage, resulting in an increase in power consumption. According to the second aspect of the present invention, it is possible to suppress such an increase in power consumption.

According to the third aspect of the present invention, in a period during which all the write control lines are in the non-selected state after the first selection period, the voltage of the voltage fluctuation compensation line to which the second voltage is applied in the first selection period is returned to the first voltage, and thus, the change from the second voltage to the first voltage does not affect the data voltage held in each pixel circuit.

According to the fourth aspect of the present invention, in a period during which the write control line selected subsequently to the write control line in the selected state in the first selection period is selected (subsequent selection period), before the connection control transistor first changing from an on state to an off state starts the change to the off state, the voltage of the voltage fluctuation compensation line to which the second voltage is applied in the first selection period is returned to the first voltage. Thus, the change from the second voltage to the first voltage does not affect the data voltage to be written and held into the pixel circuit corresponding to the write control line in the selected state in the subsequent selection period, and does not affect the data voltage held in the pixel circuit other than these pixel circuits, either. Furthermore, according to the fourth aspect of the present invention, in response to a selection timing of each write control line, the voltage of the voltage fluctuation compensation line corresponding thereto is switched between the first voltage and the second voltage, and thus, a dedicated control signal for returning the voltage of each voltage fluctuation compensation line to the first voltage is not required, and it is possible to simplify the configuration of the voltage fluctuation compensation line drive circuit, resulting in a decrease in power consumption in accordance therewith.

According to the fifth aspect of the present invention, a power supply configured to supply the voltage fluctuation compensation line drive circuit with the first and the second voltages to be applied to each voltage fluctuation compensation line is configured so that a difference between the first voltage and the second voltage is changeable. Thus, when the difference between the first voltage and the second voltage is adjusted according to the size of the voltage fluctuation of the data line occurring due to the parasitic capacitance when the connection control transistor is changed to the off state, it is possible to sufficiently compensate for the voltage fluctuation. Furthermore, in addition to such a compensation for the voltage fluctuation of the data line due to the parasitic capacitance, when the voltage of the analog voltage signal applied to the data line, the voltage held in the data line, or the voltage written as the pixel data into the pixel circuit are insufficient, it is possible to compensate for the insufficiency by the adjustment of the difference between the first voltage and the second voltage.

According to the sixth aspect of the present invention, the first and the second voltages to be applied to the plurality of voltage fluctuation compensation lines are set canceling out a voltage fluctuation in the plurality of data lines occurring as a result of the plurality of connection control transistors being changed from an on state to an off state in the first selection period, by the change of the voltage of the voltage fluctuation compensation line corresponding to the write control line in the selected state in the first selection period. Thus, it is possible to eliminate the need to correct the analog voltage signal for compensating for the voltage fluctuation in the plurality of data lines, and it is possible to more reliably solve problems such as increases in power consumption due to the correction.

According to the seventh aspect of the present invention, upon measurement of a drive current to be applied to a display element in a pixel circuit corresponding to any one write control line of the plurality of write control lines, in a non-selection period during which all the write control lines are in the non-selected state occurring immediately after a second selection period during which the one write control line is selected, the monitor control transistor and the voltage fluctuation compensation transistor in the pixel circuit corresponding to the one write control line are switched on, and furthermore, a predetermined number of connection control transistors of each set are successively switched on for each predetermined period. In the non-selection period, the current flowing through the drive transistor of the pixel circuit corresponding to the one write control line is measured via a switched-on transistor out of the monitor control transistor, the voltage fluctuation compensation transistor, and a predetermined number of connection control transistors of each set in the pixel circuit. In such a current measurement, in a pixel circuit other than the pixel circuit corresponding to the one write control line and not subject to the current measurement, the monitor control transistor and the voltage fluctuation compensation transistor connected in series to each other are both switched off. Thus, it is possible to reliably suppress a leakage current flowing out to the data line or flowing in from the data line in the pixel circuit that is not subject to current measurement, and it is also possible to highly accurately measure the current of the drive transistor of the pixel circuit to be measured.

According to the eighth aspect of the present invention, the transistor included in each pixel circuit and the plurality of connection control transistors are thin film transistors with a channel layer formed of an oxide semiconductor, and thus, it is possible to obtain a similar effect to the second aspect of the present invention while decreasing the power consumption as compared to when another type of thin film transistor is used.

The effects of the other aspects of the present invention are apparent from the effects of the above-described first to eighth aspects of the present invention and each embodiment below, and thus, the description is omitted.

DESCRIPTION OF EMBODIMENT

With reference to the drawings, embodiments of the present invention will be described below. Note that in each transistor described below, the gate terminal corresponds to the control terminal, one of the drain terminal and the source terminal corresponds to a first conduction terminal, and the others correspond to a second conduction terminal. Furthermore, according to a general definition, the drain terminal and the source terminal of the transistor change depending on switching of a current direction; however, for convenience, either one of the two conduction terminals of the transistor is fixedly used as the drain terminal and the other is fixedly used as the source terminal.

1. First Embodiment
1.1 Overall Configuration and Operation Summary

Figure 1:
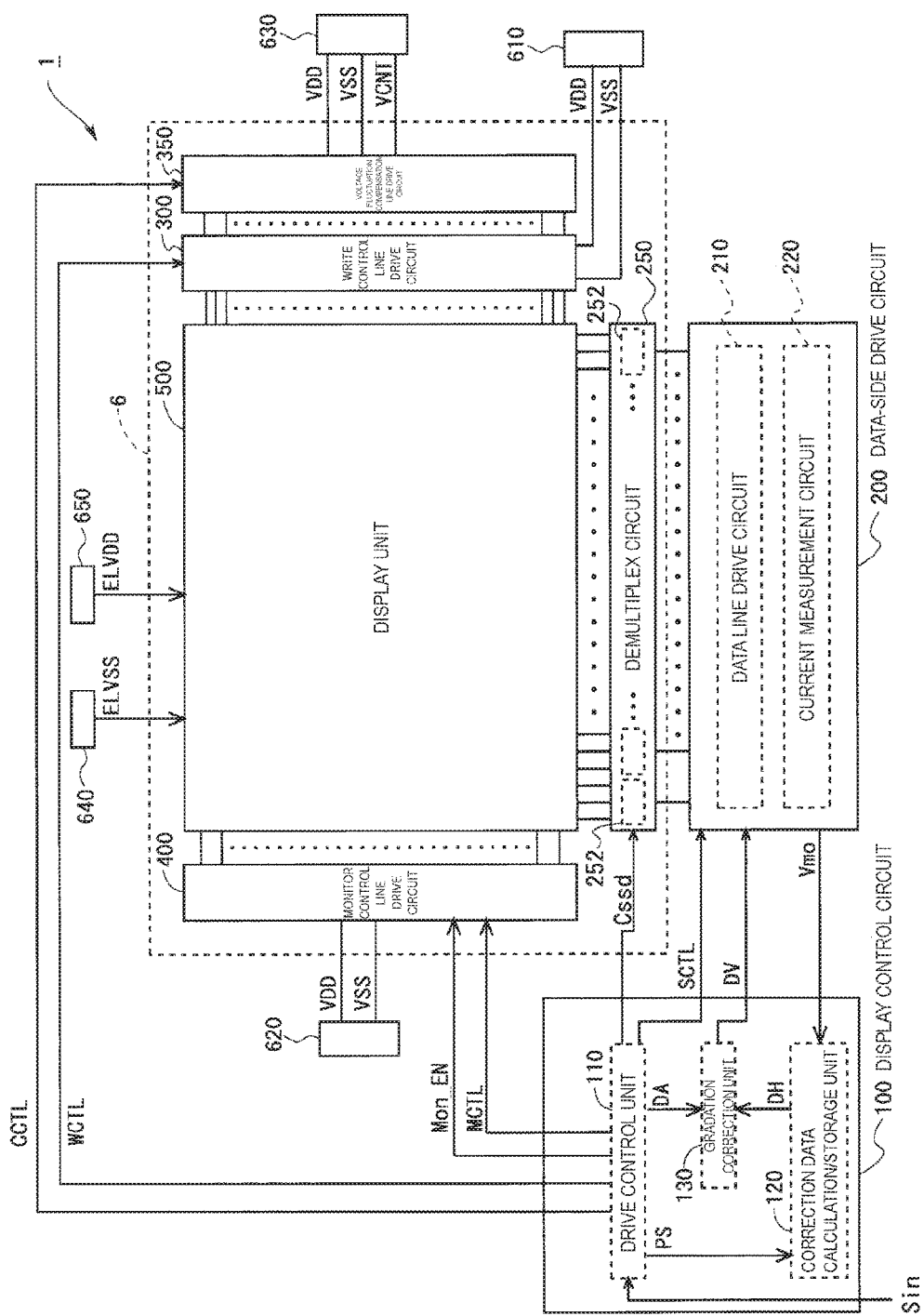
FIG. 1 is a block diagram illustrating an overall configuration of an organic EL display device according to a first embodiment of the present invention.

FIG. 1 is a block diagram illustrating a whole configuration of an active-matrix organic EL display device 1 according to a first embodiment of the present invention. The organic EL display device 1 includes a display control circuit 100, a data-side drive circuit 200, a write control line drive circuit 300, a voltage fluctuation compensation line drive circuit 350, a monitor control line drive circuit 400, a demultiplex circuit 250, and a display unit 500. The data-side drive circuit 200 includes a portion functioning as a data line drive circuit 210 and a portion functioning as a current measurement circuit 220. Note that in the present embodiment, in the organic EL panel 6, the write control line drive circuit 300, the voltage fluctuation compensation line drive circuit 350, the monitor control line drive circuit 400, and the demultiplex circuit 250 are integrally formed with the display unit 500; however, the present invention is not limited to such a configuration. Furthermore, in the organic EL display device 1, logic power supplies 610, 620, 630, an organic EL high-level power supply 650, and an organic EL low-level power supply 640 are provided as constitutional components to supply the organic EL panel 6 with various types of power supply voltages.

The organic EL panel 6 is supplied with a high-level power supply voltage VDD and a low-level power supply voltage VSS required for an operation of the write control line drive circuit 300 from the logic power supply 610, a high-level power supply voltage VDD and a low-level power supply voltage VSS required for an operation of the monitor control line drive circuit 400 from the logic power supply 620, and a high-level power supply voltage VDD, a low-level power supply voltage VSS, and a voltage fluctuation compensation voltage (hereinafter, referred to as "counter voltage") VCNT required for an operation of the voltage fluctuation compensation line drive circuit 350 from the logic power supply 630. Furthermore, the organic EL panel 6 is supplied with a high-level power supply voltage ELVDD from the organic EL high-level power supply 650 and a low-level power supply voltage ELVSS from the organic EL low-level power supply 640. Note that the high-level power supply voltage VDD, the low-level power supply voltage VSS, the counter voltage VCNT, the organic EL high-level power supply voltage ELVDD and the organic EL low-level power supply voltage ELVSS each have a constant voltage (DC voltage). Power supply lines through which to supply the high-level power supply voltage VDD, the low-level power supply voltage VSS, the high-level power supply voltage ELVDD, and the low-level power supply voltage ELVSS are indicated with symbols "ELVDD", "ELVSS", "VDD", and "VSS", respectively, below.

Figure 2:
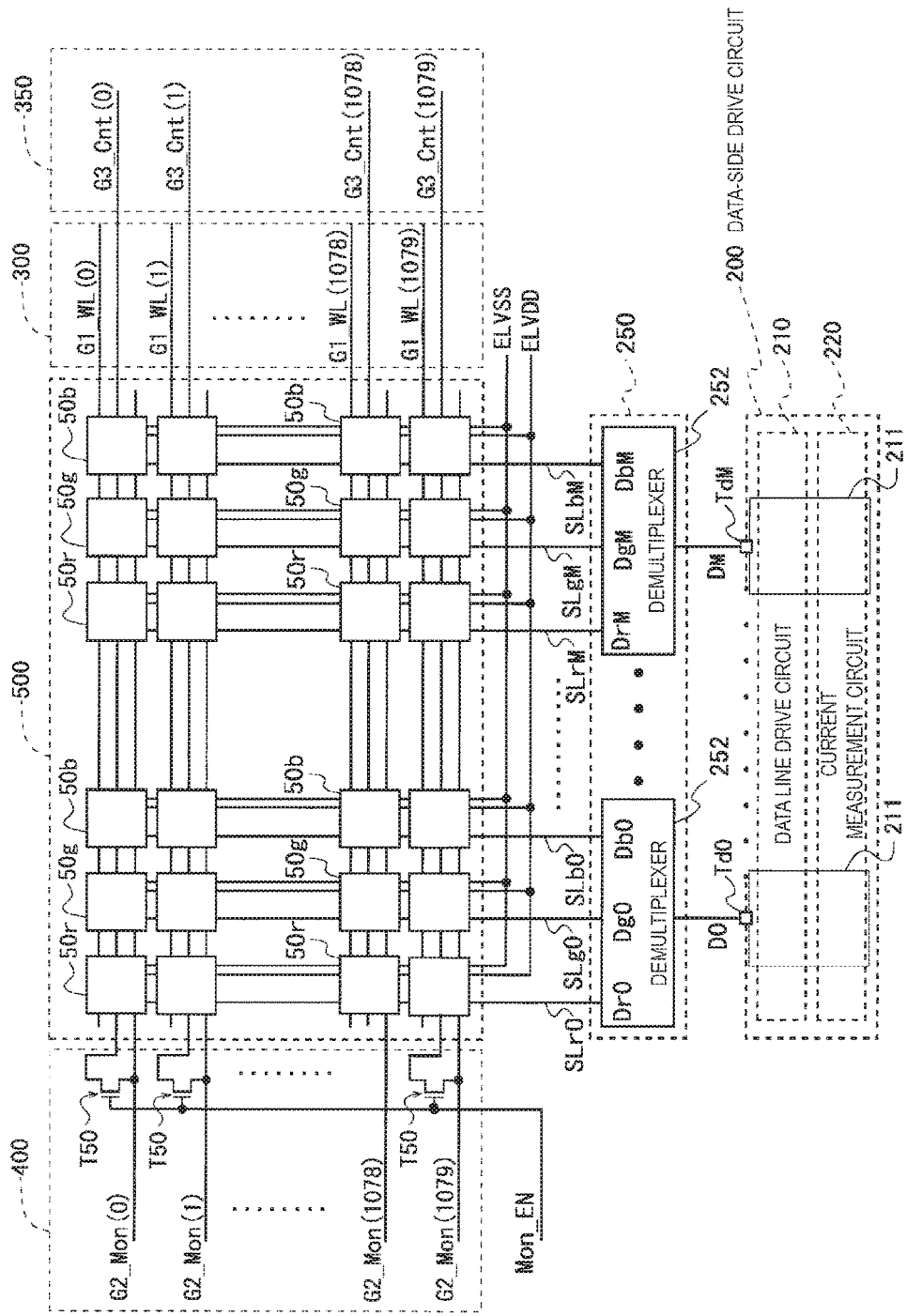
FIG. 2 is a block diagram for describing a configuration of a display unit in the first embodiment.

FIG. 2 is a block diagram for describing a configuration of the display unit 500 in the present embodiment. Note that in the present specification, description proceeds with an assumption that the organic EL panel 6 is a panel for full high-definition; however, the present invention is not limited thereto. As illustrated in FIG. 2, in the display unit 500, 1080 write control lines G1_WL (0) to G1_WL (1079) and 5760 data lines SLr0, SLg0, SLb0 to SLrM, SLgM, SLbM are arrayed to intersect with one another (here, M=5760/3−1=1919). The data lines SLri, SLgi, and SLbi are a data line for a red pixel, a data line for a green pixel, and a data line for a blue pixel, respectively (i=0 to M). A pixel circuit 50r for a red pixel is disposed correspond to each intersection between the write control lines G1_WL (0) to G1_WL (1079) and the data lines SLr0 to SLrM, a pixel circuit 50g for a green pixel is disposed correspond to each intersection between the write control lines G1_WL (0) to G1_WL (1079) and the data lines SLg0 to SLgM, and a pixel circuit 50b for a blue pixel is disposed correspond to each intersection between the write control lines G1_WL (0) to G1_WL (1079) and the data lines SLb0 to SLbM. That is, in the display unit 500, (M+1)×1080=1920×1080 sets of pixel circuits where three pixel circuits 50r, 50g, and 50b (hereinafter, each also referred to as "red pixel circuit 50r", "green pixel circuit 50g", and "blue pixel circuit 50b") corresponding to red (R), green (G), and blue (B) are used as one set are arranged in a matrix along the write control lines G1_WL (0) to G1_WL (1079) and the data lines SLr0, SLg0, SLb0 to SLrM, SLgM, and SLbM. As a result, formed is a pixel matrix having: a plurality (1920 columns) of red pixel circuit columns having 1080 red pixel circuits 50r aligned in a direction in which the data line extends as one column, a plurality (1920 columns) of green pixel circuit columns having 1080 green pixel circuits 50g aligned in the direction in which the data line extends as one column, and a plurality (1920 columns) of blue pixel circuit columns having 1080 blue pixel circuits 50b aligned in the direction in which the data line extends as one column; and a plurality (1080 rows) of pixel circuit rows having 1920 sets (5760 pieces) of pixel circuits 50r, 50g, and 50b aligned in a direction in which the write control line extends as one row. As described above, a head row is called "0th row" in the present specification. That is, each of the 1080 rows is called "0th row to 1079th row". Similarly, each of the 5760 columns is called "0th column to 5759th column". Note that one frame period in the present embodiment and other embodiments described later is formed of an effective scan period that is a period during which a writing of pixel data into the pixel circuit is successively performed in an order from a head row to a final row; and a vertical blanking period that is a period provided for returning the writing of the pixel data from the final row to the head row (see FIG. 23 and the like described later).

In the display unit 500, 1080 monitor control lines G2_Mon (0) to G2_Mon (1079) are arrayed so as to correspond one-to-one to the above-described 1080 write control lines G1_WL (0) to G1_WL (1079). Furthermore, 1080 voltage fluctuation compensation lines G3_Cnt (0) to G3_Cnt (1079) are arrayed so as to correspond one-to-one to the above-described 1080 write control lines G1_WL (0) to G1_WL (1079). As illustrated in FIG. 2, each voltage fluctuation compensation line G3_Cnt (i) is connected to a corresponding monitor control line G2_Mon (i) via a transistor T50 provided in the monitor control line drive circuit 400 (i=0 to 1079), and a monitor enable signal Mon_EN output from a drive control unit 110 of the display control circuit 100 is provided to the gate terminal of each transistor T50. Furthermore, the high level power source line ELVDD and the low level power source line ELVSS are arrayed in the display unit 500. A detailed configuration of the pixel circuits 50r, 50g, and 50b will be described later.

Note that, if there is no need to distinguish 1080 write control lines G1_WL (0) to G1_WL (1079) from one another, the write control lines are simply indicated as a symbol "G1_WL", below. Similarly, the monitor control lines, the voltage fluctuation compensation lines, and the data lines are sometimes simply indicated as a symbol "G2_Mon", a symbol "G3_Cnt", and a symbol "SL", respectively. Furthermore, in a case where there is no need to distinguish the red pixel circuit 50r, the green pixel circuit 50g, and the blue pixel circuit 50b from one another, the pixel circuits are simply indicated as a symbol "50".

As illustrated in FIG. 1, the display control circuit 100 includes a drive control unit 110, a correction data calculation/storage unit 120, and a gradation correction unit 130, and receives, from the outside of the present display device 1, an input signal Sin including an RGB video data signal Din as image information and an external clock signal CLKin as timing control information. Based on the input signal Sin, the drive control unit 110 outputs, within the display control circuit 100, a data signal DA based on the above-described RGB video data signal Din and a gradation position instruction signal PS described later, while outputting: a write control signal WCTL for controlling an operation of the write control line drive circuit 300; a monitor control signal MCTL and a monitor enable signal Mon_EN for controlling an operation of the monitor control line drive circuit 400; a voltage fluctuation compensation control signal CCTL for controlling an operation of the voltage fluctuation compensation line drive circuit 350; a source control signal SCTL for controlling an operation of the data-side drive circuit 200; and an SSD control signal Cssd for controlling an operation of the demultiplex circuit 250. In the write control signal WCTL, a start pulse signal GSP, a clock signal CLK1, and a clock signal CLK2 described later are included. In the monitor control signal MCTL, a start pulse signal MSP, a clock signal CLK3, and a clock signal CLK4 described later are included. In the voltage fluctuation compensation control signal CCTL, a start pulse signal CSP, a clock signal CLK5, a clock signal CLK6, and a pull down signal CPD described later are included. In the source control signal SCTL, a start pulse signal SSP, a clock signal SCK, a latch strobe signal LS, and an input and output control signal DWT described later are included. Note that the monitor enable signal Mon_EN is a signal for controlling whether to enable a measurement of the drive current. The correction data used for the correction of the data signal DA is held in the correction data calculation/storage unit 120. The correction data is constituted by an offset value and a gain value. The correction data calculation/storage unit 120 receives the gradation position instruction signal PS and a monitor voltage Vmo that is a result of a current measurement in the data-side drive circuit 200 to perform an update of the correction data. The gradation correction unit 130 uses correction data DH held in the correction data calculation/storage unit 120 to perform correction for the data signal DA output from the drive control unit 110, and outputs the data obtained by the correction as a digital video signal DV. The constitution elements of the display control circuit 100 will further be described in detail later.

The data-side drive circuit 200 selectively performs an operation for driving data lines SLr0, SLg0, SLb0 to SLrM, SLgM, SLbM (M=1919), that is, an operation as the data line drive circuit 210, and an operation for measuring a drive current output from pixel circuits 50r, 50g, and 50b to data lines SLr0, SLg0, SLb0 to SLrM, SLgM, SLbM, that is, the operation as a current measurement circuit 220. Note that as described above, the offset value and the gain value are held in the correction data calculation/storage unit 120 as the correction data. To update the above-described correction data, a measurement of drive current is performed in the data-side drive circuit 200 based on two types of gradations (first gradation P1 and second gradation P2: P2>P1).

The demultiplex circuit 250 receives, from the data-side drive circuit 200, analog video signals D0 to DM (M=1919) which are analog voltage signals based on the above-described digital video signal DV, and applies, to data lines SLr0, SLg0, SLb0 to SLrM, SLgM, SLbM, these M+1 analog video signals D1 to DM as 3 (M+1)=5760 data signals Dr0, Dg0, Db0 to DrM, DgM, DbM by a time-division scheme. That is, in the present embodiment, an SSD scheme (i=0 to M) is employed in which 3 (M+1) data lines are grouped into (M+1) sets of data line groups where one set is formed of three data lines SLri, SLgi, and SLb adjacent to each other in the display unit 500, and the analog video signal Di is applied in a time division manner to three data lines SLri, SLgi, and SLbi in each set. As illustrated in FIG. 2, the demultiplex circuit 250 includes M+1 demultiplexers 252 each corresponding to the above-described analog video signals D0 to DM. In each demultiplexer 252, the SSD control signal Cssd for switching the data line SL to which each analog video signal Di is to be applied as the data signals Dri, Dgi, or Dbi according to the SSD scheme is generated in the drive control unit 110 in the display control circuit 100 as described above.

Figure 3:
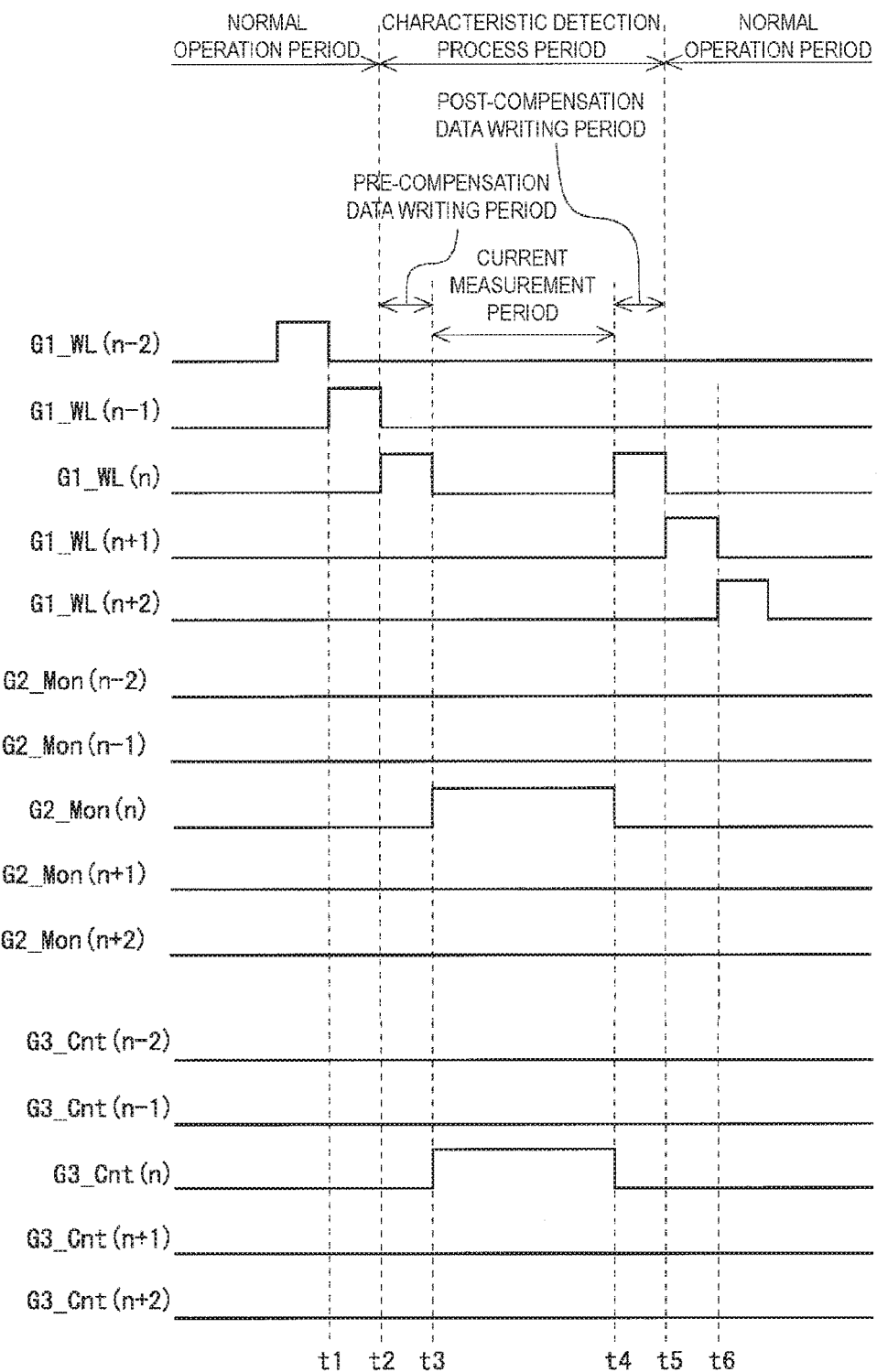
FIG. 3 is a timing chart for describing a drive of a write control line and a monitor control line in the first embodiment.

The write control line drive circuit 300 drives the 1080 write control lines G1_WL (0) to G1_WL (1079), based on the write control signal WCTL from the display control circuit 100. The monitor control line drive circuit 400 drives the 1080 monitor control lines G2_Mon (0) to G2_Mon (1079), based on the monitor control signal MCTL and the monitor enable signal Mon_EN from the display control circuit 100. In a frame period during which an nth row is defined as a row to be compensated (row to be measured), the write control line G1_WL and the monitor control line G2_Mon are driven as illustrated in FIG. 3. In FIG. 3, a period of a time point t2 or prior and a period of a time point t5 or after are normal operation periods, and a period from a time point t2 to a time point of t5 is a characteristic detection process period. (This also applies to FIG. 22 and FIG. 27.) In the normal operation period, the write control line G1_WL successively goes into the selected state for each horizontal interval (1H period). Furthermore, in the normal operation period, all monitor control lines G2_Mon are maintained in the non-selected state. The characteristic detection process period is constituted by: a pre-compensation data writing period during which pre-compensation data (data for measuring drive current) is written; a current measurement period during which drive current is measured; and a post-compensation data writing period during which post-compensation data (data for image display) is written. The write control line G1_WL (n) of the row to be compensated goes into the selected state during the pre-compensation data writing period and the post-compensation data writing period. Further, the monitor control line G2_Mon (n) of the row to be compensated goes into the selected state during the current measurement period. A method of realizing the above-described drive in the present embodiment will be described later.

Figure 23:
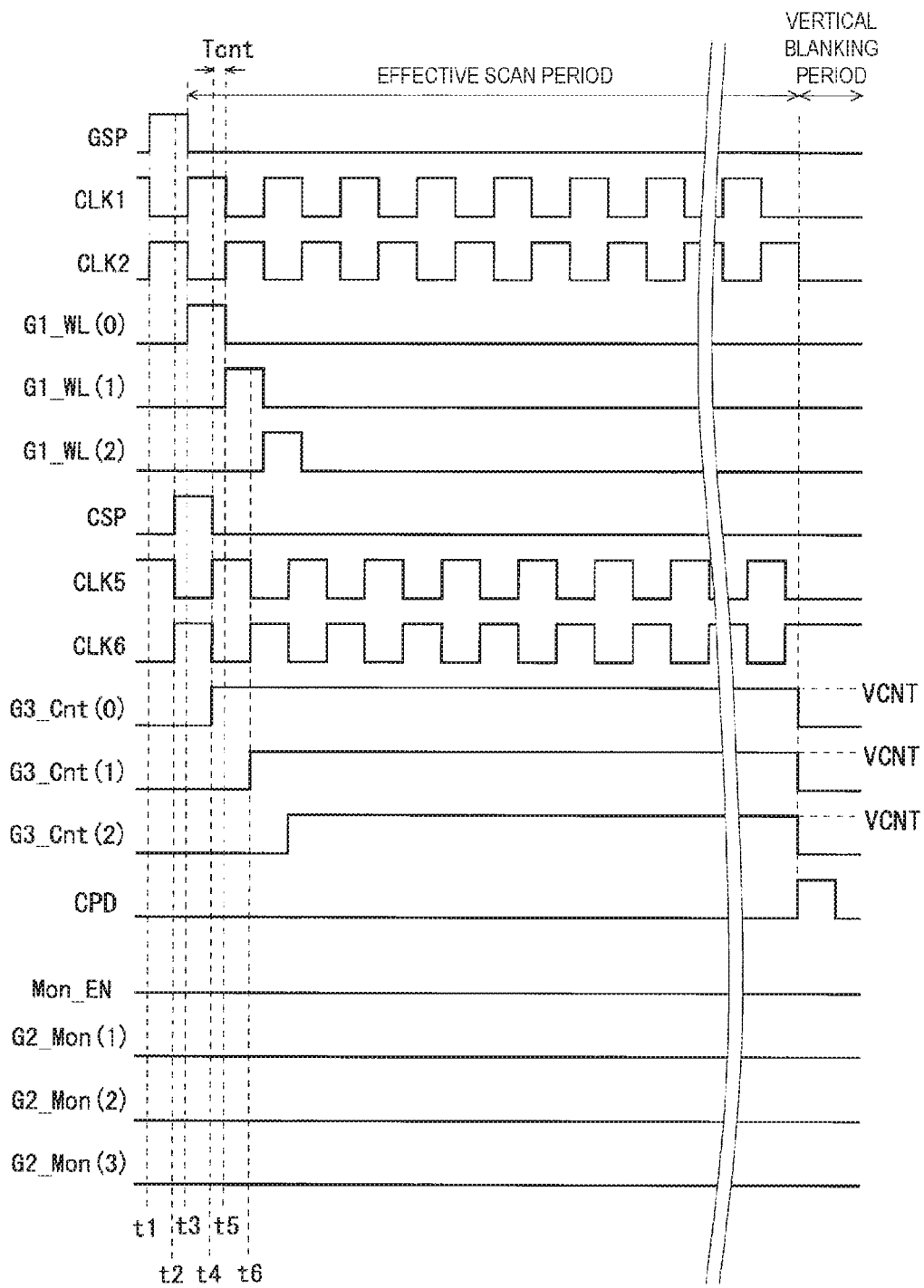
FIG. 23 is a timing chart for describing an operation of the voltage fluctuation compensation line drive circuit in the first embodiment.

The voltage fluctuation compensation line drive circuit 350 drives 1080 voltage fluctuation compensation lines G3_Cnt (0) to G3_Cnt (1079) based on the voltage fluctuation compensation control signal CCTL from the display control circuit 100, to compensate for the decrease in voltage (more generally, voltage fluctuation) ΔVsl of each data line SL due to the field through phenomenon occurring in the demultiplex circuit 250. That is, the voltage fluctuation compensation line drive circuit 350 changes, after a red pixel connection control signal Rssd, a green pixel connection control signal Gssd, and a blue pixel connection control signal Bssd described later constituting the SSD control signal Cssd input to the demultiplex circuit 250 all change from an on voltage to an off voltage in the selection period of each write control line G1_WL (i), the voltage fluctuation compensation line G3_Cnt (i) corresponding to the write control line G1_WL (i) from the low-level power supply voltage VSS to the counter voltage VCNT (high-level voltage) (details will be described later with reference to FIG. 24 and the like). In the present embodiment as illustrated in FIG. 23 described later, after the voltage of each voltage fluctuation compensation line G3_Cnt (i) changes to the counter voltage VCNT (high level) as described above, it is returned to the low-level power supply voltage VSS in the vertical blanking period (also called "vertical synchronization period"), by a pull down signal CPD included in the voltage fluctuation compensation control signal CCTL from the display control circuit 100. In the vertical blanking period, all of the write control lines G1_WL are in the non-selected state, and thus, a voltage change of each voltage fluctuation compensation line G3_Cnt (i) from a high level to a low level does not affect the data voltage as the pixel data held in any pixel circuits 50. Note that a time point at which the voltage of each voltage fluctuation compensation line G3_Cnt (i) is returned from a high level to a low level may be within a period during which all of the write control lines G1_WL are in the non-selected state, and the period is not limited to the vertical blanking period.

Here, "on voltage" is a voltage applied to the gate terminal as a control terminal of a transistor for switching on the transistor as a switching element, and "off voltage" is a voltage applied to the gate terminal as the control terminal of the transistor for switching off the transistor as the switching element. In the present embodiment, a field effect transistor (specifically, a thin film transistor (TFT)) of N channel type is used as the switching element, and thus, "off voltage" is the low level voltage and "on voltage" is the high level voltage, and the above-described field through phenomenon decreases the voltage Vsl held in the data line SL. On the other hand, in a case where the field effect transistor (specifically, a thin film transistor (TFT)) of P channel type is used as the switching element, "off voltage" is the high level voltage and "on voltage" is the low level voltage, and the above-described field through phenomenon increases the voltage Vsl held in the data line SL.

Note that as described later, in a frame period during which characteristic compensation (current measurement) of the drive transistor in the pixel circuit 50 is performed, the voltage fluctuation compensation line drive circuit 350 stops its operation and the output signals of the voltage fluctuation compensation line drive circuit 350 are all in a low level state with high impedance. In the current measurement period in such a frame period, the monitor enable signal Mon_EN applied to the monitor control line drive circuit 400 becomes high level, and each voltage fluctuation compensation line G3_Cnt (i) is connected to the monitor control line G2_Mon (i) corresponding thereto (see FIG. 2). Thus, as illustrated in FIG. 3, in accordance with the monitor control line G2_Mon (i) of the row to be measured that goes into the selected state (high level) in the current measurement period, the corresponding current voltage fluctuation compensation line G3_Cnt (n) also goes into the selected state.

The image is displayed on the display unit 500 by each constitution element operating as described above to drive the data lines SLr0, SLg0, SLb0 to SLrM, SLgM, SLbM, the write control lines G1_WL (0) to G1_WL (1079), the monitor control lines G2_Mon (0) to G2_Mon (1079), and the voltage fluctuation compensation lines G3_Cnt (0) to G3_Cnt (1079). In this case, the data signal DA is corrected based on the measurement result of the drive current, and thus, the variation of the drive transistor characteristics is compensated.

1.2 Pixel Circuit, Demultiplex Circuit, and Data-Side Drive Circuit

As illustrated in FIG. 2, the data-side drive circuit 200 includes M+1 terminals Td0 to TdM each connected to the M+1 demultiplexers 252 in the demultiplex circuit 250, and when functioning as the data line drive circuit 210, the data-side drive circuit 200 uses these terminals Td0 to TdM as the output terminal to perform the following operations. The data-side drive circuit 200 receives the source control signal SCTL from the display control circuit 100, and outputs the M+1 analog video signals D0 to DM in parallel from the M+1 terminals Td0 to TdM to apply the signals to the demultiplex circuit 250. At this time, in the data-side drive circuit 200, a digital video signal DV corresponding to the M+1 analog video signals D0 to DM to be applied to the demultiplex circuit 250 is successively held, by using the start pulse signal SSP as a trigger at the time when a pulse of the clock signal SCK occurs. Then, at the time that a pulse of the latch strobe signal LS occurs, the successively held digital video signal DV (M+1 digital signals obtained by sampling and latching of the digital video signal DV) is converted into M+1 analog video signals D0 to DM being the analog voltage, and is output to the demultiplex circuit 250 all at once.

Figure 4:
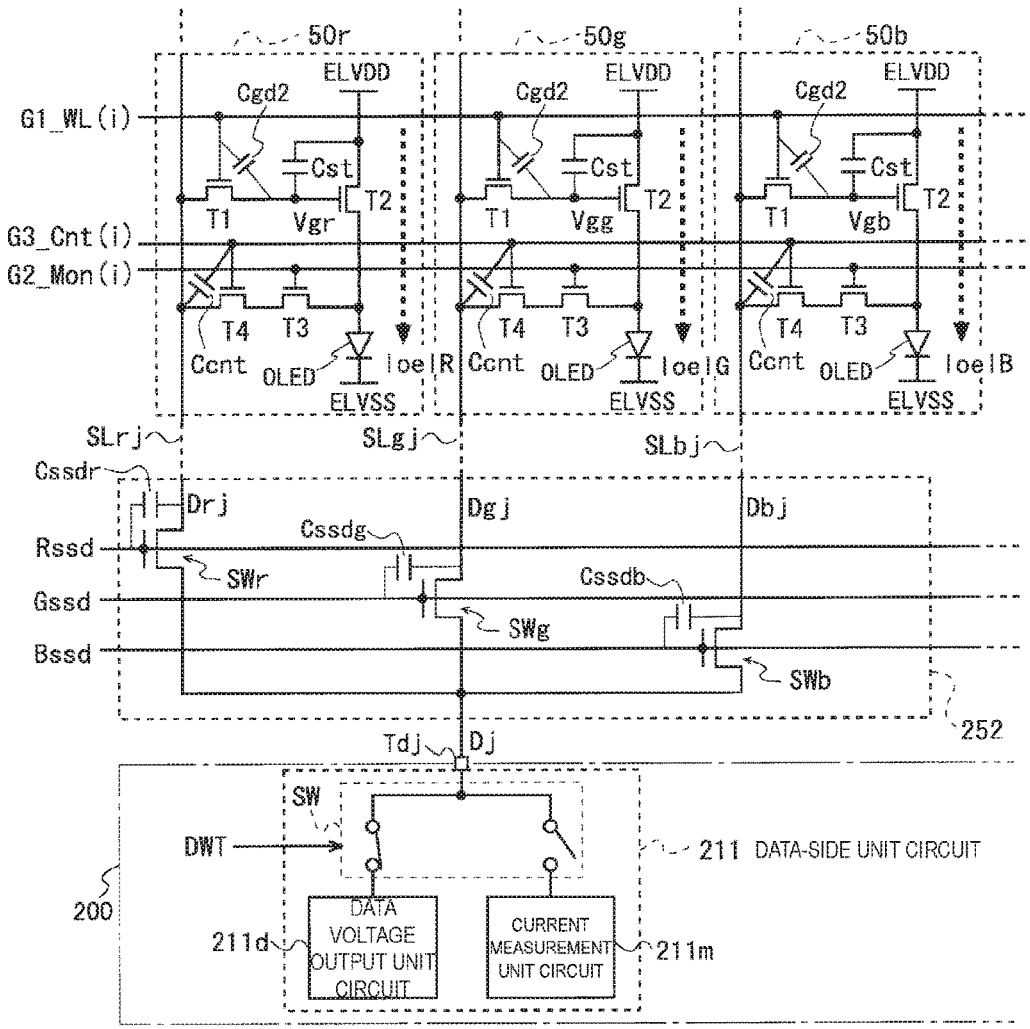
FIG. 4 is a partial circuit diagram illustrating a configuration of a main part in the first embodiment.

FIG. 4 is a circuit diagram illustrating a configuration of a portion corresponding to a drive of one set of data line group formed of three data lines SLrj, SLgj, SLbj, out of the display unit 500, the demultiplex circuit 250, and the data-side drive circuit 200 in the present embodiment. FIG. 4 illustrates: the pixel circuit 50r of an ith row 3jth column, the pixel circuit 50g of an ith row 3j+1 column, and the pixel circuit 50b of an ith row 3j+2 column to which the above-described three data lines SLrj, SLgj, and SLbj are connected respectively; the demultiplexer 252 to which a jth analog video signal Dj out of M+1 demultiplexers 252 in the demultiplex circuit 250 is applied; and the data-side unit circuit 211 that is a portion corresponding to the jth analog video signal Dj out of the data-side drive circuit 200.

Each pixel circuit 50 includes one organic EL element (electro-optical element) OLED, four Nch transistors (N channel type transistors) T1 to T4, and two capacitors Cst and Ccnt. The transistor T1 functions as an input transistor for selecting the pixels, the transistor T2 functions as a drive transistor for controlling a supply of current to the organic EL element OLED, the transistor T3 functions as a monitor control transistor for controlling whether to perform the current measurement for detecting the characteristics of the drive transistor, and the transistor T4 functions as a voltage fluctuation compensation transistor for canceling out or compensating the decrease in voltage ΔVsl of the data line SL due to the field through phenomenon occurring when the Nch transistor in the demultiplexer 252 changes from an on state to an off state. Furthermore, the capacitor Cst functions as a voltage holding capacity for holding the data voltage indicating pixel data, and the capacitor Ccnt functions as a voltage fluctuation compensation capacity for adjusting the compensation effect of the above-described decrease in voltage ΔVsl of the data line SL. Note that any transistors other than the transistor T2 out of the above-described transistors T1 to T4 in each pixel circuits 50 operate as switching elements.

The transistor T1 is provided between the data line SL and the gate terminal of the transistor T2. The gate terminal and the source terminal of the transistor T1 are respectively connected to the write control line G1_WL (i) and the data line SL. The transistor T2 is provided in series with the organic EL element OLED. The gate terminal, drain terminal, and source terminal of the transistor T2 are connected to the drain terminal of the transistor T1, the high level power source line ELVDD, and an anode terminal of the organic EL element OLED, respectively. The gate terminal and the drain terminal of the transistor T3 are respectively connected to the monitor control line G2_Mon (i) and the anode terminal of the organic EL element OLED. The transistor T4 is provided in series with the transistor T3, where the gate terminal as the control terminal thereof, the source terminal as a first conduction terminal thereof, and the drain terminal as a second conduction terminal thereof are connected to the voltage fluctuation compensation line G3 Cnt (j), the data line SL, and the source terminal of the transistor T3, respectively. Either one of the terminals of the capacitor Cst is connected to the gate terminal of the transistor T2, and the other terminal is connected to the drain terminal of the transistor T2. Either one of the terminals of the capacitor Ccnt is connected to the gate terminal of the transistor T4, and the other terminal is connected to the data line SL. A cathode terminal of the organic EL element OLED is connected to the low level power source line ELVSS.

In the present embodiment, the transistors T1 to T4 in the pixel circuit 50 are all N channel type. A TFT with a channel layer formed of an oxide semiconductor (for example, InGaZnO (Indium galium zinc oxide)) is adopted in the transistors T1 to T4. This applies similarly to the transistors in the demultiplex circuit 250, the write control line drive circuit 300, the monitor control line drive circuit 400, and the voltage fluctuation compensation line drive circuit 350. Note that the present invention can be applied to configurations using transistors with a channel layer formed of amorphous silicon, polysilicon, microcrystal silicon, or continuous grain silicon (CG silicon), for example.

The demultiplexer 252 includes: a first transistor SWr as a switching element in which either one of the conduction terminals (first conduction terminal) is connected to the data line SLrj for the red pixel; a second transistor SWg as a switching element in which either one of the conduction terminals (first conduction terminal) is connected to the data line SLgj for the green pixel; and a third transistor SWb as a switching element in which either one of the conduction terminals (first conduction terminal) is connected to the data line SLbj for the blue pixel. The other conduction terminal (second conduction terminal) of these three transistors SWr, SWg, and SWb are connected together and connected to the input terminal of the demultiplexer 252. The jth analog video signal Dj is applied from the data-side unit circuit 211 to the input terminal. The red pixel connection control signal Rssd, the green pixel connection control signal Gssd, and the blue pixel connection control signal Bssd constituting the SSD control signal Cssd from the display control circuit 100 are applied to the gate terminals being the control terminals of the above-described three transistors SWr, SWg, and SWb. In this manner, the data-side unit circuit 211 configured to output the jth analog video signal Dj corresponds to the demultiplexer 252 to which the data lines SLrj, SLgj, and SLbj constituting the jth set are connected, and applies the jth analog video signal Dj to the corresponding demultiplexer 252.

The data-side unit circuit 211 includes a data voltage output unit circuit 211d, a current measurement unit circuit 211m, and a changeover switch SW, and is configured so that the circuit connected to (an input terminal of) the demultiplexer 252 can be switched between the data voltage output unit circuit 211d and the current measurement unit circuit 211 m by the changeover switch SW being controlled by the input and output control signal DWT included in the source control signal SCTL from the display control circuit 100. That is, in periods other than the above-described current measurement period, the input and output control signal DWT becomes high level, and the data voltage output unit circuit 211d is connected to the demultiplexer 252 using a terminal Tdj as the output terminal. On the other hand, in the above-described current measurement period, the input and output control signal DWT becomes low level, and the current measurement unit circuit 211 m is connected to the demultiplexer 252 using the terminal Tdj as the input terminal. That is, when the data-side drive circuit 200 functions as the data line drive circuit 210, the data voltage output unit circuit 211d is connected to the demultiplexer 252, and in a case where the data-side drive circuit 200 functions as the current measurement circuit 220, the current measurement unit circuit 211m is connected to the demultiplexer 252.

Figure 5:
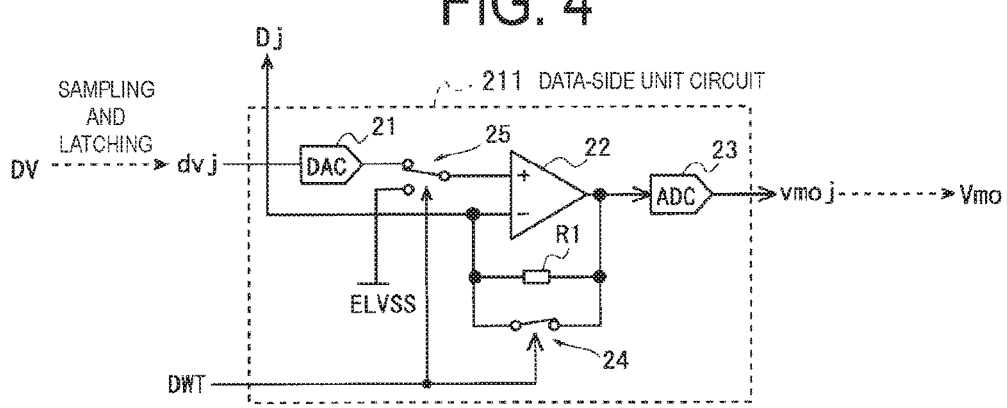
FIG. 5 is a circuit diagram illustrating a configuration of a data-side unit circuit in a data-side drive circuit in the first embodiment.

FIG. 5 is a circuit diagram illustrating an example of a configuration of the data-side unit circuit 211 in the data-side drive circuit 200. The data-side unit circuit 211 illustrated in FIG. 5 includes a DA converter 21, an operational amplifier 22, a resistance element R1, a first switch 24, a second switch 25, and an AD converter 23. The digital video signal DV (more precisely, a digital signal dvj obtained by sampling and latching) is applied to the input terminal of the DA converter 21, and the input and output control signal DWT included in the source control signal SCTL is applied to the first switch 24 and the second switch 25 as a control signal. As described above, the input and output control signal DWT becomes low level during the current measurement period, and becomes high level during periods other than the current measurement period. The second switch is a changeover switch having two input terminals, in which the output terminal of the DA converter 21 is connected to one of the input terminals, the low level power source line ELVSS is connected to the other of the input terminals, and the output terminal is connected to a non-inverting input terminal of the operational amplifier 22. With the second switch 25, an analog signal corresponding to the digital video signal DV (more precisely, the digital signal dvj) is applied to the non-inverting input terminal of the operational amplifier 22 when the input and output control signal DWT is at high level, and the low-level power supply voltage ELVSS is applied when the input and output control signal DWT is at low level. The DA converter 21 converts the digital video signal DV into an analog data voltage. The output terminal of the DA converter 21 is connected to the non-inverting input terminal of the operational amplifier 22. An inverting input terminal of the operational amplifier 22 is connected to the input terminal of the demultiplexer 252. The first switch 24 is provided between the inverting input terminal and the output terminal of the operational amplifier 22. The resistance element R1 is provided in parallel with the first switch 24 between the inverting input terminal and the output terminal of the operational amplifier 22. The output terminal of the operational amplifier 22 is connected to the input terminal of the AD converter 23.

In the above-described configurations, the first and the second switches 24 and 25 correspond to the changeover switch SW in the data-side unit circuit 211 illustrated in FIG. 4, and when the input and output control signal DWT is at high level, the first switch 24 is switched on, and the second switch outputs an analog signal corresponding to the digital video signal DV as the data voltage. Thus, the inverting input terminal and the output terminal of the operational amplifier 22 are short circuited, and the data voltage corresponding to the digital video signal DV is applied to the non-inverting input terminal of the operational amplifier 22. Therefore, the operational amplifier 22 functions as a buffer amplifier, and the data voltage applied to the non-inverting input terminal of the operational amplifier 22 is input as the analog video signal Dj to the demultiplexer 252 (demultiplexer 252 to which the data lines SLrj, SLgj, SLbj are connected) corresponding to the data-side unit circuit 211.

On the other hand, when the input and output control signal DWT is at low level, the first switch 24 is switched off, and the second switch 25 outputs the low-level power supply voltage ELVSS. Therefore, the inverting input terminal and the output terminal of the operational amplifier 22 are connected via the resistance element R1, and the low-level power supply voltage ELVSS is applied to the non-inverting input terminal of the operational amplifier 22. As a result, the voltage corresponding to the drive current output from the pixel circuit 50s connected a data line selected in the demultiplexer 252 out of the above-described data lines SLrj, SLgj, and SLbj (data line connected to a switched-on transistor out of transistors SWr, SWg, and SWb, hereinafter called "selected data line") SLsj to the selected data line SLsj is output from the operational amplifier 22 (s is any one of r, g, and b). The output voltage of the operational amplifier 22 is converted into a digital value in the AD converter 23 and is output as a monitor voltage vmoj. The monitor voltage vmoj output from each data-side unit circuit 211 is sent to the correction data calculation/storage unit 120 in the display control circuit 100 as the current measurement result Vmo in the current measurement circuit 220.

As described above, during the current measurement period, the input and output control signal DWT becomes low level and the data-side unit circuit 211 functions as the current measurement unit circuit 211m, and during a period other than the current measurement period, the input and output control signal DWT becomes high level and the data-side unit circuit 211 functions as the data voltage output unit circuit 211d. Therefore, the data-side drive circuit 200 functions as the current measurement circuit 220 during the current measurement period, and functions as the data line drive circuit 210 during periods other than the current measurement period.

1.3 Display Control Circuit

Next, the detailed configuration and operations of the display control circuit 100 in the present embodiment will be described.

1.3.1 Drive Control Unit

Figure 6:
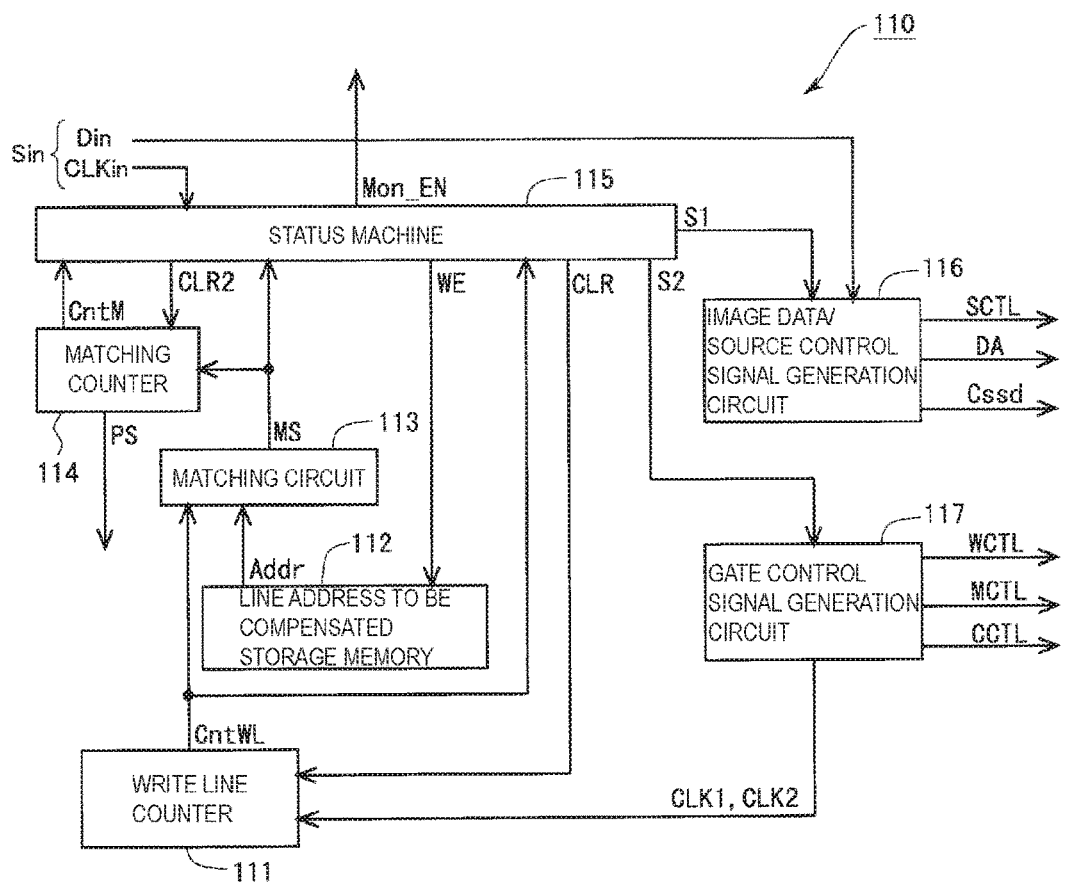
FIG. 6 is a block diagram illustrating a configuration of a drive control unit in a display control circuit in the first embodiment.

FIG. 6 is a block diagram illustrating a detailed configuration of the drive control unit 110 in the display control circuit 100. As illustrated in FIG. 6, the drive control unit 110 includes: a write line counter 111, a line address to be compensated storage memory 112, a matching circuit 113, a matching counter 114, a status machine 115, an image data/source control signal generation circuit 116, and a gate control signal generation circuit 117. The external clock signal CLKin out of the external input signal Sin is applied to the status machine 115, and the RGB video data signal Din is applied to the image data/source control signal generation circuit 116.

The status machine 115 is a sequential circuit in which the output signal and a next interior state is determined by the input signal and a current interior state, and specifically, operates as follows. That is, the status machine 115 outputs a control signal S1, a control signal S2, and the monitor enable signal Mon_EN based on the external clock signal CLKin and a matching signal MS. Further, the status machine 115 outputs a clear signal CLR for initializing the write line counter 111 and a clear signal CLR 2 for initializing the matching counter 114. Moreover, the status machine 115 outputs a rewrite signal WE for updating the line address to be compensated Addr stored in the line address to be compensated storage memory 112.

Figure 7:
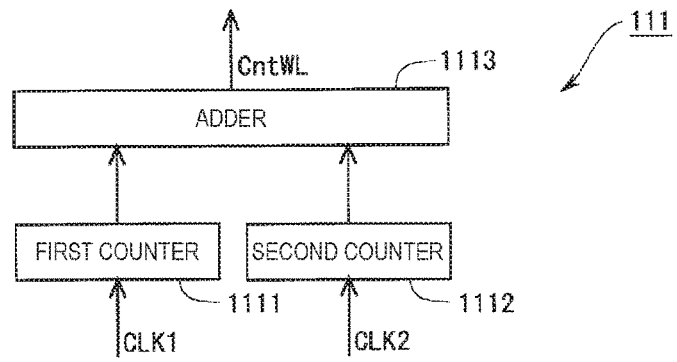
FIG. 7 is a block diagram illustrating a configuration of a write line counter in the first embodiment.
Figure 8:
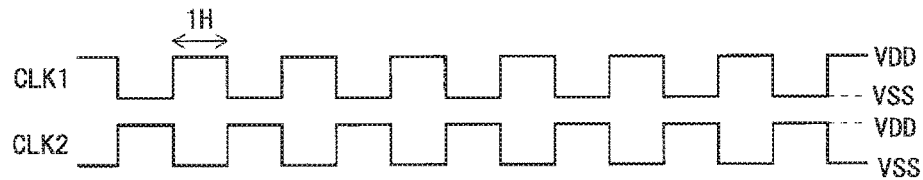
FIG. 8 is a signal waveform chart of a clock signal CLK1 and a clock signal CLK2 during a normal operation period in the embodiment.

FIG. 7 is a block diagram illustrating a configuration of the write line counter 111. As illustrated in FIG. 7, the write line counter 111 is constituted of: a first counter 1111 configured to count the number of clock pulse of the clock signal CLK1 output from the gate control signal generation circuit 117; a second counter 1112 configured to count the number of clock pulse of the clock signal CLK2 output from the gate control signal generation circuit 117; and an adder 1113 configured to output a value indicating a sum of the output value of the first counter 1111 and the output value of the second counter 1112 as a write count value CntWL. Here, the clock signals CLK1 and CLK2 are the same as the clock signals CLK1 and CLK2 included in the write control signal WCTL, change as illustrated in FIG. 8 during the normal operation period, and a phase of the clock signal CLK1 and a phase of the clock signal CLK2 are shifted by 180 degrees. The write line counter 111 is configured so that the write count value CntWL becomes 0 at a time point when the clock signal CLK1 first rises after the pulse of the start pulse signal GSP occurs. After the first clock signal CLK1 rises, the write count value CntWL increases by one each time either the clock signal CLK1 or the clock signal CLK2 rises. Note that the write count value CntWL output from the write line counter 111 is initialized back to 0 by the clear signal CLR from the status machine 115.

The line address to be compensated storage memory 112 in the drive control unit 110 illustrated in FIG. 6 stores an address (hereinafter, referred to as "line address to be compensated") Addr indicating a row (row to be compensated) in which the drive current should be measured next. The line address to be compensated Addr stored in the line address to be compensated storage memory 112 is re-written by the rewrite signal WE output from the status machine 115. Note that in the present specification, description proceeds with an assumption that a numerical value representing the location of the row to be compensated is defined in the line address to be compensated Addr. For example, in a case where the fifth row is the row to be compensated, the line address to be compensated is "5".

The matching circuit 113 determines whether the write count value CntWL output from the write line counter 111 and the line address to be compensated Addr stored in the line address to be compensated storage memory 112 match, and outputs the matching signal MS indicating the determination result thereof. Note that the write count value CntWL and the line address to be compensated Addr are represented by the same number of bits. In the present embodiment, the matching signal MS is considered to be at high level when the write count value CntWL and the line address to be compensated Addr match, and the matching signal MS is considered to be low level when they do not match. The matching signal MS output from the matching circuit 113 is applied to the status machine 115 and the matching counter 114.

Figure 9:
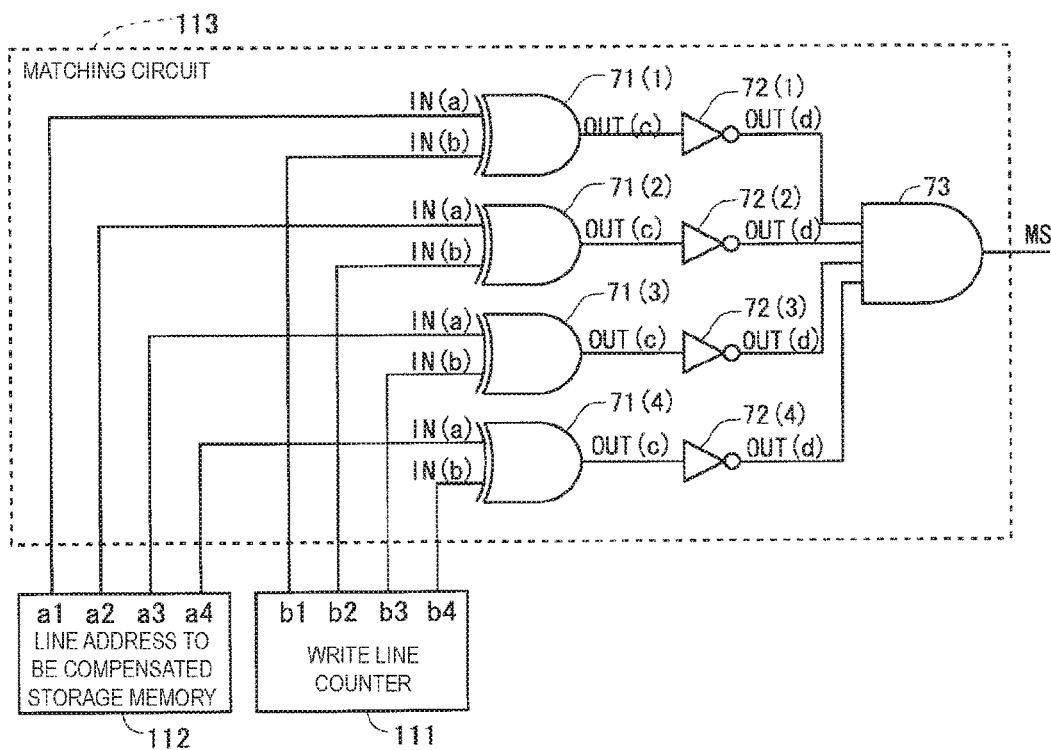
FIG. 9 is a circuit diagram illustrating a configuration of a matching circuit in the first embodiment.

FIG. 9 is a logical circuit diagram illustrating a configuration of the matching circuit 113 in the present embodiment. The matching circuit 113 is constituted by: four EXOR circuits (exclusive OR circuit) 71 (1) to 71 (4); four inverters (logical NOT circuit) 72 (1) to 72 (4); and one AND circuit (logical AND circuit) 73. The EXOR circuits 71 (1) to 71 (4) and the inverters 72 (1) to 72 (4) correspond one-to-one to each other. One-bit of data out of the four-bits of data indicating the line address to be compensated Addr stored in the line address to be compensated storage memory 112 is applied to either one of the input terminals of each EXOR circuit 71 as first input data IN (a). One-bit of data out of the four-bits of data (write count value CntWL) output from the write line counter 111 is applied to the other input terminal of each EXOR circuit 71 as second input data IN (b). Each EXOR circuit 71 outputs, as first output data OUT (c), a value indicating the exclusive OR between a logical value of the first input data IN (a) and a logical value of the second input data IN (b). The first output data OUT (c) output from the corresponding EXOR circuit 71 is applied to the input terminal of each inverter 72. Each inverter 72 outputs, as second output data OUT (d), a value obtained by inverting the logical value of the first output data OUT (c) (that is, a value indicating a logical negation of the logical value of the first output data OUT (c)). The AND circuit 73 outputs a value indicating a logical sum of four of the second output data OUT (d) output from the inverters 72 (1) to 72 (4) as the matching signal MS. Note that although an example is given where four-bit data is compared, in practice, for example, the ten EXOR circuits 71 and ten inverters 72 are each provided to compare 10 bit data. That is, as the number of write control lines G1_WL becomes large, the number of EXOR circuits 71 and the inverters 72 may be increased. Note that the matching circuit 113 is not limited to the configuration illustrated in FIG. 9, and it may be a configuration using NOR circuit (negative OR circuit) instead of the inverters 72 (1) to 72 (4) and the AND circuit 73 in the present embodiment, for example.

In the present embodiment, after the pulse of the start pulse signal GSP occurs, the write control line G1_WL successively goes into the selected state, based on the clock signals CLK1 and CLK2. Furthermore, the write count value CntWL output from the write line counter 111 increases by one, based on the clock signals CLK1 and CLK2. Therefore, the write count value CntWL indicates a value of the row of the write control line G1_WL to be in the selected state. For example, in a case where the clock signal CLK1 rises at some time point tx and the write count value CntWL becomes "50", the 50th row of the write control line G1_WL (50) goes into the selected state for one horizontal interval from the time point tx. Furthermore, the line address to be compensated Addr indicating the row to be compensated is stored in the line address to be compensated storage memory 112, and thus, the time point at which the write count value CntW1 and the line address to be compensated Addr match becomes a start time point of the characteristic detection process period.

In the drive control unit 110 illustrated in FIG. 6, the matching counter 114 outputs a matching count value CntM. After being initialized (after setting to "0"), the matching count value CntM is added by one, each time the matching signal MS changes from the low level to the high level. Furthermore, the matching counter 114 outputs the gradation position instruction signal PS for identifying whether the measurement of the drive current is performed based on the first gradation P1 or the measurement of the drive current is performed based on the second gradation P2. Note that the matching counter 114 is initialized by the clear signal CLR2 output from the status machine.

The image data/source control signal generation circuit 116 outputs the source control signal SCTL, the data signal DA, and the SSD control signal Cssd, based on the RGB video data signal Din included in the external input signal Sin and the control signal S1 provided from the status machine 115. Note that the control signal S1 includes, for example, a signal for instructing a start of the compensation process (a series of processes for compensating a variation in characteristics of the drive transistor). The gate control signal generation circuit 117 outputs the write control signal WCTL, the monitor control signal MCTL, and the voltage fluctuation compensation control signal CCTL based on the control signal S2 provided from the status machine 115. Note that the control signal S2 includes signals based on the external clock signal CLKin included in the input circuit Sin, such as a signal for controlling the clock operation of the clock signals CLK1 to CLK4, and a signal for instructing an output of the pulse of the start pulse signals GSP and MSP.

1.3.2 Gradation Correction Unit

The gradation correction unit 130 included in the display control circuit 100 in the configuration illustrated in FIG. 1 reads out the correction data DH (an offset value and a gain value) held in the correction data calculation/storage unit 120, and performs correction on the data signal DA output from the drive control unit 110. Then, the gradation correction unit 130 outputs the gradation voltage obtained by the correction as the digital video signal DV. The digital video signal DV is sent to the data-side drive circuit 200.

1.3.3 Correction Data Calculation/Storage Unit

Figure 10:
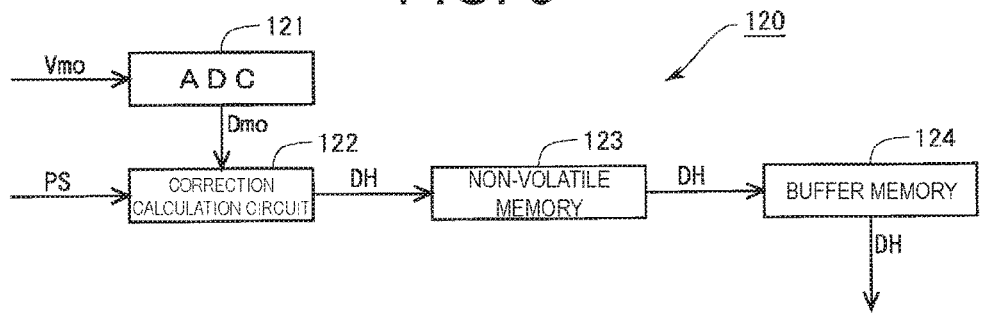
FIG. 10 is a block diagram illustrating a configuration of a correction data calculation/storage unit in the display control circuit in the first embodiment.

FIG. 10 is a block diagram illustrating a configuration of the correction data calculation/storage unit 120 in the display control circuit 100. As illustrated in FIG. 10, the correction data calculation/storage unit 120 includes an AD converter 121, a correction calculation circuit 122, a non-volatile memory 123, and a buffer memory 124. The AD converter 121 converts a monitor voltage Vmo (analog voltage) output from the data-side drive circuit 200 to a digital signal Dmo. The correction calculation circuit 122 establishes, based on the digital signal Dmo, correction data (an offset value and a gain value) to be used for the correction in the gradation correction unit 130. In this case, the gradation position instruction signal PS output from the matching counter 114 is referenced to determine whether the digital signal Dmo output from the AD converter 121 is data based on the first gradation P1 or data based on the second gradation P2. The correction data DH established in the correction calculation circuit 122 is held in the non-volatile memory 123. In particular, the offset value and the gain value for each pixel circuit 50 are held in the non-volatile memory 123. When the correction of the data signal DA is performed in the gradation correction unit 130, the correction data DH temporarily read out from the non-volatile memory 123 to the buffer memory 124 is used.

1.4 Configuration of Write Control Line Drive Circuit

Figure 11:
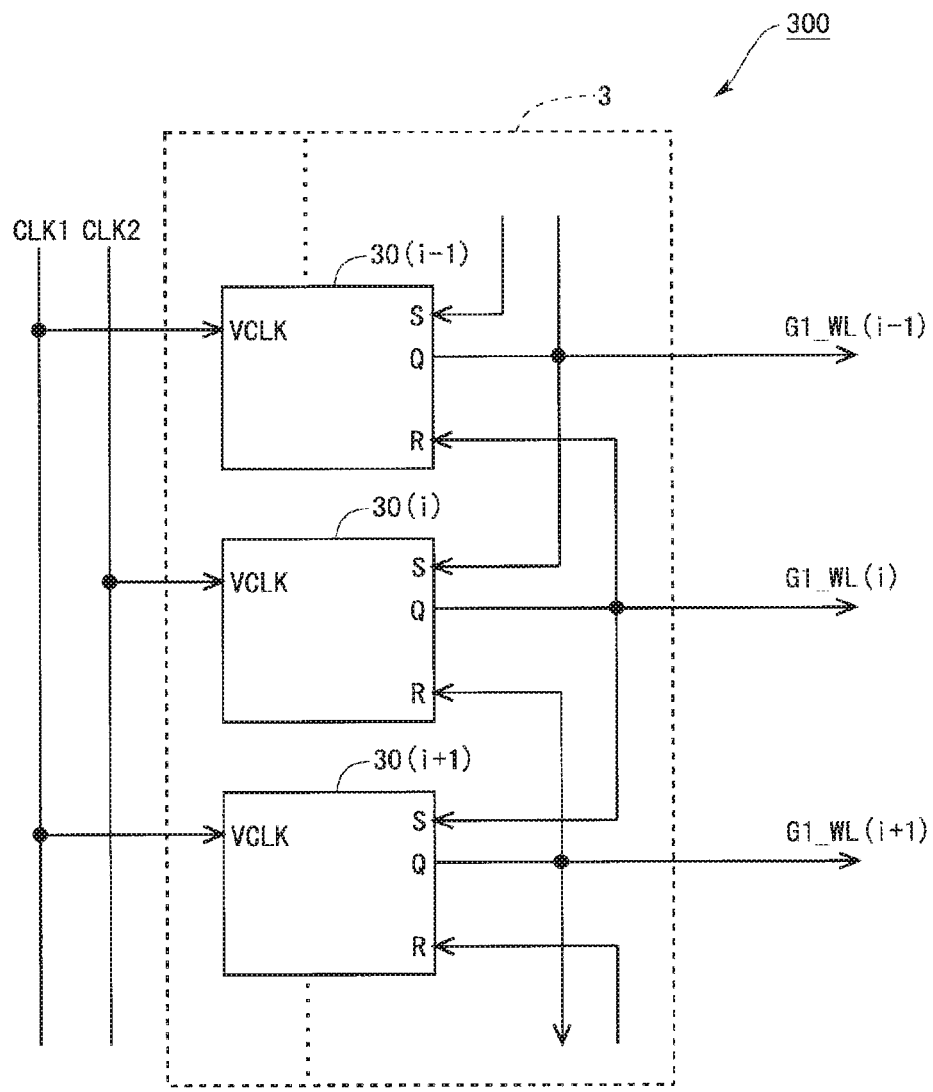
FIG. 11 is a block diagram illustrating a configuration of a write control line drive circuit in the first embodiment.

FIG. 11 is a block diagram illustrating a configuration of the write control line drive circuit 300 in the present embodiment. The write control line drive circuit 300 is realized by using a shift register 3. Each stage of the shift register 3 is provided to correspond one-to-one with each write control line G1_WL in the display unit 500. That is, in the present embodiment, a shift register 3 formed of 1080 stages is included in the write control line drive circuit 300. Note that FIG. 11 only illustrates unit circuits 30 (i−1) to 30 (i+1) constituting the (i−1)th stage to the (i+1)th stage out of 1080 stages. For convenience of description, i is assumed to be an even number (similarly in FIG. 14 and FIG. 18). Each stage (each unit circuit) of the shift register 3 is provided with an input terminal configured to receive the clock signal VCLK, an input terminal configured to receive a set signal S, an input terminal configured to receive a reset signal R, and an output terminal configured to output a state signal Q indicating an interior state of each stage.

As illustrated in FIG. 11, the signals applied to the input terminals of each stage (each unit circuit) of the shift register 3 are configured as follows. For the odd-numbered stages, the clock signal CLK1 is applied as the clock signal VCLK, and for the even-numbered stages, the clock signal CLK2 is applied as the clock signal VCLK. Furthermore, for any stage, the state signal Q output from a previous stage is applied as the set signal S, and the state signal Q output from a next stage is applied as the reset signal R. However, in the first stage (not illustrated in FIG. 11), the start pulse signal GSP is applied as the set signal S. Note that the low-level power supply voltage VSS (not illustrated in FIG. 11) is commonly applied to all unit circuits 30. The state signal Q is output from each stage of the shift register 3. The state signal Q output from each stage is output to the corresponding write control line G1_WL, and is applied to the previous stage as the reset signal R and applied to the next stage as the set signal S.

Figure 12:
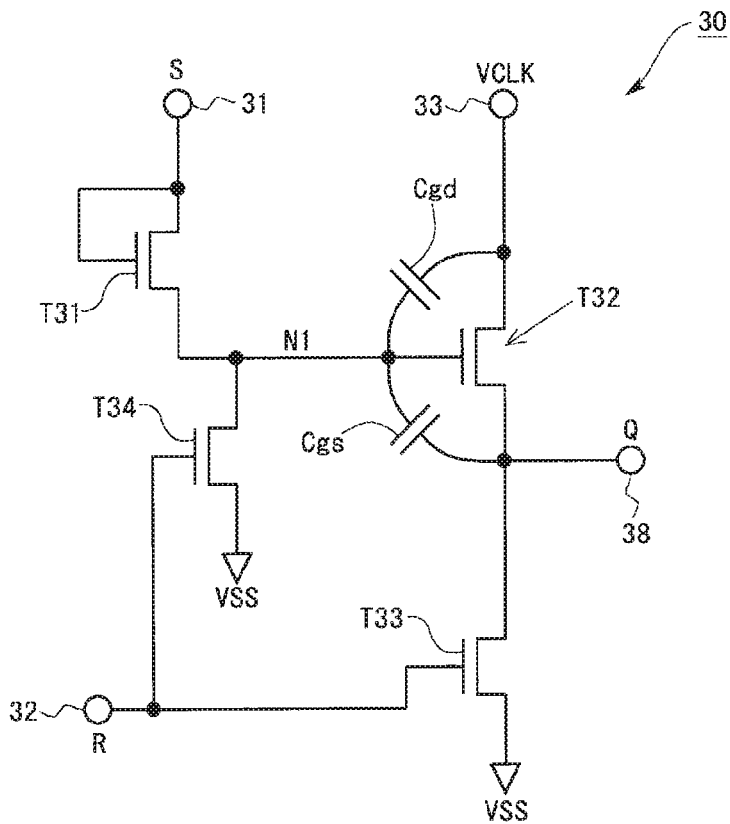
FIG. 12 is a circuit diagram illustrating a configuration of a unit circuit of a shift register (configuration of one stage of the shift register) constituting the write control line drive circuit in the first embodiment.

FIG. 12 is a circuit diagram illustrating a configuration of the unit circuit 30 of the shift register 3 (configuration of one stage of the shift register 3) configuring the write control line drive circuit 300. As illustrated in FIG. 12, the unit circuit 30 includes four transistors T31 to T34. Furthermore, the unit circuit 30 includes three input terminals 31 to 33 and one output terminal 38, in addition to the input terminal for the low-level power supply voltage VSS. Here, input terminals configured to receive the set signal S are denoted by the number "31", input terminals configured to receive the reset signal R are denoted by the number "32", and input terminals configured to receive the clock signal VCLK are denoted by the number "33". Furthermore, the output terminal configured to output the state signal Q is denoted by the number "38". The parasitic capacitance Cgd is formed between a gate terminal and a drain terminal of the transistor T32, and the parasitic capacitance Cgs is formed between a gate terminal and a source terminal of the transistor T32. The source terminal of the transistor T31, the gate terminal of the transistor T32, and the drain terminal of the transistor T34 are connected to each other. Note that a region (wiring) in which these terminals are connected to each other is hereinafter called a "first node". The first node is denoted by a symbol "N1".

In the transistor T31, the gate terminal and the drain terminal are connected to the input terminal 31 (that is, in a diode connection), and the source terminal is connected to the first node N1. In the transistor T32, the gate terminal is connected to the first node N1, the drain terminal is connected to the input terminal 33, and the source terminal is connected to the output terminal 38. In the transistor T33, the gate terminal is connected to the input terminal 32, the drain terminal is connected to the output terminal 38, and the source terminal is connected to the input terminal for the low-level power supply voltage VSS. In the transistor T34, the gate terminal is connected to the input terminal 32, the drain terminal is connected to the first node N1, and the source terminal is connected to the input terminal for the low-level power supply voltage VSS.

Next, a function in the unit circuit 30 will be described. When the set signal S becomes high level, the transistor T31 changes a potential of the first node N1 toward the high level. When the potential of the first node N1 becomes high level, the transistor T32 applies a potential of the clock signal VCLK to the output terminal 38. When the reset signal R becomes high level, the transistor T33 changes a potential of the output terminal 38 toward a potential of the low-level power supply voltage VSS. When the reset signal R becomes high level, the transistor T34 changes the potential of the first node N1 toward the potential of the low-level power supply voltage VSS.

Figure 13:
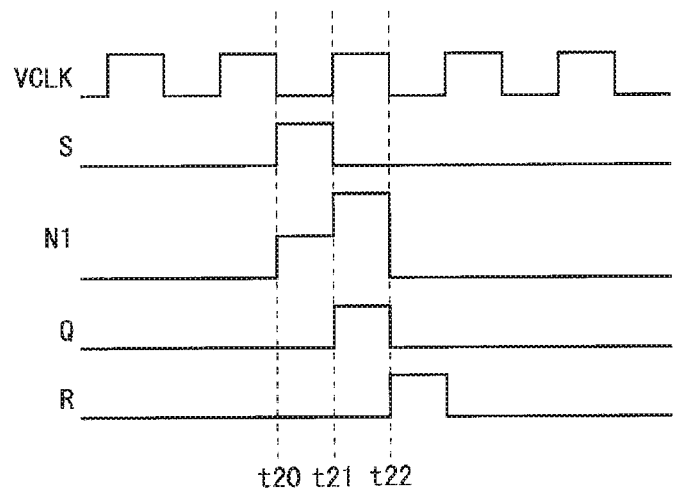
FIG. 13 is a timing chart for describing a basic operation of the unit circuit of the shift register constituting the write control line drive circuit in the first embodiment.

The basic operation of the unit circuit 30 will be described with reference to FIG. 12 and FIG. 13. Waveforms of the clock signals CLK1 and CLK2 applied to the unit circuit 30 as the clock signal VCLK are as illustrated in FIG. 8 (however, these exclude the characteristic detection process period). As illustrated in FIG. 13, the potential of the first node N1 and the potential of the state signal Q (the potential of the output terminal 38) is at low level during the period of time point t20 or before. Furthermore, the clock signal VCLK configured to become high level at every predetermined period is applied to the input terminal 33. Note that regarding FIG. 13, some delay occurs in an actual waveform, but an ideal wave form is illustrated here.

Upon reaching the time point t20, the pulse of the set signal S is applied to the input terminal 31. The transistor T31 is in the diode connection as illustrated in FIG. 12, and thus, the transistor T31 is switched on by the pulse of the set signal S. As a result, the potential of the first node N1 increases.

Upon reaching the time point t21, the clock signal VCLK changes from a low level to a high level. At this time, the reset signal R is at low level, and thus, the transistor T34 is switched off. Therefore, the first node N1 is in a floating state. As described above, the parasitic capacitance Cgd is formed between the gate terminal and the drain terminal of the transistor T32, and the parasitic capacitance Cgs is formed between the gate terminal and the source terminal of the transistor T32. Thus, the potential of the first node N1 is largely increased by a bootstrap effect. As a result, a large voltage is applied to the gate terminal of the transistor T32. Therefore, the potential of the state signal Q (the potential of the output terminal 38) increases to a high-level potential of the clock signal VCLK. Note that during a period from the time point t21 to the time point t22, the reset signal R is at low level. Thus, as the transistor T33 is maintained in the off state, it is not possible for the potential of the state signal Q to decrease during this period.

Upon reaching the time point t22, the clock signal VCLK changes from a high level to a low level. As a result, the potential of the state signal Q decreases while the potential of the input terminal 33 decreases, and also the potential of the first node N1 decreases via the parasitic capacitance Cgd and Cgs. Furthermore, the pulse of the reset signal R is applied to the input terminal 32 at the time point t22. Therefore, the transistor T33 and the transistor T34 are switched on. The potential of the state signal Q decreases to a low level in accordance to the transistor T33 being switched on, and the potential of the first node N1 decreases to a low level in accordance to the transistor T34 being switched on.

Considering the operation of the above-described unit circuit 30 and the configuration of the shift register 3 illustrated in FIG. 11, an operation below is assumed to be performed during the normal operation period. In a case where a pulse of the start pulse signal GSP being the set signal S is applied to a first stage of the shift register 3, the shift pulse included in the state signal Q output from each stage is successively transferred from 0th stage to subsequent stages, based on the clock signals CLK1 and CLK2. Furthermore, the state signal Q output from each stage is output to the corresponding write control line G1_WL. Therefore, the write control line G1_WL successively goes into the selected state one at a time, in accordance with the transfer of the shift pulse. In this manner, the write control line G1_WL successively goes into the selected state one at a time during the normal operation period.

Note that the configuration of the unit circuit 30 is not limited to the configuration (configuration including four transistors T31 to 34) illustrated in FIG. 12. In general, a transistor having a larger number than four is included in the unit circuit 30, to achieve improvements in drive performance and improvements in reliability. The present invention can be applied to such a situation.

1.5 Configuration of Monitor Control Line Drive Circuit

Figure 14:
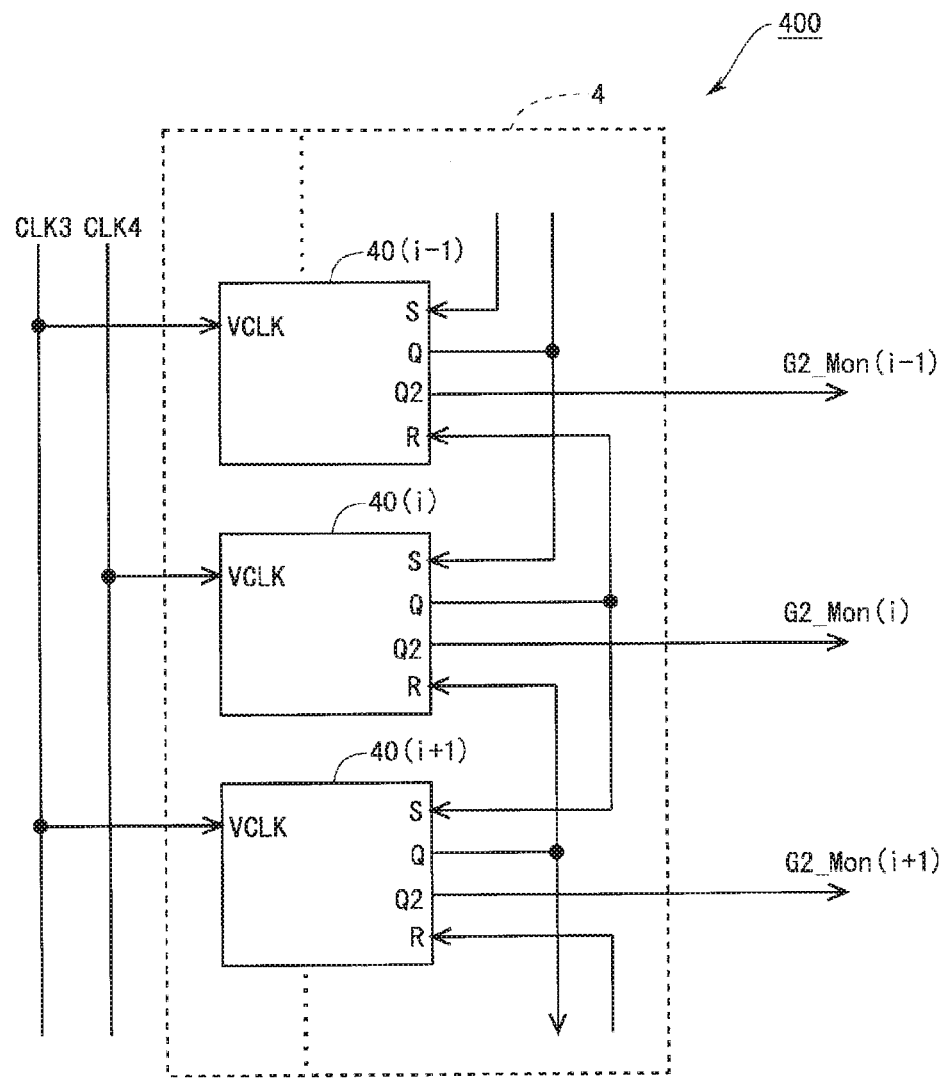
FIG. 14 is a block diagram illustrating a configuration of a monitor control line drive circuit in the first embodiment.

FIG. 14 is a block diagram illustrating a configuration of the monitor control line drive circuit 400 in the present embodiment. The monitor control line drive circuit 400 is realized by using a shift register 4. Each stage of the shift register 4 are arranged to correspond one-to-one to each monitor control line G2_Mon in the display unit 500. That is, in the present embodiment, a shift register 4 formed of 1080 stages is included in the monitor control line drive circuit 400. Note that in FIG. 14, only unit circuits 40 (i−1) to 40 (i+1) constituting from the (i−1)th stage to the (i+1)th stage out of the 1080 stages are illustrated. Each stage (each unit circuit) of the shift register 4 includes an input terminal configured to receive the clock signal VCLK, an input terminal configured to receive the set signal S, an input terminal configured to receive the reset signal R, an output terminal configured to output the state signal Q, and an output terminal configured to output the output signal Q2.

Figure 15:
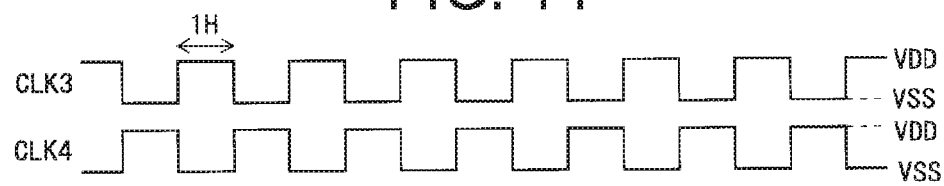
FIG. 15 is a signal waveform chart of a clock signal CLK3 and a clock signal CLK4 during a normal operation period in the first embodiment.

As illustrated in FIG. 14, signals applied to the input terminals of each stage (each unit circuit) of the shift register 4 are configured as follows. In the odd-numbered stages, the clock signal CLK3 is applied as the clock signal VCLK, and in the even-numbered stages, the clock signal CLK4 is applied as the clock signal VCLK. Furthermore, for any stage, the state signal Q output from a previous stage is applied as the set signal S, and the state signal Q output from a next stage is applied as the reset signal R. However, in the first stage (not illustrated in FIG. 14), the start pulse signal MSP is applied as the set signal S. Note that the low-level power supply voltage VSS (not illustrated in FIG. 14) is commonly applied to all unit circuits 40. Furthermore, the monitor enable signal Mon_EN (not illustrated in FIG. 14) is commonly applied to all unit circuits 40. The state signals Q and the output signal Q2 are output from each stage of the shift register 4. The state signals Q output from each stage are applied to the previous stage as the reset signal R, while being applied to the next stage as the set signal S. The output signals Q2 output from each stage are output to the corresponding monitor control line G2_Mon. Note that during the normal operation period, the clock signal CLK3 and the clock signal CLK4 change as illustrated in FIG. 15.

Figure 16:
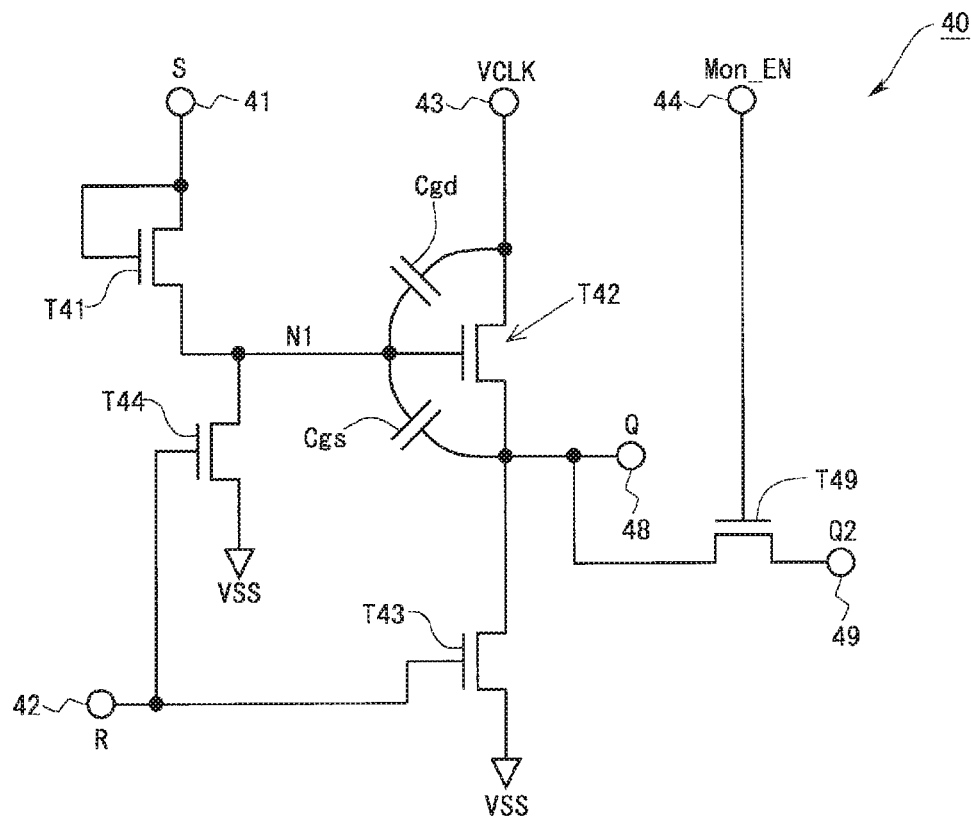
FIG. 16 is a circuit diagram illustrating a configuration of a unit circuit of a shift register constituting the monitor control line drive circuit in the first embodiment.

FIG. 16 is a circuit diagram illustrating a configuration of the unit circuit 40 of the shift register 4 (configuration of one stage of the shift register 4) constituting the monitor control line drive circuit 400. As illustrated in FIG. 16, the unit circuit 40 includes five transistors T41 to T44, and T49. Furthermore, the unit circuit 40 includes four input terminals 41 to 44 and two output terminals 48 and 49, in addition to the input terminal for the low-level power supply voltage VSS. The transistors T41 to T44, the input terminals 41 to 43, and the output terminal 48 in FIG. 16 correspond to the transistors T31 to T34, the input terminals 31 to 33, and the output terminal 38 in FIG. 12, respectively. That is, the unit circuit 40 has a similar configuration to that of the unit circuit 30, except for the following. An output terminal 49 different from the output 48 is provided in the unit circuit 40. Furthermore, the unit circuit 40 is provided with a transistor T49 configured so that the drain terminal is connected to the output terminal 48, the source terminal is connected to the output terminal 49, and the monitor enable signal Mon_EN is applied to the gate terminal. Note that similar to the unit circuit 30 of the shift register 3 constituting the write control line drive circuit 300, the unit circuit 40 is also not limited to the configuration illustrated in FIG. 16.

The unit circuit 40 has a similar configuration to that of the unit circuit 30, except that the output terminal 49 and the transistor T49 are provided as described above. Furthermore, the clock signals CLK3 and CLK4 having a waveform illustrated in FIG. 15 are applied to the shift register 4. From the above, the state signal Q output from each stage of the shift register 4 successively becomes high level based on the clock signals CLK3 and CLK4. Here, when focusing on any arbitrary unit circuit 40, in a case where the monitor enable signal Mon_EN is at low level, the transistor T49 is switched off. At this time, even in a case where the state signal Q is at high level, the output signal Q2 can be maintained at low level. Thus, the monitor control line G2_Mon corresponding to the unit circuit 40 does not go into the selected state. On the other hand, in a case where the monitor enable signal Mon_EN is at high level, the transistor T49 is switched on. At this time, in a case where the state signal Q becomes high level, the output signal Q2 also becomes high level. Therefore, the monitor control line G2_Mon corresponding to the unit circuit 40 goes into the selected state.

Figure 17:
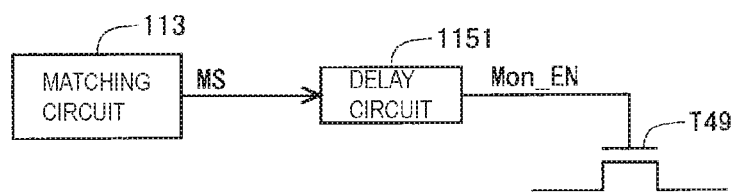
FIG. 17 is a diagram for describing a method of applying a monitor enable signal to a transistor T49 in the unit circuit of the shift register constituting the monitor control line drive circuit in the first embodiment.

Here, a method of applying the monitor enable signal Mon_EN to the transistor T49 in the unit circuit 40 will be described with reference to FIG. 17. As illustrated in FIG. 17, the monitor enable signal Mon_EN applied to the transistor T49 is output from a delay circuit 1151. The delay circuit 1151 is provided in the status machine 115 in the drive control unit 110 of the display control circuit 100. In a case where the write count value CntWL output from the write line counter 111 and the line address to be compensated Addr stored in the line address to be compensated storage memory 112 match, the matching signal MS changes from the low level to the high level. The delay circuit 1151 delays the waveform of the matching signal MS for only one horizontal interval. The signal thus obtained is output from the delay circuit 1151 as the monitor enable signal Mon_EN. From the above, the monitor enable signal Mon_EN applied to the transistor T49 becomes high level one horizontal interval after a time point at which the matching signal MS changes from the low level to the high level.

1.6 Configuration of Voltage Fluctuation Compensation Line Drive Circuit

Figure 18:
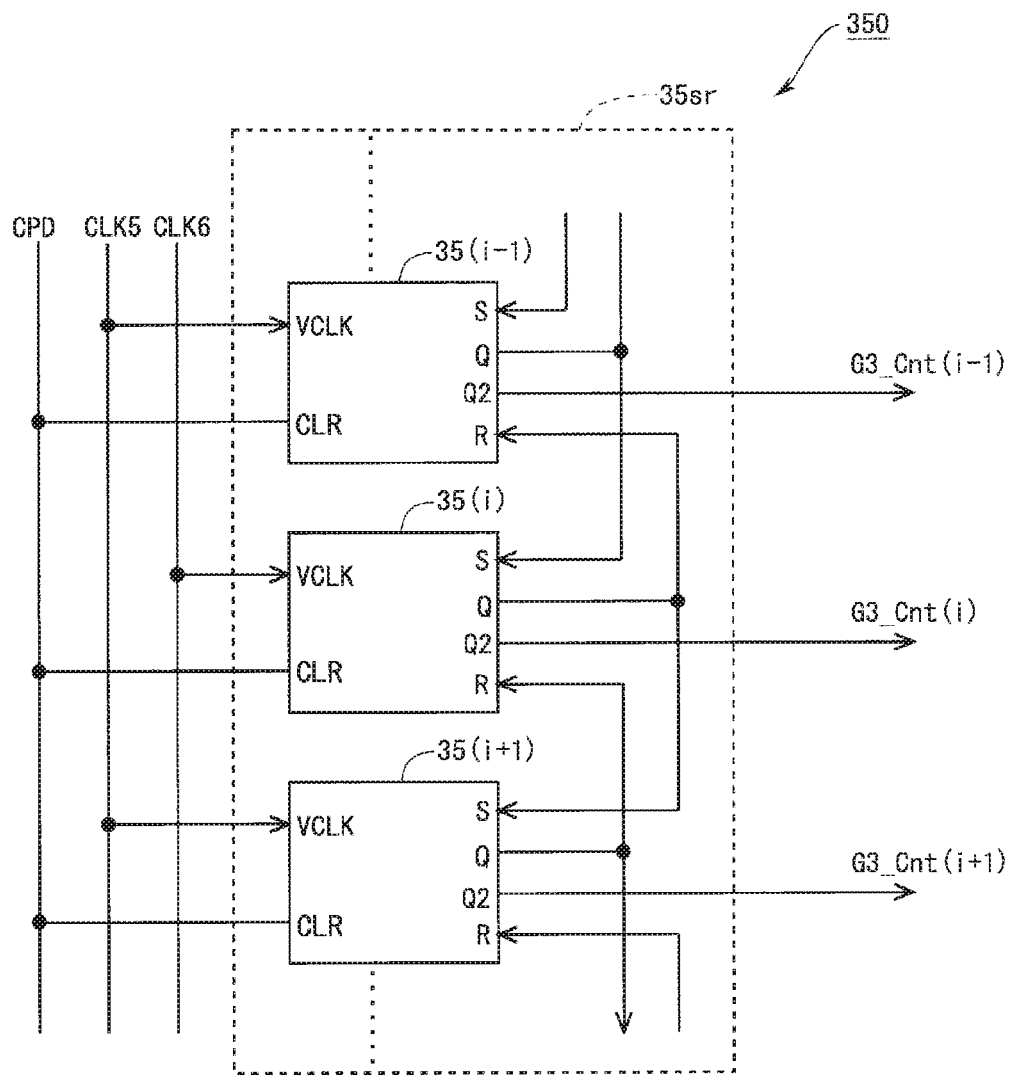
FIG. 18 is a block diagram illustrating a configuration of a voltage fluctuation compensation line drive circuit in the first embodiment.

FIG. 18 is a block diagram illustrating a configuration of the voltage fluctuation compensation line drive circuit 350 in the present embodiment. The voltage fluctuation compensation line drive circuit 350 is realized by using a shift register 35sr. Each stage of the shift register 35sr is provided to correspond one-to-one to each voltage fluctuation compensation line G3_Cnt in the display unit 500. That is, in the present embodiment, a shift register 35sr formed of 1080 stages is included in the voltage fluctuation compensation line drive circuit 350. Note that in FIG. 18, only unit circuits 35 (i−1) to 35 (i+1) constituting from the (i−1)th stage to the (i+1)th stage out of the 1080 stages are illustrated. In each stage (each unit circuit) of the shift register 35sr, an input terminal configured to receive the clock signal VCLK, an input terminal configured to receive the set signal S, an input terminal configured to receive the reset signal R, an input terminal configured to receive the clear signal CLR for resetting the output signal, an output terminal configured to output the state signal Q, and an output terminal configured to output the output signal Q2 are provided.

Figure 19:
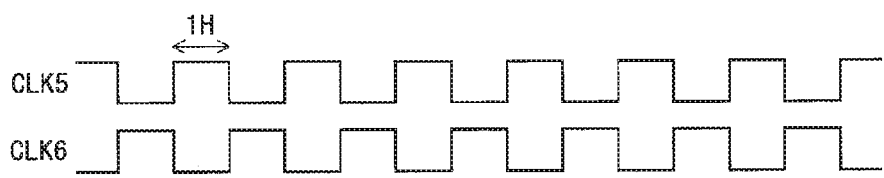
FIG. 19 is a signal waveform chart of a clock signal CLK5 and a clock signal CLK6 during a normal operation period in the first embodiment.

As illustrated in FIG. 18, signals applied to the input terminals of each stage (each unit circuit) of the shift register 35sr are configured as follows. In the odd-numbered stages, the clock signal CLK5 is applied as the clock signal VCLK, and in the even-numbered stages, the clock signal CLK6 is applied as the clock signal VCLK. Furthermore, for any stage, the state signal Q output from the previous stage is applied as the set signal S, and the state signal Q output from a next stage is applied as the reset signal R. However, in the first stage (not illustrated in FIG. 18), the start pulse signal CSP is applied as the set signal S. Note that the low-level power supply voltage VSS and the counter voltage VCNT (not illustrated in FIG. 18) are commonly applied to all unit circuits 35. Furthermore, the pull down signal CPD is commonly applied to all unit circuits 35 as the clear signal CLR. The state signal Q and the output signal Q2 are output from each stage of the shift register 35sr, of which the output signal Q2 is output to the corresponding voltage fluctuation compensation line G3_Cnt. Note that during the normal operation period, the clock signal CLK5 and the clock signal CLK6 change as illustrated in FIG. 19.

Figure 20:
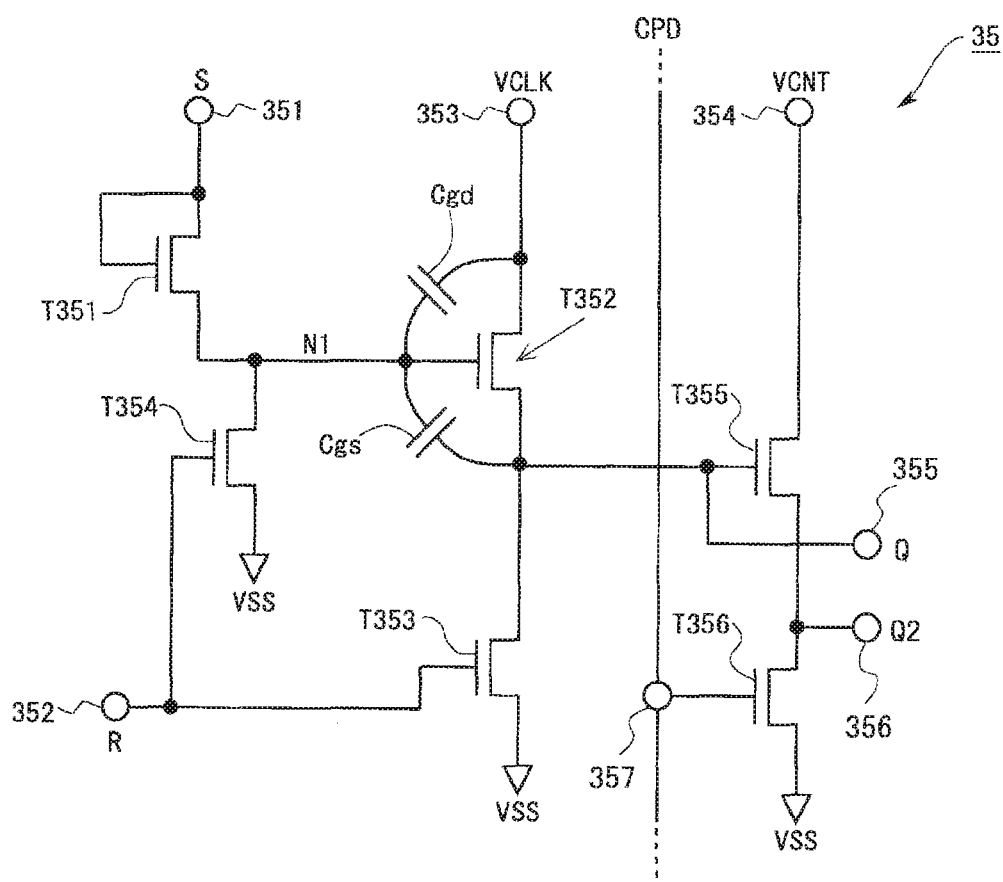
FIG. 20 is a circuit diagram illustrating a configuration of a unit circuit of a shift register constituting the voltage fluctuation compensation line drive circuit in the first embodiment.

FIG. 20 is a circuit diagram illustrating a configuration of the unit circuit 35 of the shift register 35sr (configuration of one stage of the shift register 35sr) configuring the voltage fluctuation compensation line drive circuit 350. As illustrated in FIG. 20, the unit circuit 35 includes six transistors T351 to T356. Furthermore, the unit circuit 35 includes five input terminals 351 to 354 and 357, and two output terminals 355 and 356, in addition to the input terminal for the low-level power supply voltage VSS. The transistors T351 to T354, the input terminals 351 to 353, and the output terminal 355 in FIG. 20 correspond to the transistors T31 to T34, the input terminals 31 to 33, and the output terminal 38 in FIG. 12, respectively. That is, the unit circuit 35 has a similar configuration to that of the unit circuit 30, except for the following points. An output terminal 356 different from the output terminal 355 is provided in the unit circuit 35. Further, the unit circuit 35 is provided with a transistor T355 configured so that the gate terminal is connected to the output terminal 355, the source terminal is connected to the output terminal 356, and the counter voltage VCNT is applied to the drain terminal. Furthermore, the unit circuit 35 is provided with a transistor T356 configured so that the drain terminal is connected to the source terminal of the transistor T355, the low-level power supply voltage VSS is applied to the source terminal, and the pull down signal CPD is applied to the gate terminal. Note that similar to the unit circuit 30 of the shift register 3 constituting the write control line drive circuit 300, the unit circuit 35 is also not limited to the configuration illustrated in FIG. 20.

The unit circuit 35 has a similar configuration to that of the unit circuit 30, except that the input terminals 354 and 357, the output terminal 356, the transistor T355, and the transistor T356 are provided as described above. Furthermore, the clock signals CLK5 and CLK6 having waveforms illustrated in FIG. 19 are applied to the shift register 35sr. From the above, the state signal Q output from each stage of the shift register 35sr successively becomes high level, based on the clock signals CLK5 and CLK6. Note that the pull down signal CPD input as the clear signal CLR, and the relationship between the state signal Q and the output signal Q2 will be described later.

1.7 Control Process in Display Control Circuit

Next, a control process performed in the display control circuit 100 to cause the write control line drive circuit 300 and the monitor control line drive circuit 400 to perform a desired operation will be described. In each frame period, while in the state where the monitor enable signal Mon_EN is set to a low level, the line address to be compensated Addr indicating the row to be compensated is set to the line address to be compensated storage memory 112, and the write line counter 111 is initialized, the pulse of the start pulse signal GSP instructing an operation start of the write control line drive circuit 300 is output. Furthermore, a pulse of the start pulse signal MSP instructing an operation start of the monitor control line drive circuit 400 is output one horizontal interval after the pulse of the start pulse signal GSP is output. The write count value CntWL increases based on the clock signals CLK1 and CLK2 after the output of the pulse of the start pulse signal GSP. Note that in a frame period during which the characteristic compensation (current measurement) of the drive transistor T2 in the pixel circuit 50 is performed (frame period during which a value appropriate as the line address to be compensated is set to the line address to be compensated storage memory 112 illustrated in FIG. 6), the voltage fluctuation compensation line drive circuit 350 stops the operation, and all the output signals of the voltage fluctuation compensation line drive circuit 350 are at low level and go into a high impedance state. Thus, during such a frame period, the display control circuit 100 maintains the clock signals CLK5, CLK6, and the pull down signal CPD at a low level (non-active). The control operation of the voltage fluctuation compensation line drive circuit 350 by the display control circuit 100 in a frame period during which the above-described characteristic compensation (current measurement) of the drive transistor T2 is not performed will be described later.

As described above, the matching circuit 113 determines whether the write count value CntWL output from the write line counter 111 and the line address to be compensated Addr stored in the line address to be compensated storage memory 112 match. Furthermore, when the write count value CntWL and the line address to be compensated Addr match, the matching signal MS applied to the status machine 115 changes from the low level to the high level. At this time, control as follows is performed by the status machine 115. Note that a time point at which the write count value CntWL and the line address to be compensated Addr match becomes a start time point of the characteristic detection process period.

(a) Control for Clock Signals CLK1 and CLK2

Both of the clock signal CLK1 and the clock signal CLK2 are set to a low level one horizontal interval after the time point at which the write count value CntWL and the line address to be compensated Addr match. Thereafter, the clock operation by the clock signals CLK1 and CLK2 goes into a stop state through the current measurement period. After the current measurement period ends, the states of the clock signals CLK1 and CLK2 are returned to the states immediately before the start of the current measurement period.

(b) Control for Clock Signals CLK3 and CLK4

Both of the clock signal CLK3 and the clock signal CLK4 are changed one horizontal interval as usual after the time point at which the write count value CntWL and the line address to be compensated Addr match. Thereafter, the clock operation by the clock signals CLK3 and CLK4 goes into the stop state through the current measurement period. After the current measurement period ends, the clock operation by the clock signals CLK3 and CLK4 resumes.

(c) Control for Monitor Enable Signal Mon_EN

The monitor enable signal Mon_EN is set to a high level one horizontal interval after the time point at which the write count value CntWL and the line address to be compensated Addr match. Thereafter, the monitor enable signal Mon_EN is maintained at high level through the current measurement period. After the current measurement period ends, the monitor enable signal Mon_EN is set to a low level.

In other words, a control process below is performed by the drive control unit 110 in the display control circuit 100. The drive control unit 110 controls the clock signals CLK1 and CLK2 so that only the potential of the clock signal applied to the unit circuit 30 corresponding to the row to be compensated out of two clock signals CLK1 and CLK2 is changed at the start time point and the end time point of the current measurement period, and the clock operation by the clock signals CLK1 and CLK2 is stopped through the current measurement period. Further, the drive control unit 110 controls the clock signals CLK3 and CLK4 so that the clock operation by the clock signals CLK3 and CLK4 is stopped through the current measurement period after the potentials of the clock signals CLK3 and CLK4 are changed at the start time point of the current measurement period. Furthermore, the drive control unit 110 activates the monitor enable signal Mon_EN only during the current measurement period.

1.8 Operation of Write Control Line Drive Circuit

Figure 21:
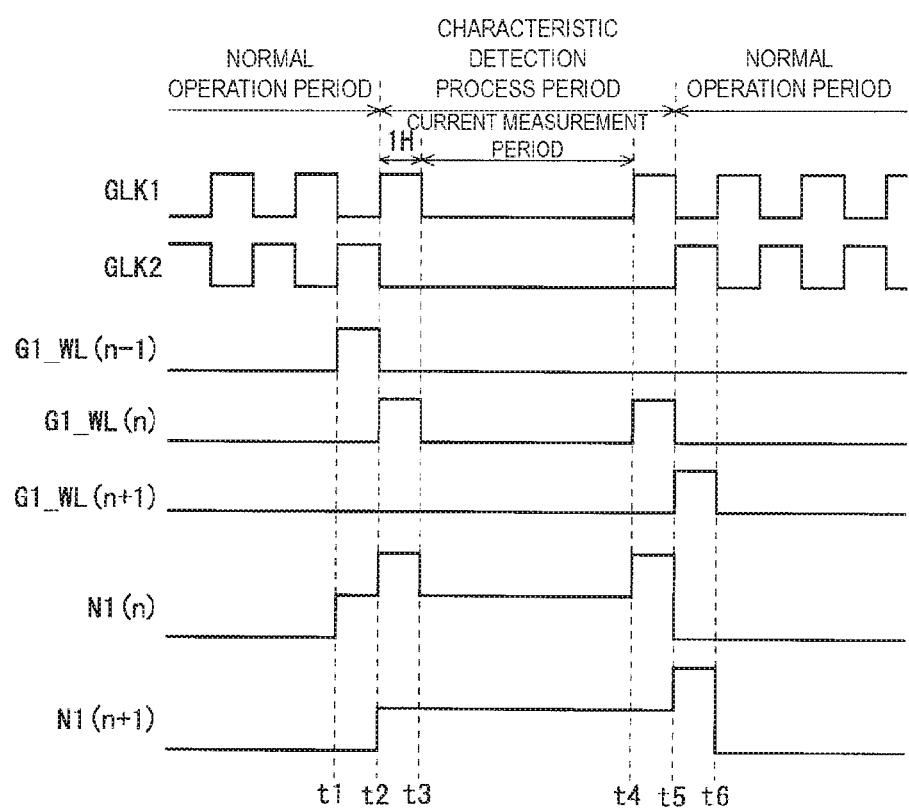
FIG. 21 is a timing chart for describing an operation of the write control line drive circuit in the first embodiment.

An operation of the write control line drive circuit 300 in the characteristic detection process period and a period close thereto, will be described while taking into account the content of the above-mentioned control process in the display control circuit 100. FIG. 21 is a timing chart for describing an operation of the write control line drive circuit 300. Note that an nth row is assumed to be determined as the row to be compensated.

When a time point t1 is reached, an (n−1)th row of the write control line G1_WL (n−1) goes into the selected state. As a result, normal data writing is performed at the (n−1)th row. Furthermore, by the (n−1)th row of the write control line G1_WL (n−1) going into the selected state, an electric potential of a first node N1 (n) in an nth column of the unit circuit 30 (n) in the shift register 3 increases. Note that, until a time point immediately before a time point t2, the line address to be compensated Addr and the write count value CntWL are not the same.

Upon reaching the time point t2, the clock signal CLK1 rises. As a result, the electric potential of the first node N1 (n) further increases in the nth column of the unit circuit 30 (n). As a result, the nth row of the write control line G1_WL (n) goes into a selected state. In this selected state, pre-compensation data is written to the nth row of each pixel circuit 50. Furthermore, at the time point t2, by the nth row of the write control line G1_WL (n) going into the selected state, an electric potential of a first node N1 (n+1) in an (n+1)th column of the unit circuit 30 (n+1) in the shift register 3 increases.

Incidentally, at the time point t2, due to the rising of the clock signal CLK1, the line address to be compensated Addr and the write count value CnTWL are the same. As a result, the display control circuit 100 drops the clock signal CLK1 at a time point t3 one horizontal interval after the time point t2, and afterwards stops the clock operation by the clock signals CLK1 and CLK2 until an end point (time point t4) of the current measurement period. That is, the clock signal CLK1 and the clock signal CLK2 are maintained at low level during a period from the time point t3 to the time point t4.

Note that at the time point t3, the electric potential of the first node N1 (n) decreases in the nth column of the unit circuit 30 (n) due to the drop of the clock signal CLK1. Furthermore, at the time point t3, the clock signal CLK2 does not rise, and thus, an (n+1)th row of the write control line G1_WL (n+1) is not in the selected state. Therefore, a high-level reset signal R is not input into the nth column of the unit circuit 30 (n). Thus, the electric potential of the first node N1 (n) in the nth column of the unit circuit 30 (n) at a time point immediately after the time point t3 is approximately the same as the electric potential at a time point immediately before the time point t2.

At the period from the time point t3 to the time point t4 (current measurement period), the drive current for detecting the characteristics of the drive transistor is measured. During this current measurement period, the clock operation by the clock signals CLK1 and CLK2 is stopped. Thus, during the current measurement period, the electric potential of the first node N1 (n) in the nth column of the unit circuit 30 (n) is maintained.

Upon reaching the time point t4 that is the end point of the current measurement period, the display control circuit 100 restarts the clock operation by the clock signals CLK1 and CLK2. At this point, a signal (the clock signal CLK1 in the example illustrated in FIG. 21) among the clock signal CLK1 and the clock signal CLK2 that has fallen at the start point of the current measurement period (time point t3) is raised. By this, the clock signal CLK1 rises at the time point t4, and thus, the electric potential of the first node N1 (n) increases in the nth column of the unit circuit 30 (n). As a result, the nth row of the write control line G1_WL (n) goes into the selected state. At this time, post-compensation data is written to the nth row of each pixel circuit 50.

Upon reaching a time point t5, the clock signal CLK1 falls and the clock signal CLK2 rises. In the period after the time point t5, the write control lines G1_WL go into the selected state for each row subsequently. As a result, normal data writing is performed for each row subsequently.

1.9 Operation of Monitor Control Line Drive Circuit

Figure 22:
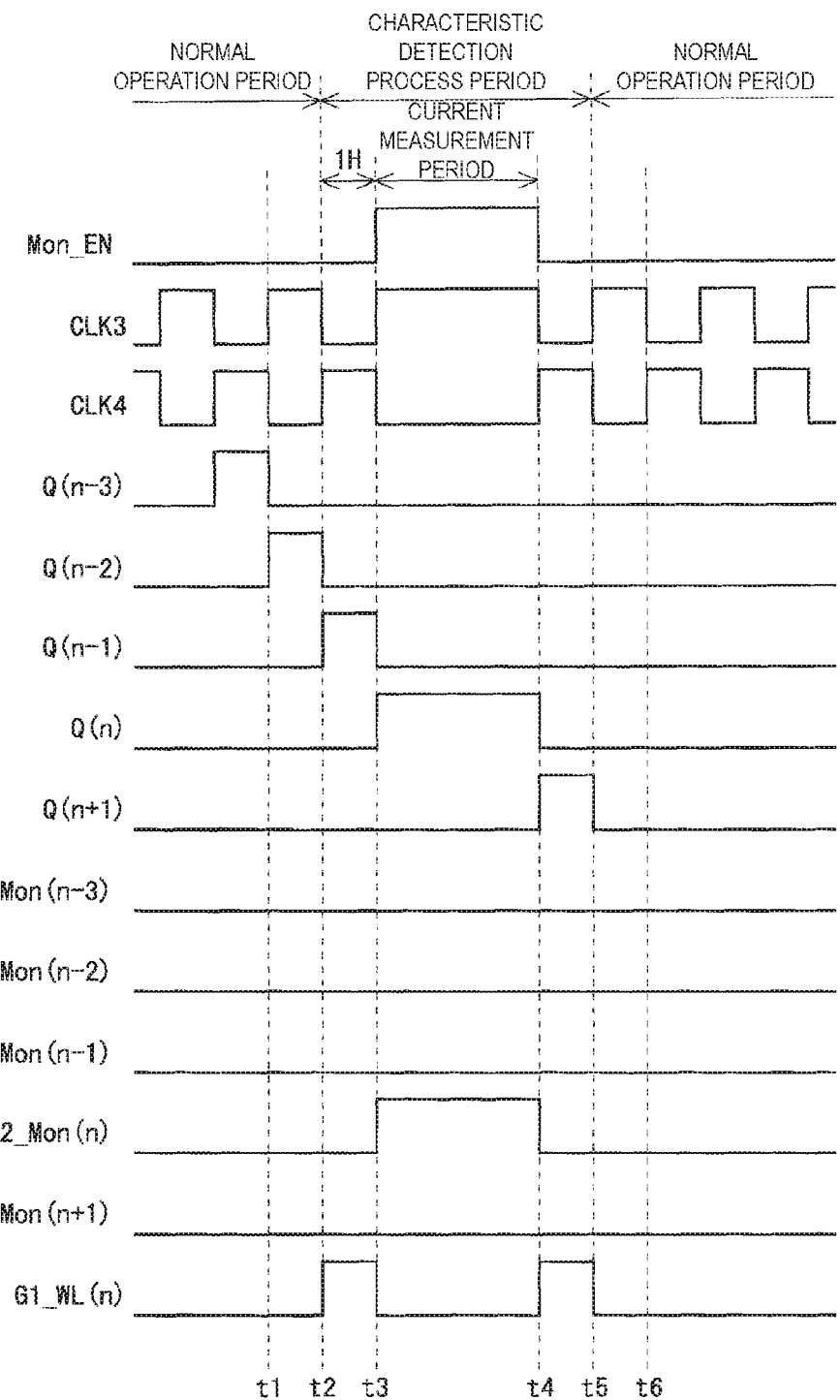
FIG. 22 is a timing chart for describing an operation of the monitor control line drive circuit in the first embodiment.

An operation of the monitor control line drive circuit 400 in the characteristic detection process period and the period close thereto will be described while taking into account the content of the above-mentioned control process in the display control circuit 100. FIG. 22 is a timing chart for describing an operation of the monitor control line drive circuit 400. Note that, here also, the nth row is assumed to be determined as the row to be compensated.

In the monitor control line drive circuit 400, the state signals Q output from each unit circuit 40 in the shift register 4 each become high level in a sequence of one horizontal interval, based on the clock signal CLK3 and the clock signal CLK4. For example, a state signal Q (n−2) output from an (n−2)th column of the unit circuit 40 (n−2) becomes high level in the period from the time point t1 to the time point t2. A state signal Q (n−1) output from an (n−1)th column of the unit circuit 40 (n−1) becomes high level in the period from the time point t2 to the time point t3. However, the monitor enable signal Mon_EN is at low level in the period before a time point immediately before the time point t3, and thus, an (n−2)th row of the monitor control line G2_Mon (n−2) and an (n−1)th row of the monitor control line G2_Mon (n−1) are not in the selected state.

Upon reaching the time point t2, the line address to be compensated Addr and the write count value CnTWL match. Thus, the display control circuit 100 changes the monitor enable signal Mon_EN from a low level to a high level at the time point t3 one horizontal interval after the time point t2. As a result, the transistors T49 in all unit circuits 40 are switched on at the time point t3. Furthermore, at the time point t3, a state signal Q (n) output from an nth column of the unit circuit 40 (n) becomes high level. Thereby, an output signal Q2 (n) output from the nth column of the unit circuit 40 (n) becomes high level, and thus, an nth row of the monitor control line G2_Mon (n) goes into the selected state.

Moreover, after changing a value of the clock signal CLK3 and the clock signal CLK4 at the time point t3, the display control circuit 100 stops the clock operation by the clock signals CLK3 and CLK4 through the current measurement period (period from the time point t3 to the time point t4). In the example illustrated in FIG. 22, the clock signal CLK3 changes from a low level to a high level and the clock signal CLK4 changes from a high level to a low level at the time point t3, and thus, the clock signal CLK3 is maintained at high level and the clock signal CLK4 is maintained at low level during the current measurement period. Thereby, the clock operation by the clock signals CLK3 and CLK4 stops, and thus, the nth row of the monitor control line G2_Mon (n) is maintained in the selected state through the current measurement period.

Upon reaching the time point t4 being the end point of the current measurement period, the display control circuit 100 changes the monitor enable signal Mon_EN from a high level to a low level and resumes the clock operation by the clock signals CLK3 and CLK4. In the period from the time point t4 to the time point t5, a state signal Q (n+1) output from an (n+1)th column of the unit circuit 40 (n+1) becomes high level, however, the monitor enable signal Mon_EN is at low level, and thus, an (n+1)th row of the monitor control line G2_Mon (n+1) is not in the selected state. Similarly, in the period after the time point t5, none of the monitor control lines G2_Mon are in the selected state.

1.10 Operation of Voltage Fluctuation Compensation Line Drive Circuit

As described above, the voltage fluctuation compensation line drive circuit 350 stops the operation in the frame period during which the compensation of the characteristics (current measurement) of the drive transistor in the pixel circuit 50 is performed. Below, an operation of the voltage fluctuation compensation line drive circuit 350 is described for the frame period during which the compensation of the characteristics of the drive transistor T2 of the pixel circuit 50 is not performed. FIG. 23 is a timing chart for describing the operation of the voltage fluctuation compensation line drive circuit 350 in this case.

In the write control line drive circuit 300, after the pulse of the start pulse signal GSP is produced, a state signal Q (0) output from a first column of the unit circuit 30 (0) first becomes high level at the time point t3 at which the clock signal CLK1 rises, and next becomes low level at the time point t5 at which the clock signal CLK1 falls. At the time point t5 at which the clock signal CLK1 falls, the clock signal CLK2 rises, such that a state signal Q (1) output from a second column of the unit circuit 30 (1) becomes high level. Thereby, the state signals Q of each column of the shift register 3 in the write control line drive circuit 300 each become high level sequentially for one horizontal interval. In accordance with this, as illustrated in FIG. 23, the write control lines G1_WL (0), G1_WL (1), G1_WL (2), . . . , G1_WL (1079) each go into a selected state in a sequence of one horizontal interval (voltage of the write control line G1_WL is at high level).

The pulse of the start pulse signal CSP that instructs the operation start of the voltage fluctuation compensation line drive circuit 350 is output at the time point t2 at which slightly less time than one horizontal interval has passed since the time point t1 at which the pulse of the start pulse signal CSP of the write control line drive circuit 300 rises. In the voltage fluctuation compensation line drive circuit 350, after this pulse of the start pulse signal GSP is produced, a state signal Q (0) output from a first column of the unit circuit 35 (0) first becomes high level at the time point t4 at which the clock signal CLK5 rises, and next becomes low level at a time point t6 at which the clock signal CLK5 falls. At the time point t6 at which the clock signal CLK5 falls, the clock signal CLK6 rises, such that a state signal Q (1) output from a second column of the unit circuit 35 (1) becomes high level. Thereby, the state signals Q of each column of a shift register 35rs in the voltage fluctuation compensation line drive circuit 350 each become high level sequentially for one horizontal interval. Here, considering that the pull down signal CPD is at the low level except during the vertical blanking period, in each unit circuit 35 configured as illustrated in FIG. 20, the output signal Q2 becomes a counter voltage VCNT as a high level when the state signal Q is at high level, and goes into a high-impedance state when the state signal Q is at low level. Thus, in each unit circuit 35, once the output signal Q2 becomes high level (the counter voltage VCNT), even in a case where the state signal Q becomes low level, the high level (the counter voltage VCNT) is maintained by the capacitance of the voltage fluctuation compensation line G3_Cnt connected to the output terminal 356. Afterwards, in the vertical blanking period, when the pull down signal CPD becomes high level, the output signal Q2 becomes low level. In accordance with this, as illustrated in FIG. 23, the voltage fluctuation compensation lines G3_Cnt (0), G3_Cnt (1), G3_Cnt (2), . . . , G3_Cnt (1079) go into a selected state in a sequence of one horizontal interval (the voltage of the voltage fluctuation compensation line G3_Cnt is the counter voltage VCNT), and afterwards, in the vertical blanking period, upon the pull down signal CPD becoming high level, the voltage fluctuation compensation lines go into a non-selected state (voltage of the voltage fluctuation compensation line G3_Cnt is at low level).

Note that, in the frame period during which the voltage fluctuation compensation line drive circuit 350 operates as described above, the monitor enable signal Mon_EN is maintained at low level and thus, the monitor control lines G2_Mon (0) to G2_Mon (1079) are all maintained in the non-selected state (voltage of the monitor control line G2_Mon is at low level), regardless of the state signal Q of each of the unit circuits 40 in each monitor control line drive circuit 400 (see FIG. 14, FIG. 16, and FIG. 23).

1.11 Operation for Writing Pixel Data into Pixel Circuits

Figure 24:
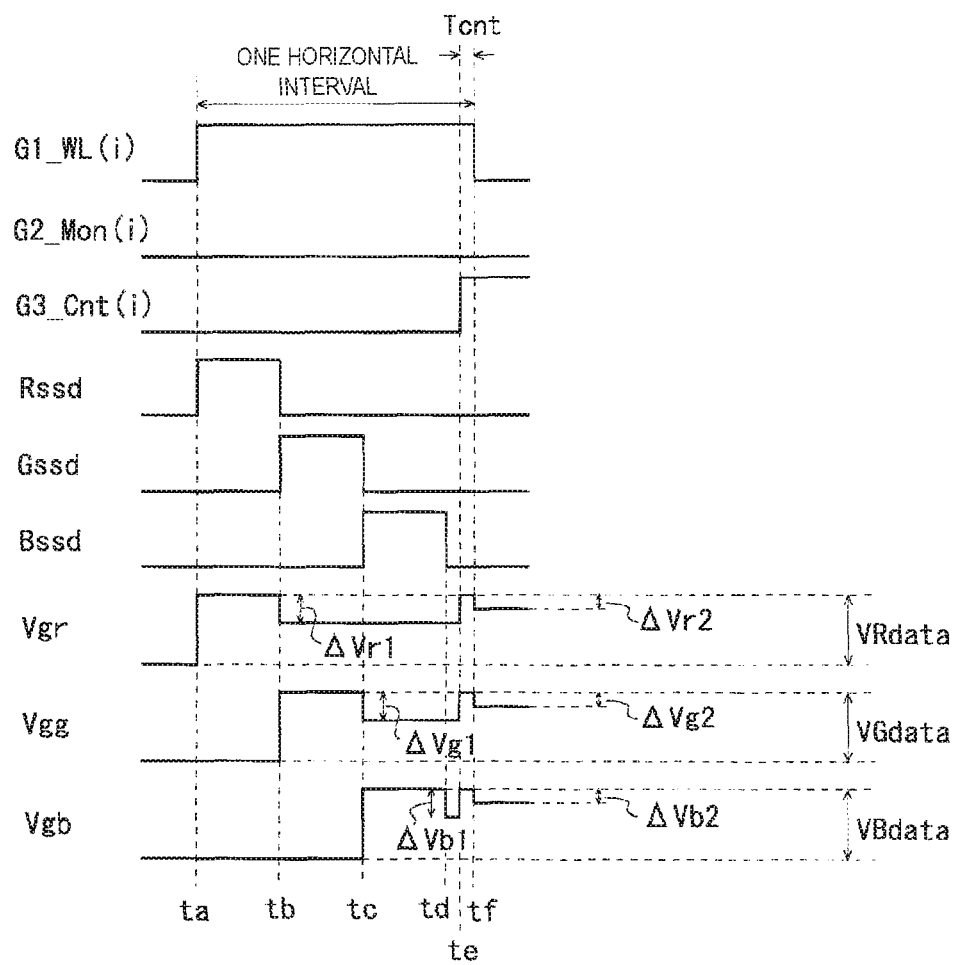
FIG. 24 is a signal waveform chart for describing an operation for writing pixel data into a pixel circuit in the first embodiment.

FIG. 24 is a signal waveform chart for describing an operation for writing pixel data into the pixel circuit 50. This operation is performed in the frame period during which the voltage fluctuation compensation line drive circuit 350 operates (frame period during which the compensation of the characteristics of the drive transistor T2 of the pixel circuit 50 is not performed).

In this frame period, the input and output control signal DWT from the display control circuit 100 is at high level and the data voltage output unit circuit 211d is connected to the input terminal of each demultiplexer 252 in the data-side drive circuit 200 (FIG. 4, FIG. 5), by which the data-side drive circuit 200 functions as the data line drive circuit 210. The write control line G1_WL and the voltage fluctuation compensation line G3_Cnt are driven by the data line drive circuit 210 and the voltage fluctuation compensation line drive circuit 350 as illustrated in the above-described FIG. 23. FIG. 24 illustrates a change of the various types of signals for the pixel data writing in one horizontal interval in this frame period, that is, in the period during which the ith row of the write control line G1_WL (i) goes into the selected state. Below, the operation for writing pixel data into the pixel circuit 50 in the horizontal interval will be described with reference to FIG. 4 and FIG. 24.

The red pixel connection control signal Rssd, the green pixel connection control signal Gssd, and the blue pixel connection control signal Bssd constituting the SSD control signal Cssd applied from the display control circuit 100 to each demultiplexer 252 become high level (active) for each predetermined period in each horizontal interval in order to drive the three data lines SLri, SLgi, and SLbi constituting each set in time division manner. For example, as illustrated in FIG. 24, these connection control signals Rssd, Gssd, and Bssd each become high level in a sequence of intervals slightly shorter than one third of the length of one horizontal interval in the horizontal interval in which the ith row of the write control line G1_WL (i) goes into the selected state.

In the period during which the red pixel connection control signal Rssd becomes high level (from ta to tb), each analog video signal Dj is applied as red pixel data signal Drj from the (jth data voltage output unit circuit 211d of the) data line drive circuit 210 to the red pixel data line SLrj (j=0 to M) via the first transistor SWr in the on state in the corresponding demultiplexer 252. Each red pixel data line SLrj has a capacitance CsI (hereinafter, referred to as "data line capacitance") formed between the red pixel data line SLrj and the other electrodes (electrodes configuring the writing control line G1_WL, the monitor control line G2_Mon, the voltage fluctuation compensation line, and the like) (similarly, each green pixel data line SLgj and each blue pixel data line SLbj also each have the data line capacitance CsI), and thus, the red pixel data line SLrj is charged by this red pixel data signal Drj and retains the voltage VRdata of this red pixel data signal Drj as pixel data.

When the ith row of the write control line G1_WL (i) goes into the selected state, the transistor T1 is switched on in the pixel circuits 50r, 50g, and 50b (hereinafter, referred to as "selected pixel circuit 50") connected to the write control line G1_WL (i). As a result, the analog video signal Dj applied as red pixel data signal Drj to the data line SLrj is applied to the gate terminal of the drive transistor T2 via the transistor T1 and charges the capacitor Cst being the voltage holding capacity. As a result, a voltage (referred to as "selected red pixel gate voltage" below) Vgr of the gate terminal of the drive transistor T2 in the red pixel circuit (hereinafter, referred to as "selected red pixel circuit") 50r among the selected pixel circuits 50 becomes equal to the voltage VRdata of the analog video signal Dj.

Thereafter, when the red pixel connection control signal Rssd becomes low level (inactive), the first transistor SWr in each demultiplexer 252 is switched off and supply of each analog video signal Drj to the red pixel data line SLrj is blocked. The change in voltage of the red pixel connection control signal Rssd from the high level to the low level at this time influences the data line voltage Vr retained in the red pixel data line SLrj (see FIG. 4), via a parasitic capacitance Cssdr formed between the gate terminal and the drain terminal of the first transistor SWr (conduction terminal connected to the red pixel data line SLrj). That is, the data line voltage Vsl=Vr decreases due to the field through phenomenon caused when the first transistor SWr connected to each red pixel data line SLrj changes from the on state to the off state (hereinafter, the decrease in voltage at this time is referred to as "first field through voltage at the red pixel writing time" or simply as "first field through voltage" and expressed by the symbol "ΔVr1"). In accordance with this, as illustrated in FIG. 24, the selected red pixel gate voltage Vgr also only decreases by the first field through voltage ΔVr1.

In the period during which the green pixel connection control signal Gssd becomes high level (from tb to tc), the second transistor SWg in each demultiplexer 252 is switched on, and thus, each analog video signal Dj is applied to the green pixel data line SLgj as a green pixel data signal Dgj (j=0 to M), and each green pixel data line SLgj retains a voltage VGdata of the green pixel data signal Dgj. As a result, a voltage (referred to as "selected green pixel gate voltage" below) Vgg of the gate terminal of the drive transistor T2 in the green pixel circuit (hereinafter, referred to as "selected green pixel circuit") 50g among the pixel circuits 50 connected to the write control line G1_WL (i) in the selected state, that is, the selected pixel circuits 50, becomes equal to the voltage VGdata of the analog video signal Dj.

Thereafter, upon the green pixel connection control signal Gssd becoming low level (inactive), the data line voltage Vsl=Vg decreases (hereinafter, the decrease in voltage at this time is referred to as "first field through voltage at the green pixel writing time" or simply as "first field through voltage" and expressed by the symbol "ΔVg1") due to the field through phenomena (see FIG. 4) resulting from the parasitic capacitance Cssdg formed between the gate terminal and the drain terminal of the second transistor SWg (conduction terminal connected to the green pixel data line SLgj). In accordance with this, as illustrated in FIG. 24, the selected green pixel gate voltage also Vgg decreases by the first field through voltage ΔVg1.

In the period during which the blue pixel connection control signal Bssd becomes high level (from tc to td), a third transistor SWb in each demultiplexer 252 is switched on, and thus, each analog video signal Dj is applied to the blue pixel data line SLbj as a blue pixel data signal Dbj (j=0 to M), and each blue pixel data line SLbj retains a voltage VBdata of the blue pixel data signal Dbj. As a result, a voltage (referred to as "selected blue pixel gate voltage" below) Vgb of the gate terminal of the drive transistor T2 in the blue pixel circuit (hereinafter, referred to as "selected blue pixel circuit") 50b among the selected pixel circuits 50 becomes equal to the voltage VBdata of the analog video signal Dj.

Thereafter, upon the blue pixel connection control signal Bssd becoming low level (inactive), the data line voltage Vsl=Vb decreases (hereinafter, the decrease in voltage at this time is referred to as "first field through voltage at the blue pixel writing time" or simply as "first field through voltage" and expressed by the symbol "ΔVb1") due to the field through phenomena (see FIG. 4) resulting from the parasitic capacitance Cssdb formed between the gate terminal and the drain terminal of the third transistor SWb (conduction terminal connected to the blue pixel data line SLbj). In accordance with this, as illustrated in FIG. 24, the selected blue pixel gate voltage Vgb also decreases by the first field through voltage ΔVb1.

As the pull down signal CPD becomes high level in the vertical blanking period immediately before the present frame period, the voltage fluctuation compensation lines G3_Cnt (0) to G3_Cnt (1079) all go into a non-selected state (the voltage of the voltage fluctuation compensation line G3_Cnt is at low level) (see FIG. 18 and FIG. 20). Thereafter, as illustrated in FIG. 23, after the corresponding write control line G1_WL (0) goes into the selected state, the voltage fluctuation compensation line G3_Cnt (0) changes to the selected state at the time point (t4) at which a predetermined period Tcnt before the corresponding write control line G1_WL (0) goes into the non-selected state at the time point (t5) (the voltage of the voltage fluctuation compensation line G3_Cnt (i) changes to the counter voltage VCNT as high-level voltage). In the signal waveform chart illustrated in FIG. 24, the time point (t5) at which the write control line G1_WL (0) goes into the non-selected state corresponds to a time point tf, and the time point (t4) at which the voltage fluctuation compensation line G3_Cnt (0) goes into the selected state corresponds to a time point te. As illustrated in FIG. 24, in each horizontal interval after the connection control signals Rssd, Gssd, and Bssd consecutively become high level, the voltage fluctuation compensation line G3_Cnt (i) goes into the selected state at the time point te after the time point td at which all connection control signals Rssd, Gssd, and Bssd become low level. Afterwards, the write control line G1_WL (i) goes into the non-selected state at the time point tf.

At the above-mentioned time point te at which the voltage fluctuation compensation line G3_Cnt (i) goes into the selected state, the voltage of the voltage fluctuation compensation line G3_Cnt (i) changes into the opposite direction to the change in voltage of the connection control signals Rssd, Gssd, and Bssd, for changing the first, second, and third transistors SWr, SWg, and SWb from the on state to the off state. That is, the voltage of the voltage fluctuation compensation line G3_Cnt (i) changes from a low level to a high level (counter voltage VCNT). As can be understood from the configuration of the pixel circuits 50r, 50g, and 50b illustrated in FIG. 4, this change in voltage (increase in voltage) of the voltage fluctuation compensation line G3_Cnt (i) acts to increase the data line voltage Vr, Vg, and Vb via the capacitor Ccnt that is the voltage fluctuation compensation capacitance. Thus, by appropriately setting a value for the capacitance of the capacitor Ccnt in each selected pixel circuit 50r, 50g, and 50b and a value for the counter voltage VCNT from the logic power supply 630, a decrease in voltage of the data lines SLrj, SLgj, and SLbj can be canceled out or sufficiently compensated. That is, it is possible to cancel out or sufficiently compensate the first field through voltages ΔVr1, ΔVg1, and ΔVb1 or an amount of decrease of the selected red pixel gate voltage Vgr, the selected green pixel gate voltage Vgg, and the selected blue pixel gate voltage Vgb, which are respectively equal to the voltage of the data lines SLrj, SLgj, and SLbj (details are described later). Note that from the viewpoint of charging the capacitance CsI of each of the data SLrj, SLgj, SLbj by the analog video signal Dj, it is preferable that the period during which each connection control signal Rssd, Gssd, and Bssd becomes high level in the one horizontal interval is long. Therefore, the above-mentioned predetermined period Tcnt=t5−t4=tf−te is set to become sufficiently short within a range for which it is possible to certainly compensate the first field through voltages ΔVr1, ΔVg1, and ΔVb1 by the change in voltage (increase in voltage) of the voltage fluctuation compensation line G3_Cnt (i).

The drive control unit 110 of the display control circuit 100 is configured to generate the source control signal SCTL, the voltage fluctuation compensation control signal CCTL, and the connection control signals Rssd, Gssd, and Bssd for adjusting the change in the selected state/non-selected state of the write control line G1_WL (i) and the voltage fluctuation compensation line G3_Cnt (i), as well as the change in the level of the connection control signals Rssd, Gssd, and Bssd to the above-mentioned timing illustrated in FIG. 24 (see FIG. 1, FIG. 6, and FIG. 23).

As illustrated in FIG. 24, at the above-mentioned time point tf at which the ith row of the write control line G1_WL (i) changes into the non-selected state, the voltage of the write control line G1_WL (i) changes from a high level to a low level, and this change in voltage influences the voltage of the gate terminal of the drive transistor in each of the selected pixel circuits 50*r*, 50*g*, and 50*b* via the parasitic capacitance Cgd2 formed between a gate terminal and a drain terminal of an input transistor T1. That is, by the field through phenomenon caused when the input transistor T1 changes from the on state to the off state in the selected red pixel circuit 50*r*, the selected green pixel circuit 50*g*, and the selected blue pixel circuit 50*b*, the selected red pixel gate voltage Vgr, the selected green pixel gate voltage Vgg, and the selected blue pixel gate voltage Vgb each decrease by a voltage ΔVr2, ΔVg2, and ΔVb2 (a decrease in voltage at this time is referred to as "second field through voltage", below).

Afterwards, in the selected red pixel circuit 50*r*, the selected green pixel circuit 50*g*, and the selected blue pixel circuit 50*b*, the selected red pixel gate voltage Vgr, the selected green pixel gate voltage Vgg, and the selected blue pixel gate voltage Vgb after the decrease are each maintained by the capacitor Cst being the voltage holding capacity. As a result, in the pixel circuits 50*r*, 50*g*, and 50*b*, based on the selected red pixel gate voltage Vgr, the selected green pixel gate voltage Vgg, and the selected blue pixel gate voltage Vgb, electric currents IoelR, IoelG, and IoelB in accordance with the voltage maintained by the capacitor Cst each flow in the organic EL element OLED, and the organic EL elements OLED each emit light at a brightness in accordance with these electric currents IoelR, IoelG, and IoelB.

Thereafter, when the write control line G1_WL (i) in the ith row is selected again next time, the selected red pixel gate voltage Vgr, selected green pixel gate voltage Vgg, and selected blue pixel gate voltage Vgb are rewritten by an analog video signal Dj which is newly applied as a red pixel data signal Drj, a green pixel data signal Dgj, and a blue pixel data signal Dbj via each demultiplexer 252 from the data line drive circuit 210.

Figure 25:
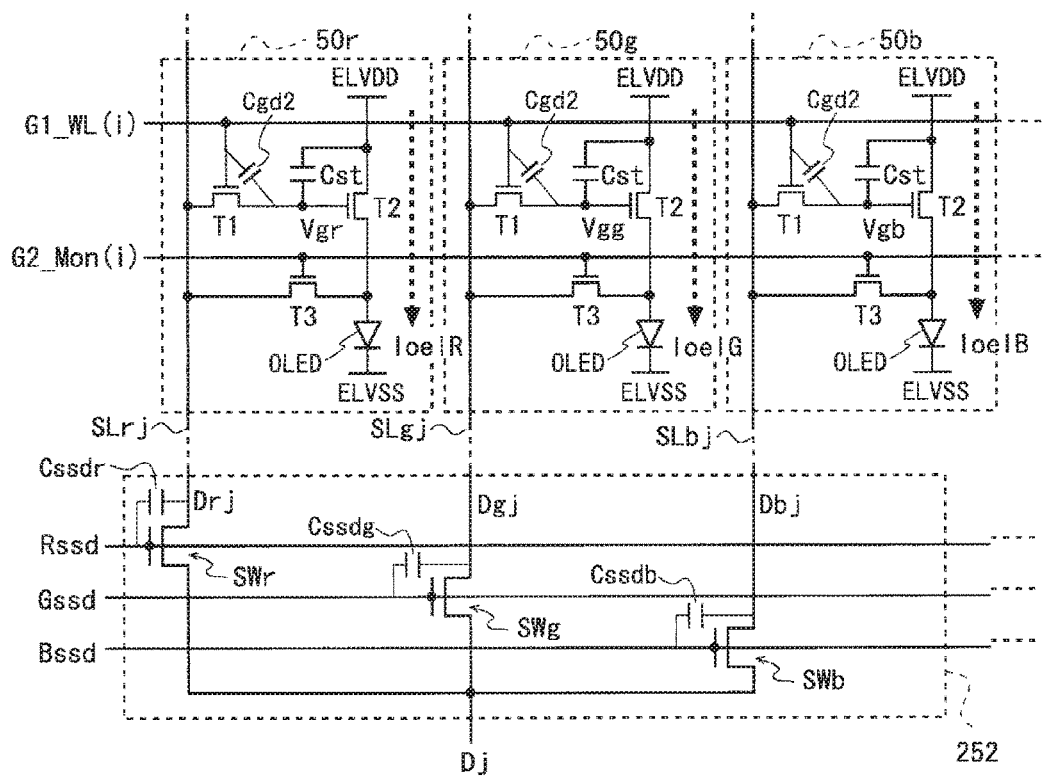
FIG. 25 is a circuit diagram for describing a problem in a basic configuration display device used as a basis of the first embodiment.
Figure 26:
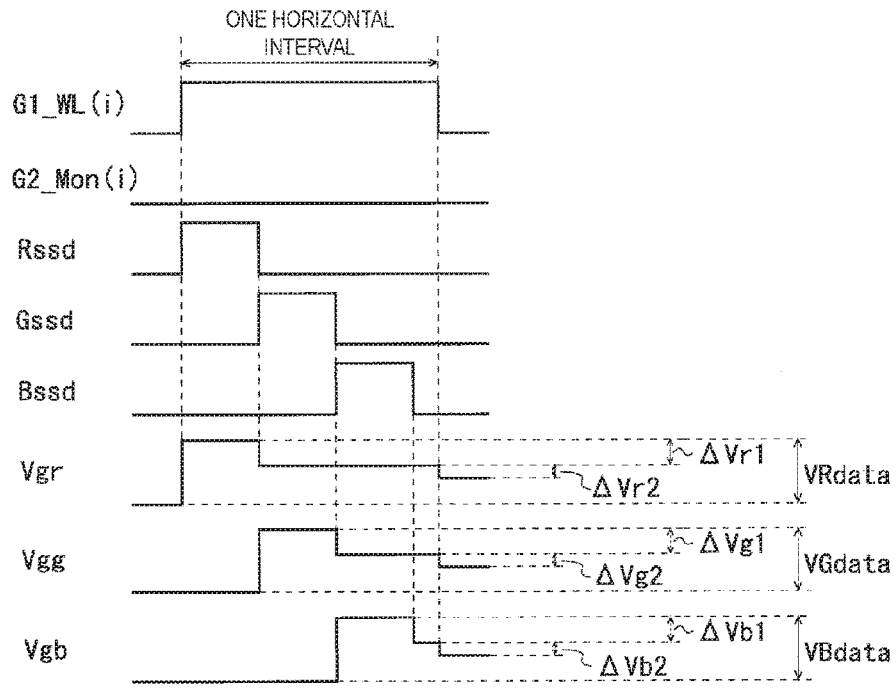
FIG. 26 is a signal waveform chart illustrating an operation for writing pixel data into a pixel circuit in a basic configuration display device.

Note that, FIG. 25 is a circuit diagram illustrating a basic configuration of the present embodiment; that is, a circuit diagram illustrating the pixel circuits 50*r*, 50*g*, 50*b*, and the demultiplexer 252 in a case where a voltage fluctuation compensation line G3_Cnt and a transistor T4 to which the voltage fluctuation compensation line G3_Cnt is connected are not provided. In the case of such configuration, a signal waveform illustrating an operation of writing the pixel data to the pixel circuit is as illustrated in FIG. 26, and decreases of the data line voltage Vsl and the selected pixel gate voltage Vgx (x=r, g, b) (a first field through voltage ΔVx1 and a second field through voltage ΔVx2) occur by the field through phenomenon, so that these decreases are not compensated.

1.12 Operation for Measuring Drive Current in Pixel Circuits

Figure 27:
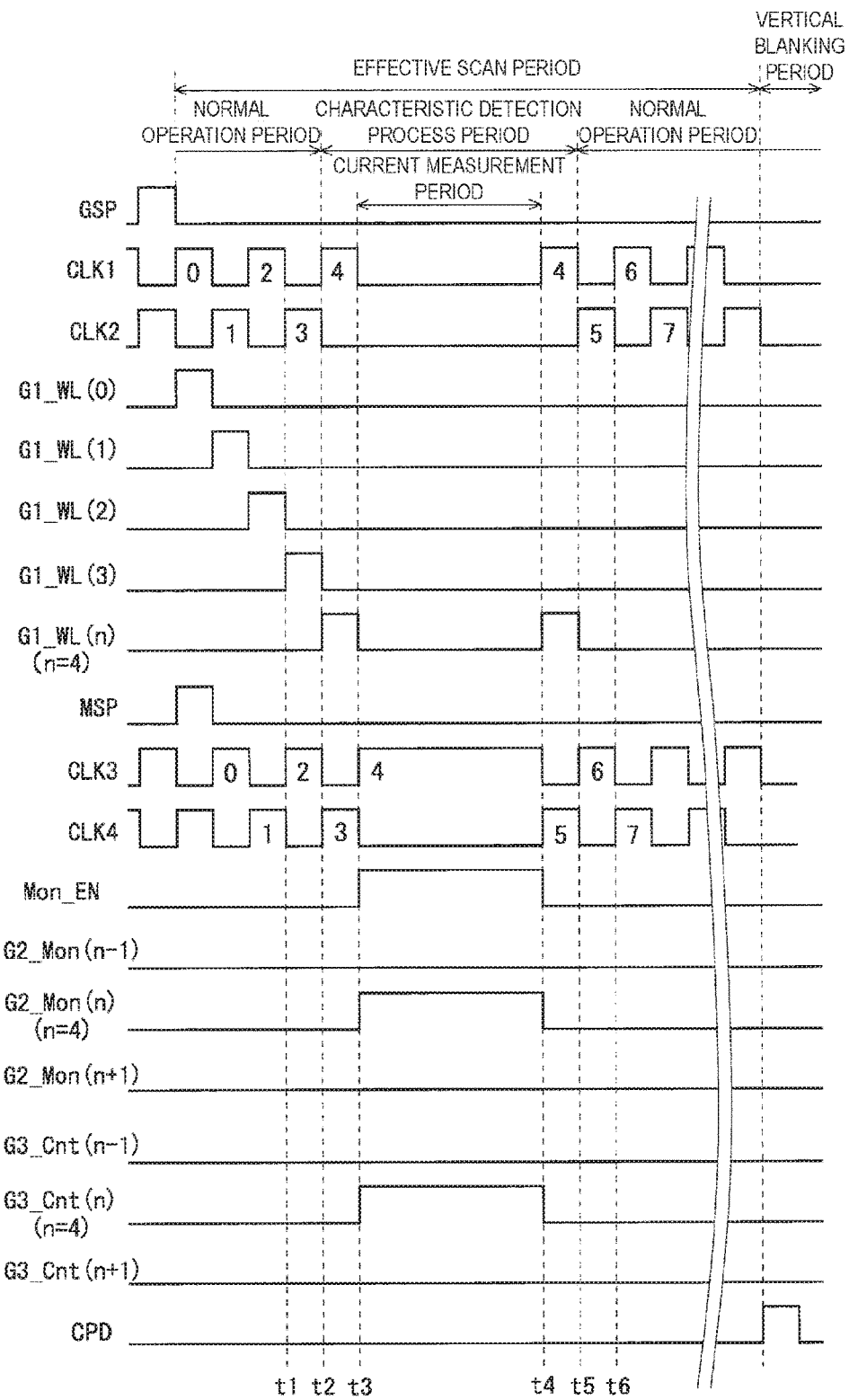
FIG. 27 is a timing chart illustrating a state change of a write control line, a monitor control line, and a voltage fluctuation compensation line in a frame period during which a current in the pixel circuit in the first embodiment is measured.
Figure 28:
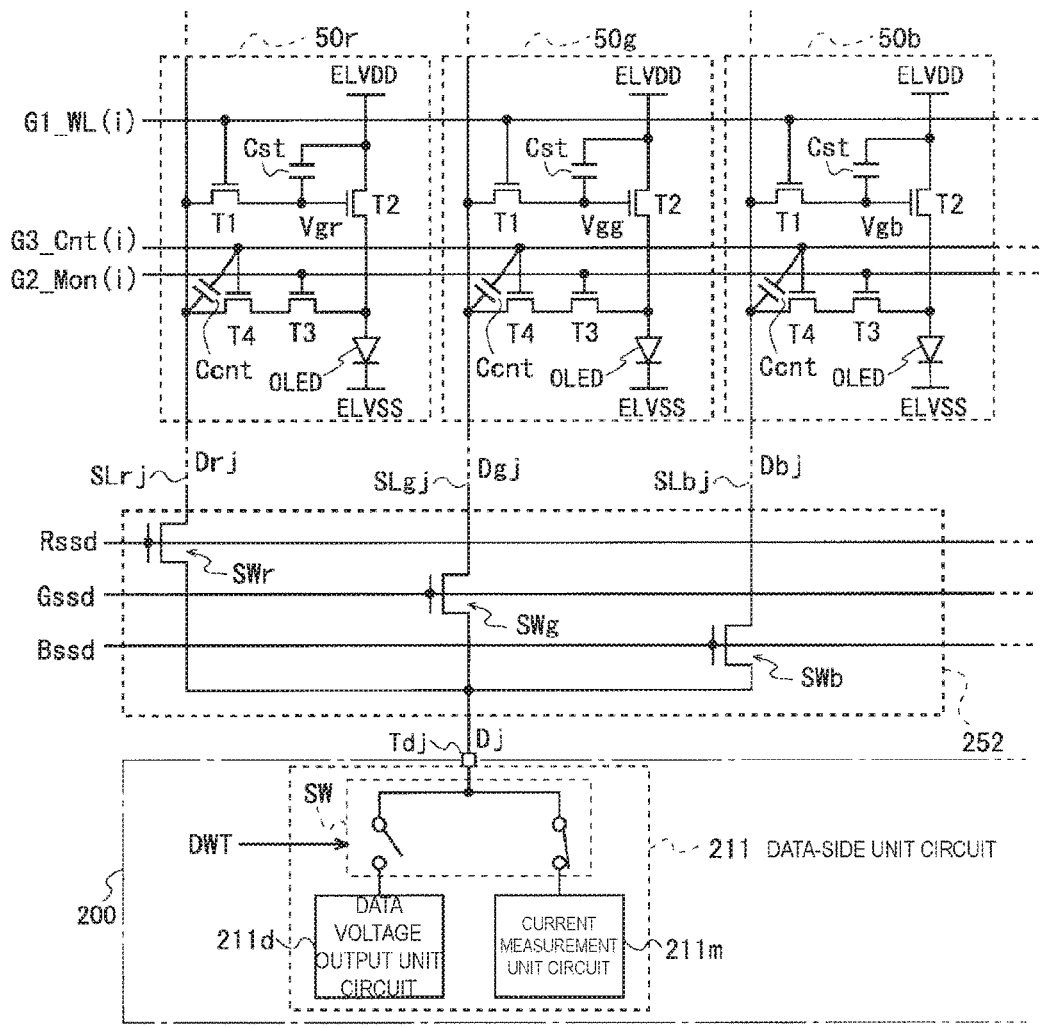
FIG. 28 is a partial circuit diagram for describing an operation for measuring the current in the pixel circuit in the first embodiment.

FIG. 27 is a timing chart illustrating a state change (change in selected state/non-selected state) of the write control line G1_WL, the monitor control line G2_Mon, and the voltage fluctuation compensation line G3_Cnt in the frame period during which characteristic compensation (current measurement) of the drive transistor in the pixel circuit 50 is performed. FIG. 28 is a partial circuit diagram for describing an operation for the current measurement in the pixel circuit 50, illustrating a configuration of a part corresponding to a drive of one set of a data line group including three data lines SLrj, SLgj, and SLbj out of the display unit 500, the demultiplex circuit 250, and the data-side drive circuit 200 in the present embodiment.

Figure 29:
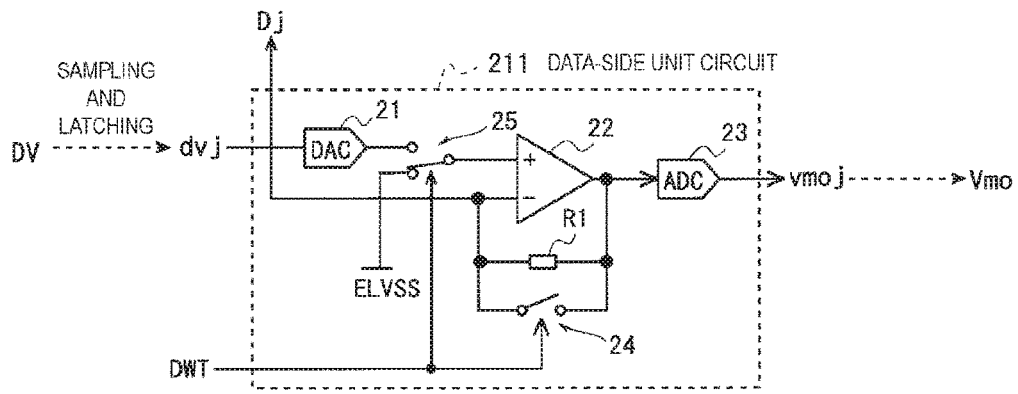
FIG. 29 is a circuit diagram illustrating a configuration in a current measurement period of the data-side unit circuit in the data-side drive circuit in the first embodiment.

FIG. 28 illustrates a connection configuration when the input and output control signal DWT is changed from the high level to the low level in the circuit illustrated in FIG. 4 (where the parasitic capacitance Cgd2, Cssdr and the like are omitted), and in the circuit illustrated in FIG. 28, the current measurement unit circuit 211*m* is connected to the demultiplexer 252. The data-side unit circuit 211 in the circuit illustrated in FIG. 28 can be configured as illustrated in FIG. 29, for example. FIG. 29 illustrates a connection configuration when the input and output control signal DWT is changed from the high level to the low level in the data-side unit circuit 211 illustrated in FIG. 5. In the data-side unit circuit 211 illustrated in FIG. 29, a first switch 24 is switched off so that an inverting input terminal and an output terminal of the Op-amp 22 are connected via a resistance element R1. Furthermore, a low-level power supply voltage ELVSS is output from a second switch 25 and applied to a non-inverting input terminal of the Op-amp 22.

In the example illustrated in FIG. 27, the write control lines G1_WL (0) to G1_WL (4) are successively selected for each horizontal interval by the operations of the aforementioned write control line drive circuit 300 and the monitor control line drive circuit 400 (FIG. 21 and FIG. 22), and the line address to be compensated Addr coincides with the write count value CntWL at the time point t2, so that the period from time point t3 to time point t4 becomes the current measurement period. A row n to be compensated in FIG. 21 and FIG. 22 is the fourth row (n=4) in the example illustrated in FIG. 27. As aforementioned, in this current measurement period t3 to t4, any of the write control lines G1_WL is in the non-selected state, and the monitor enable signal Mon_EN becomes high level. As a result, the monitor control line G2_Mon (n) goes into a selected state (see FIG. 16) and the voltage fluctuation compensation line G3_Cnt (n) is connected to its monitor control line G2_Mon (n) (see FIG. 2) such that the voltage fluctuation compensation line G3_Cnt (n) also goes into the selected state.

While the write control line G1_WL (n) is in the selected state immediately before this current measurement period t3 to t4 (in the period t2 to t3), an input transistor T1 of each pixel circuit (hereinafter, referred to as "object pixel circuit") 50 in the row n to be compensated is switched on. At this time, the input and output control signal DWT is at the low level, so that the analog video signal Dj (pre-compensation data) is written from the data voltage output unit circuit 211d in each data-side unit circuit 211 into the object pixel circuit 50 as pixel data. More specifically, the analog video signal Dj indicating the gradation voltage, which is pre-compensation data, is successively written as pixel data into the red pixel circuit 50r, the green pixel circuit 50g, and the blue pixel circuit 50b in the row n to be compensated (see FIG. 4) according to the SSD scheme based on the red pixel connection control signal Rssd, the green pixel connection control signal Gssd, and the blue pixel connection control signal Bssd.

At the time point t3, the write control line G1_WL (n) goes into a non-selected state and the current measurement period starts. In this current measurement period t3 to t4, the input transistor T1 of the object pixel circuit 50 is switched off, and a data voltage corresponding to the pre-compensation pixel data is held in the capacitor Cst of the object pixel circuit. Furthermore, at the time point t3, the input and output control signal DWT becomes low level, and the current measurement unit circuit 211m in each data-side unit circuit 211 is connected to the demultiplexer 252. Moreover, the monitor enable signal Mon_EN becomes high level, and the monitor control line G2_Mon (n) and the voltage fluctuation compensation line G3_Cnt (n) go into the selected state (high level), so that transistors T3 and T4 of the object pixel circuit 50 are switched on.

Figure 30:
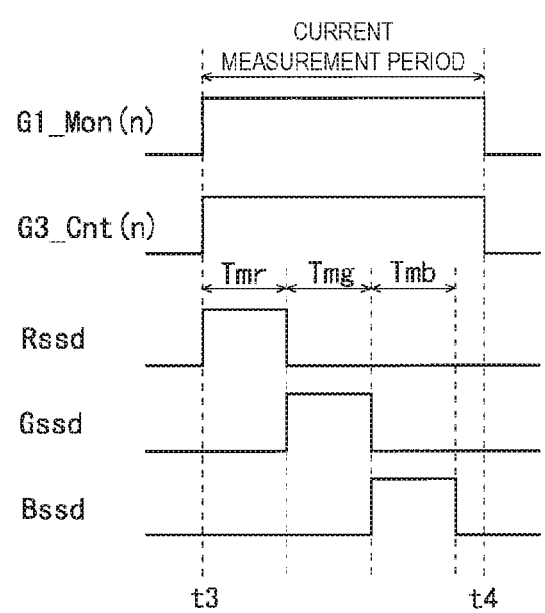
FIG. 30 is a timing chart for describing an operation for measuring the current in the pixel circuit in the first embodiment.

FIG. 30 is a timing chart for describing measurement of the drive current of the object pixel circuit 50 in the current measurement period t3 to t4. In the current measurement period t3 to t4, the write control line G1_WL (n) and the voltage fluctuation compensation line G3_Cnt (n) corresponding to the row n to be compensated are maintained at high level, and the red pixel connection control signal Rssd, the green pixel connection control signal Gssd, and the blue pixel connection control signal Bssd configuring the SSD control signal Cssd applied from the display control circuit 100 to each demultiplexer 252 are at high level (active) for each predetermined period in this current measurement period t3 to t4.

In the present embodiment, as illustrated in FIG. 30, in this current measurement period t3 to t4, firstly, the red pixel connection control signal Rssd is at high level only in a first period Tmr, then the green pixel connection control signal Gssd is at high level only in a second period Tmg, and finally, the blue pixel connection control signal Bssd is at high level only in a third period Tmb. Therefore, the first transistor SWr, the second transistor SWg, and the third transistor SWb in each demultiplexer 252 are switched on in the first period Tmr, the second period Tmg, and the third period Tmb, respectively. As a result, in the first period Tmr, the drive current of each red pixel circuit 50r in the row n to be compensated is applied to the current measurement unit circuit 211m via transistors T3 and T4 of the red pixel circuit 50r and a first transistor SWr of the corresponding demultiplexer 252 (see FIG. 28). In the second period Tmg, the drive current of each green pixel circuit 50g in the row n to be compensated is applied to the current measurement unit circuit 211m via transistors T3 and T4 of the green pixel circuit 50g and a second transistor SWg of the corresponding demultiplexer 252. In the third period Tmb, the drive current of each blue pixel circuit 50b in the row n to be compensated is applied to the current measurement unit circuit 211m via transistors T3 and T4 of the blue pixel circuit 50b and a third transistor SWb of the corresponding demultiplexer 252. Each current measurement unit circuit 211m measures the drive current of the red pixel circuit 50r, the green pixel circuit 50g, and the blue pixel circuit 50b successively applied in this manner, and successively outputs a monitor voltage vmoj indicating the measurement result (see FIG. 29).

Note that, in the first period Tmr, each red pixel data line SLrj is maintained at the low-level power supply voltage ELVSS by the current measurement unit circuit 211m (the data-side unit circuit 211 when the input and output control signal DWT is at low level) having a configuration as illustrated in FIG. 29, so that a source terminal of the drive transistor T2 in the above-mentioned red pixel circuit 50r is also maintained at the low-level power supply voltage ELVSS (see FIG. 28). Furthermore, in the second period Tmg, each green pixel data line SLgj is maintained at the low-level power supply voltage ELVSS, so that the source terminal of the drive transistor T2 in the above-mentioned green pixel circuit 50g is also maintained at the low-level power supply voltage ELVSS, and in the third period Tmb, each blue pixel data line SLbj is maintained at the low-level power supply voltage ELVSS, so that the source terminal of the drive transistor T2 in the above-mentioned blue pixel circuit 50b is also maintained at the low-level power supply voltage ELVSS. Therefore, in the above-mentioned pixel circuits 50r, 50g, and 50b in which the drive current is measured, no current flows in the organic EL element OLED.

The monitor voltage vmoj successively output from each current measurement unit circuit 211m is sent to the correction data calculation/storage unit 120 in the display control circuit 100 as a power measurement result Vmo in the current measurement circuit 220 (see FIG. 1). As aforementioned, this correction data calculation/storage unit 120 holds correction data (an offset value and a gain value), and calculates, at a time point when two current measurement results corresponding to two types of gradations (a first gradation P1 and a second gradation P2: P2>P1) for each object pixel circuit 50 are obtained, new correction data (offset value and gain value), and thereby updates the held correction data.

After the above-described current measurement, at the time point t4, in a case where the monitor control line G2_Mon (n) and the voltage fluctuation compensation line G3_Cnt (n) corresponding to the row n to be compensated become low level, the transistors T3 and T4 of each object pixel circuit 50 are switched off. Furthermore, as illustrated in FIG. 27, the clock signal CLK1 rises at the time point t4, and the write control line G1_WL (n) is selected (becomes high level) in response thereto. At this time, the input and output control signal DWT is at high level, and the data voltage output unit circuit 211d in each data-side unit circuit 211 is connected to the demultiplexer 252, whereby the analog video signal Dj (post-compensation data) is written from the demultiplexer 252 into the object pixel circuit 50 as pixel data. More specifically, the analog video signal Dj indicating the corrected gradation voltage, which is post-compensation data, is successively written as pixel data into the red pixel circuit 50r, the green pixel circuit 50g, and the blue pixel circuit 50b in the row n to be compensated (see FIG. 4) according to the SSD scheme based on the red pixel connection control signal Rssd, the green pixel connection control signal Gssd, and the blue pixel connection control signal Bssd. However, the gradation voltage of a default value (default gradation voltage) is written as the pixel data into the pixel circuit 50 in which the current measurement of only one of the above-mentioned first gradation P1 and second gradation P2 is completed.

1.13 Characteristic Detection Process

Figure 31:
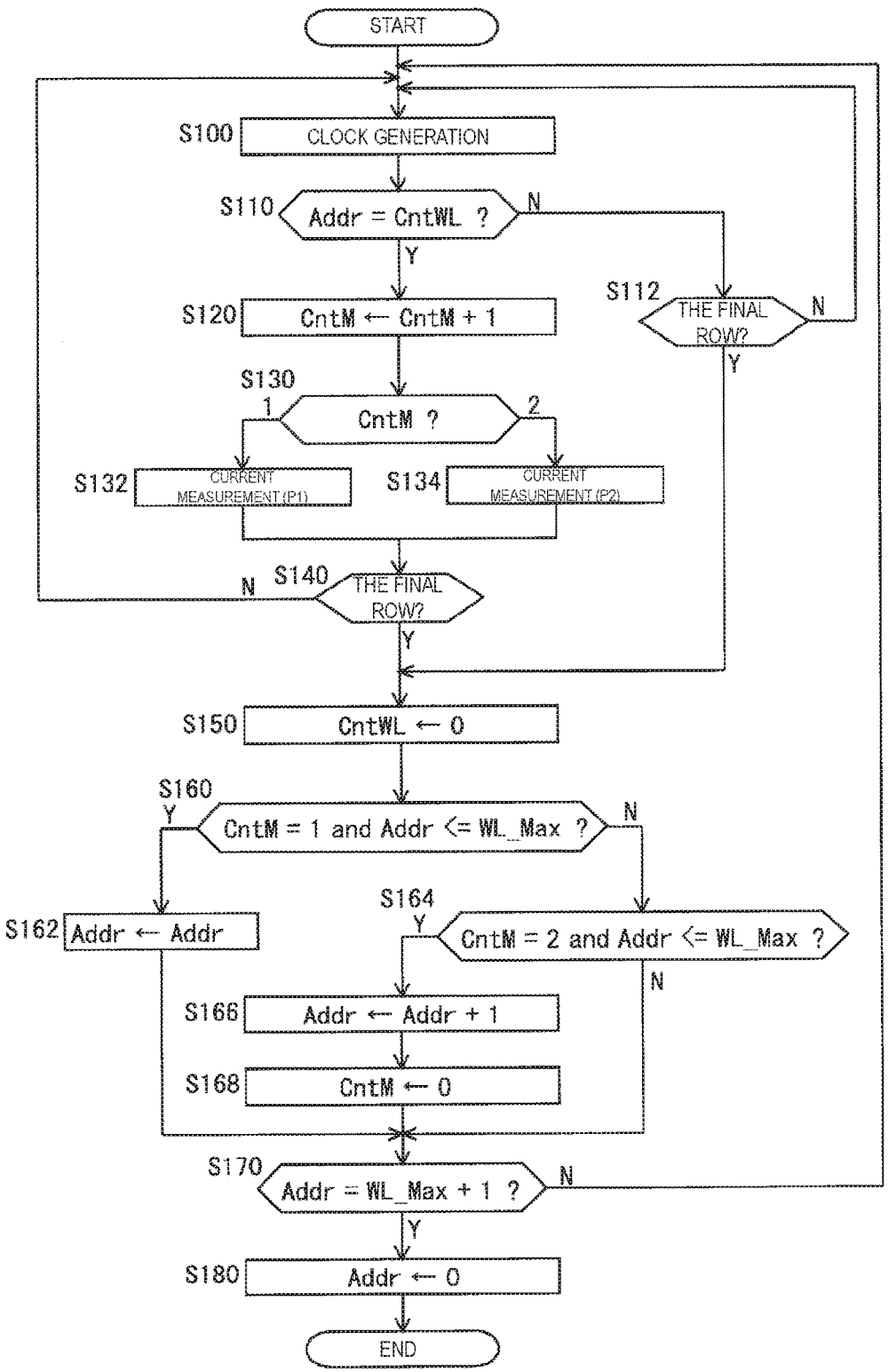
FIG. 31 is a flowchart illustrating a control procedure for a characteristic detection process (a series of processes for detecting a characteristic of a drive transistor) in the first embodiment.

Next, with reference to FIG. 31, a series of processes (hereinafter, referred to as "characteristic detection processes") executed in the present embodiment for detecting the characteristics of the drive transistor T2 of the pixel circuit 50 based on the above-mentioned current detection will be described. FIG. 31 is a flow chart illustrating a control procedure for this characteristic detection process. Note that the write line counter 111 and the matching counter 114 are initialized beforehand, and it is assumed that a value of the line address to be compensated Addr stored in the line address to be compensated storage memory 112 is a value indicating a row to be compensated.

Every time a clock pulse of the clock signal CLK1 or the clock signal CLK2 occurs after the start of the characteristic detection process, one write control line G1_WL is selected as a scan object (step S100). Then, it is determined whether a line address to be compensated Addr stored in the line address to be compensated storage memory 112 coincides with a write count value CntWL output from the write line counter 111 (step S110). As a result, in a case where they both coincide with each other, the process proceeds to step S120, and in a case where they do not coincide with each other, the process proceeds to step S112. In step S112, it is determined whether the scan object is a write control line in the final row. As a result, in a case where the scan object is a write control line of the final row, the process proceeds to step S150, and in a case where the scan object is not a write control line of the final row, the process returns to step S100. Note that, when the process proceeds to step S112, normal data writing is performed.

In step S120, 1 is added to the matching count value CntM. Thereafter, it is determined whether the matching count value CntM is 1 or 2 (step S130). As a result, in a case where the matching count value CntM is 1, the process proceeds to step S132, and in a case where the matching count value CntM is 2, the process proceeds to step S134. In step S132, the drive current based on the first gradation P1 is measured. In step S134, the drive current based on the second gradation P2 is measured.

After step S132 or step 134 end, it is determined whether the scan object is a write control line in the final row (step S140). As a result, in a case where the scan object is a write control line in the final row, the process proceeds to step S150, and in a case where the scan object is not a write control line in the final row, the process returns to step S100.

In step S150, the write count value CntWL is initialized. Thereafter, it is determined whether a condition in which "the matching count value CntM is 1, and a value of the line address to be compensated Addr is equal to or less than the value WL_Max indicating the final row" is satisfied (step S160). As a result, in a case where the condition is satisfied, the process proceeds to step S162, and in a case where the condition is not satisfied, the process proceeds to step S164.

In step S162, the same value is substituted to the line address to be compensated Addr in the line address to be compensated storage memory 112. Note that, this step S162 need not necessarily be provided. In step S164, it is determined whether a condition in which "the matching count value CntM is 2 and the value of the line address to be compensated Addr is equal to or less than the value WL_Max indicating the final row" is satisfied. As a result, in a case where the condition is satisfied, the process proceeds to step S166, and in a case where the condition is not satisfied, the process proceeds to step S170. In step S166, 1 is added to the line address to be compensated Addr. In step S168, the matching count value CntM is initialized.

In step S170, it is determined whether a condition in which "the value of the line address to be compensated Addr is equal to the value that can be obtained by adding 1 to the value WL_Max indicating the final row" is satisfied. As a result, in a case where the condition is satisfied, the process proceeds to step S180, and in a case where the condition is not satisfied, the process returns to S100. In step S180, the line address to be compensated Addr is initialized. As described above, one characteristic detection process for all the drive transistors in the display unit 500 ends.

1.14 Compensation Process

Figure 32:
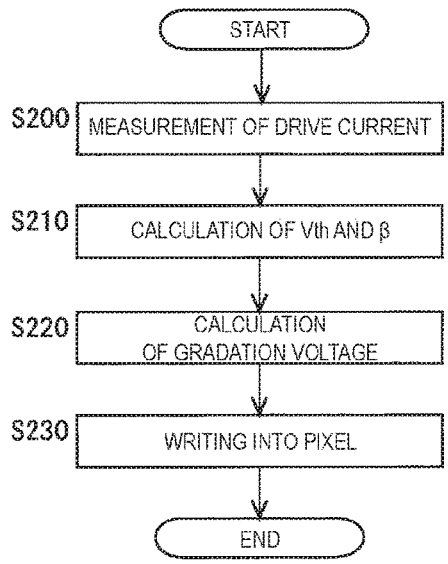
FIG. 32 is a flowchart for describing a procedure of a compensation process (a series of processes for compensating a variation of the characteristic of the drive transistor) when one pixel (pixel at an ith row line and a jth column line) is focused in the first embodiment.

Next, with reference to FIG. 32, a series of processes (hereinafter, referred to as "compensation process") executed in the present embodiment to compensate for variations in characteristics of the drive transistor T2 of the pixel circuit 50 will be described. FIG. 32 is a flow chart for describing a procedure of the compensation process when focusing on one pixel (a pixel of i row and j column).

First, as described above, the drive current is measured in the characteristic detection process period (step S200). The drive current is measured based on two types of gradations (the first gradation P1 and the second gradation P2: P2>P1). In the present embodiment, in two consecutive frames, the drive current based on the first gradation P1 is measured in the first frame, and the drive current based on the second gradation P2 is measured in the second frame. More specifically, in the first frame, the drive current obtained by writing a first measurement gradation voltage Vmp1 calculated by Equation (1) below as pixel data into the pixel circuit 50 is measured, and in the second frame, the drive current obtained by writing a second measurement gradation voltage Vmp2 calculated by Equation (2) below as pixel data into the pixel circuit 50, is measured.

$$Vmp1 = Vcw \times Vn(P1) \times B(i,j) + Vth(i,j) \qquad (1)$$

$$Vmp2 = Vcw \times Vn(P2) \times B(i,j) + Vth(i,j) \qquad (2)$$

Here, Vcw is the difference between the gradation voltage corresponding to the minimum gradation and the gradation voltage corresponding to the maximum gradation (that is, the range of the gradation voltage). Vn (P1) is a value in which the first gradation P1 is normalized to a value in the range of 0 to 1, and Vn (P2) is a value in which the second gradation P2 is normalized to a value in the range of 0 to 1. B (i, j) is a normalization coefficient for the pixel of row i and column j calculated by Equation (3) below. Vth (i, j) is an offset value (this offset value corresponds to the threshold voltage of the drive transistor) for the pixel of row i and column j.

$$B = \sqrt{(\beta 0 / \beta)} \qquad (3)$$

Here, β0 is a mean value of the gain values of all pixels, and β is a gain value for the pixel of row i and column j.

After measuring the drive current based on the two types of gradations, an offset value Vth and a gain value β are calculated based on the measurement value (step S210). The process in this step S210 is performed in the correction calculation circuit 122 (see FIG. 10) in the correction data calculation/storage unit 120. When the offset value Vth and the gain value β are calculated, Equation (4) below indicating the relationship between a current (drive current) Ids between a drain and a source and a voltage Vgs between a gate and the source of the transistor is used.

$$Ids = \beta \times (Vgs - Vth)^2 \qquad (4)$$

Specifically, the offset value Vth indicated in Equation (5) below and the gain value β indicated in Equation (6) below are obtained from the simultaneous equations of an equation in which the measurement result based on the first gradation P1 is substituted to the above-mentioned Equation (4) and an equation in which the measurement result based on the second gradation P2 is substituted to the above-mentioned Equation (4).

$$Vth=\{Vgsp2\sqrt{(IOp1)}-Vgsp1\sqrt{(IOp2)}\}/\{\sqrt{(IOp1)}-\sqrt{(IOp2)}\} \quad (5)$$

$$\beta=\{\sqrt{(IOp1)}-\sqrt{(IOp2)}\}^2/(Vgsp1-Vgsp2)^2 \quad (6)$$

Here, IOp1 is the drive current as the measurement result based on the first gradation P1, and IOp2 is the drive current as the measurement result based on the second gradation P2. Furthermore, Vgsp1 is a voltage between the gate and the source based on the first gradation P1, and Vgsp2 is a voltage between the gate and the source based on the second gradation P2. As aforementioned, in the present embodiment, the source terminal of the drive transistor T2 in the pixel circuit 50 in which the drive current is measured is maintained at the low-level power supply voltage ELVSS (see FIG. 28 and FIG. 29). Hereinafter, this low-level power supply voltage ELVSS is described as "0". In this case, Vgsp1 can be obtained by Equation (7) below, and Vgsp2 can be obtained by Equation (8) below.

$$Vgsp1=Vmp1 \quad (7)$$

$$Vgsp2=Vmp2 \quad (8)$$

The offset value Vth and the gain value β calculated as described above are used to update the correction data held in the non-volatile memory 123 (see FIG. 10) in the correction data calculation/storage unit 120. Note that the data of the measurement value obtained in step S200 is temporarily stored in a memory which allows high-speed access such as an SRAM (static random access memory) or a DRAM (dynamic random access memory).

Next, when writing the pixel data into the pixel circuit 50 of row i and column j, the offset value Vth and the gain value β are used to calculate the gradation voltage Vp by Equation (9) below (step S220). The process in this step S220 is performed by the gradation correction unit 130 (see FIG. 1).

$$Vp=Vcw \times Vn(P) \times \sqrt{(\beta0/\beta)}+Vth+Vf \quad (9)$$

Here, Vn (P) is a value in which the display gradation in the pixel of row i and column j is normalized to a value in the range of 0 to 1. Vf is a forward voltage of the organic EL element OLED, which is assumed as a known fixed value in the present embodiment.

Thereafter, the gradation voltage Vp calculated in step S220 is written as pixel data into the pixel circuit 50 of row i and column j (step S230). The compensation process as described above is performed on all pixels to compensate variations in characteristics of the drive transistor.

Figure 33:
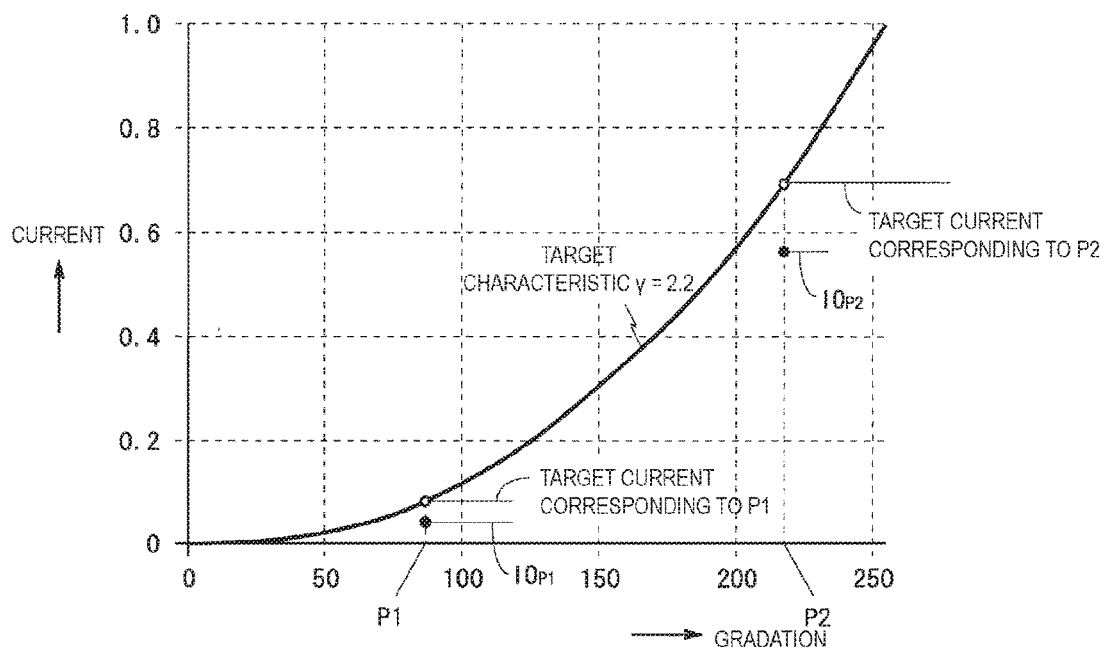
FIG. 33 is a diagram illustrating a gradation—current characteristic in the first embodiment.

FIG. 33 is a diagram illustrating a gradation—current characteristic. In FIG. 33, a characteristic of γ=2.2 is illustrated as a target characteristic. When deterioration occurs in the drive transistor, the drive current IOp1 obtained when the pixel data based on the first gradation P1 is written does not coincide with the target current corresponding to the first gradation P1, and the drive current IOp2 obtained when the pixel data based on the second gradation P2 is written does not coincide with the target current corresponding to the second gradation P2. However, in the present embodiment, for each pixel circuit 50, the offset value Vth and the gain value β are calculated by the above-mentioned method based on the above-mentioned drive currents IOp1 and IOp2. Then, each gradation voltage indicated by a data signal DA based on an external RGB video data signal Din is corrected by using the offset value Vth and the gain value β calculated for each pixel circuit 50 into which the gradation voltage to be written, and the corrected gradation voltage is written as the pixel data into the pixel circuit 50. Consequently, in any of the pixel circuits 50, a drive current approximately equal to the target current flows with respect to an arbitrary gradation voltage indicated by the data signal DA as a gradation voltage to be written into the pixel circuit 50. As a result, occurrence of unevenness in luminance in the display screen is suppressed, and high image quality display is performed.

1.15 Operation and Effect 1.15.1 Operation and Effect in Writing Pixel Data

As described above, according to the present embodiment, in an operation of writing pixel data into each pixel circuit 50x (x=r, g, b), a field through voltage ΔVx1 (and a decrease in the selected pixel gate voltage Vgx caused thereby) generated by a transistor SWx changing from an on state to an off state in the demultiplexer 252 for the SSD scheme is canceled out or compensated by the potential change of a voltage fluctuation compensation line G3_Cnt (i) connected to the pixel circuit 50x (hereinafter, this action is referred to as "field through compensation action") (see FIG. 24). Hereinafter, with reference to FIG. 4 and FIG. 24, the field through compensation action in the present embodiment will be described in detail by focusing on writing pixel data into the red pixel circuit 50r.

(1) Operation in Period Ta to Tb

In the period ta to tb from the time point ta to the time point tb illustrated in FIG. 24, in the red pixel circuit 50r connected to a write control line G1_WL (i) in the selected state, that is, in the selected red pixel circuit 50r the input transistor T1 is switched on, and the red pixel connection control signal Rssd is at high level, such that the first transistor SWr of the demultiplexer 252 is switched on. Consequently, the analog video signal Dj from the data-side drive circuit 200 is applied as the red pixel data signal Drj to the gate terminal of the drive transistor T2 via the first transistor SWr, the red pixel data line SLrj, and the input transistor T1, and the capacitor Cst is charged.

(2) Operation in Period Tb to Te

At the time point tb, the red pixel connection control signal Rssd changes to a low level and the first transistor SWr of the demultiplexer 252 changes to an off state. At this time, the voltage change (from the high level to the low level) of the red pixel connection control signal Rssd affects the voltage Vr1 of the red pixel data line SLrj via the parasitic capacitance Cssdr between the gate and the drain in the first transistor SWr (field through phenomenon), and the voltage Vr1 decreases by ΔVr1. The input transistor T1 of the selected red pixel circuit 50r is switched on while the write control line G1_WL (i) is in the selected state, so that the voltage (selected red pixel gate voltage) Vgr of the gate terminal of the drive transistor T2 of the selected red pixel circuit 50r also decreases by ΔVr1 due to the field through phenomenon. That is, the selected red pixel gate voltage Vgr decreases, in the period ta to tb, from the voltage (hereinafter, referred to as "red pixel data voltage") VRdata of the analog video signal Dj applied from (the data voltage output unit circuit 211d of) the data-side drive circuit 200 to the demultiplexer 252, whereby $$Vgr=VRdata-\Delta Vr1 \quad (10)$$

is obtained. Here, assuming that a value of the parasitic capacitance between the gate and the drain in the first transistor SWr of the demultiplexer 252 is also indicated by "Cssdr", and an amplitude (difference between an on voltage and an off voltage) of the red pixel connection control signal Rssd is indicated by "Vssd", the first field through voltage $\Delta Vr1$, which is a decrease amount of the selected red pixel gate voltage Vgr, is represented by the following equation.

$$\Delta Vr1 = Vssd \times Cssdr/Ctot1 \quad (11)$$

Here, Ctot1 is a total sum of the capacitance parasitic to the drain side of the first transistor SWr, and is equal to the data line capacitance Csl which is the total sum of the capacitance parasitic to the red pixel data line SLrj.

(3) Operation in Period Te to Tf

At the time point te, the voltage fluctuation compensation line G3_Cnt (i) changes to the selected state. The voltage change of the voltage fluctuation compensation line G3_Cnt (i) at this time, that is, the change to the counter voltage VCNT from the low level to the high level is transmitted through the capacitor Ccnt as the voltage fluctuation compensation capacity, and works to raise the data line voltage Vr1 and the selected red pixel gate voltage Vgr. Assuming that a voltage change amount of the voltage fluctuation compensation line G3_Cnt (i) at this time is indicated by "VCNT", that is, assuming that a voltage amplitude of the voltage fluctuation compensation line G3_Cnt (i) is "VCNT" and the low level is "0", a raised amount (hereinafter, referred to as "compensation voltage") $\Delta Vr3$ of the selected red pixel gate voltage Vgr at the time point te, is obtained by $$\Delta Vr3 = VCNT \times Ccnt/Ctot1 \quad (12).$$

(4) Operation after Time Point Tf

At the time point tf, the write control line G1_WL (i) connected to the selected red pixel circuit 50r changes to a non-selected state. At this time, the voltage change of this write control line G1_WL (i) from the high level to the low level affects the selected red pixel gate voltage Vgr via a parasitic capacitance Cgd2 between the gate and the drain in the input transistor T1, thereby decreasing this selected red pixel gate voltage Vgr. Assuming that the second field through voltage, which is a decrease amount of the selected red pixel gate voltage Vgr at this time, is indicated by "$\Delta Vr2$", the selected red pixel gate voltage Vgr at the time point tf is obtained by $$Vgr = VR\text{data} - \Delta Vr1 + \Delta Vr3 - \Delta Vr2 \quad (13).$$

Assuming that a second field through voltage $\Delta Vr2$ included in the above-mentioned equation indicates the voltage amplitude (the difference between the voltage at the low level indicating the non-selected state and the voltage at the high level indicating the selected state) of the write control line G1_WL (i), by "VG1", $$\Delta Vr2 = VG1 \times Cgd2/Ctot2 \quad (14)$$

is obtained. Here, Cgd2 is the parasitic capacitance between the gate and the drain in the input transistor T1, and Ctot2 is a total sum of the capacitance parasitic at the node including the gate terminal of the drive transistor T2 of the selected red pixel circuit 50r.

In a case where the above-mentioned Equations (11), (12), and (14) are substituted into the above-mentioned Equation (13), the selected red pixel gate voltage Vgr is obtained by $$Vgr = VR\text{data} - Vssd \times Cssdr/Ctot1 + VCNT \times Ccnt/Ctot1 - VG1 \times Cgd2/Ctot2 \quad (15).$$

Here, assuming that the amplitude Vssd of the connection control signal Rssd, the voltage amplitude VG1 of the write control line G1_WL (i), and the voltage amplitude VCNT of the voltage fluctuation compensation line G3_Cnt (i) are equal to each other and indicated by "Vpp", the selected red pixel gate voltage Vgr is obtained by $$Vgr = VR\text{data} - Vpp\{(Cssdr - Ccnt)/Ctot1 + Cgd2/Ctot2\} \quad (16).$$

On the other hand, assuming that the transistor T4 for the voltage fluctuation compensation is not provided in each pixel circuit 50, each pixel circuit 50 has a configuration (Ccnt=0) as illustrated in FIG. 25, and the selected red pixel gate voltage Vgr thereof is obtained by $$Vgr = VR\text{data} - Vpp(Cssdr/Ctot1 + Cgd2/Ctot2) \quad (17).$$

In this case, the decrease in voltage is large due to the parasitic capacitance Cssdr of the first transistor SWr of the demultiplexer 252 and the parasitic capacitance Cgd2 of the input transistor T1 of the pixel circuit 50 for the SSD scheme.

As can be seen from comparison between the Equations (16) and (17), according to the present embodiment, a decrease in the selected red pixel gate voltage Vgr caused by the parasitic capacitance Cssdr in the circuit for the SSD scheme can be reduced. As is apparent from the above-mentioned description, such a field through compensation action can be similarly obtained not only when writing pixel data into the red pixel circuit 50r, but also when writing pixel data into the green pixel circuit 50g and the blue pixel circuit 50b. Therefore, according to the present embodiment, an image represented by (an RGB video data signal Din in) an externally applied input signal Sin can be sufficiently and favorably displayed. Furthermore, in a case where the voltage (such as the selected red pixel gate voltage Vgr) of the pixel data in each pixel circuit 50 decreases due to the field through phenomenon, it is conceivable that the output signal of the data line drive circuit 210, that is, the voltage of the analog video signal Dj, may be adjusted to be higher beforehand so that this decrease in voltage is compensated. On the other hand, according to the present embodiment, the adjustment thereof can be eliminated or the amount of adjustment can be reduced, so that, in this respect, the power consumption can be sufficiently reduced compared to that in the related art.

Next, the above-mentioned effect of the present embodiment, that is, the effect in writing pixel data, will be described by using specific numerical values. However, the following numerical values and the specifications of an organic EL panel being a display panel are merely examples, and the present invention is not limited thereto.

Hereinafter, the following numerical conditions are assumed.

(a) The resolution of the display panel is WVGA (800×480×RGB).

(b) Both the values of the parasitic capacitance Cgd2 between the gate and the drain and the parasitic capacitance Cgd2 between the gate and the source of the input transistor T1 in the pixel circuit 50 are 10 [a.u.]. Here, a unit [a.u.] is an arbitrary unit (a unit for indicating the physical quantity as a relative value with respect to a predetermined reference value). The same applies hereinafter.

(c) The value of the parasitic capacitance Cssdr of the first transistor SWr in the demultiplexer 252 is 20 [a.u.]. That is, it is assumed that the size (more precisely, the channel width) of the transistor SWr for the SSD is double the size (channel width) of the transistor T1 and T2 in the pixel circuit 50.

(d) The amplitude Vssd of the connection control signal, the voltage amplitude VG1 of the write control line G1_WL (i), and the voltage amplitude VCNT of the voltage fluctuation compensation line G3_Cnt (i) for the SSD are each 12 [a.u.] (Vpp=Vssd=VG1=VCNT=12 [a.u.]).

The above-mentioned equation (16) indicates the selected red pixel gate voltage Vgr which determines a drive current IoelR in the selected red pixel circuit 50r in the present embodiment (see FIG. 4), and the above-mentioned equation (17) indicates the selected red pixel gate voltage Vgr which determines the drive current IoelR in the conventional selected red pixel circuit 50r (see FIG. 25). Among them, the compensation voltage ΔVr3=Vpp×(Ccnt/Ctot1)=VCNT×(Ccnt/Ctot1) included in Equation (16) represents an amount of increase in voltage by the voltage fluctuation compensation line G3_Cnt (i), and the first field through voltage ΔVr1=Vpp×Cssdr/Ctot1=Vssd×Cssdr/Ctot1 included in Equations (16) and (17) represents an amount of decrease in voltage caused by the parasitic capacitance Cssdr in the circuit for the SSD scheme. The values of the compensation voltage ΔVr3 as the amount of increase in voltage and the first field through voltage ΔVr1 as the amount of decrease in voltage are obtained as follows by the above-mentioned (a) to (d). That is, the total sum of the capacitance parasitic to the drain side of the first transistor SWr, that is, the total sum Ctot1 of the capacitance parasitic to the red pixel data line SLrj (hereinafter, also referred to as "red pixel data line total capacitance") can be represented approximately as follows by using a capacitance Cgs2 between the gate and the source, the voltage fluctuation compensation capacity Ccnt and the like, in the input transistor T1 of each red pixel circuit 50r.

$$Ctot1 = (Cgs2 + Ccnt) \times 800 \text{ (number of vertical pixels)} + Cssdr \quad (18)$$

$$= (10 + 10) \times 800 + 20$$

$$= 16020 \text{ [a.u.]}$$

Therefore, the compensation voltage ΔVr3 for the amount of increase in voltage is obtained by $$\Delta Vr3 = VCNT \times (Ccnt / Ctot1) \quad (19)$$

$$= 12 \times (10 / 16020)$$

$$= 0.007 \text{ [a.u.]},$$

and the first field through voltage ΔVr1 for the amount of decrease in voltage is obtained by $$\Delta Vr1 = Vssd \times Cssdr / Ctot1 \quad (20)$$

$$= 12 \times 20 / 16020$$

$$= 0.015 \text{ [a.u.]}.$$

Therefore, in the examples based on the above-mentioned numerical conditions (a) to (d), approximately 50% of the amount of decrease in voltage (Equation (20)) of the pixel data by the field through phenomenon in the circuit for the SSD is canceled out by the field through compensation action based on the voltage change in a voltage fluctuation compensation line G3_Cnt (i).

1.15.2 Operation and Effect in Measuring Drive Current of Pixel Circuit

As aforementioned, in the present embodiment, in order to suppress the luminance unevenness to compensate the characteristics (the offset value Vth and the gain value β) of the drive transistor T2 of each pixel circuit 50, the drive current in each pixel circuit 50 is measured (see FIG. 28 to FIG. 30). As the drive current per one pixel circuit is very small (on the order of μA to pA) a leakage current in the pixel circuit (hereinafter, referred to as "non-selected pixel circuit") 50 connected to the monitor control line G2_Mon (k) (k≠i) in the non-selected state can be an obstacle in the current measurement for the high precision characteristic compensation.

On the other hand, in each pixel circuit 50 in the present embodiment, the transistor T4 in which the gate terminal is connected to the voltage fluctuation compensation line G3_Cnt is provided in series with the transistor T3 in which the gate terminal is connected to the monitor control line G2_Mon for the current measurement (FIG. 28). The source terminal (the connection point between the transistor T2 and the organic EL element OLED) of the drive transistor T2 is connected to the data line SL via these transistors T3 and T4. According to the double gate configuration by such transistors T3 and T4, even when a short circuit fault occurs in the transistor T3 in any non-selected pixel circuit 50, or even when leakage current which cannot be ignored in the configuration in the related art occurs due to the defect of the transistor T3, the transistor T4 is connected in series with the transistor T3, so that the short circuit fault of the transistor T3 or the leakage current due to the defect does not flow into the data line SL. Therefore, the transistor T4 functions as a so-called "backup transistor" of the transistor T3. Furthermore, the double gate configuration by the transistors T3 and T4 also reduces the leakage current when the transistor T3 is normal in the non-selected pixel circuit 50, thereby contributing to the high-precision current measurement.

According to the above-described present embodiment, in the current measurement period, the leakage current from the non-selected pixel circuit 50 to the data line SL is prevented from flowing in, which enables high-precision current measurement, so that it is possible to sufficiently suppress luminance unevenness. Note that, the pixel circuit having the double gate configuration by such transistors T3 and T4 is effective not only when a TFT in which a channel layer is formed of an oxide semiconductor such as InGaZnO is used, but also when a TFT in which a channel layer is formed of polysilicon or amorphous silicon (a-Si) and an off-leak current is relatively large is used.

2. Second Embodiment

Next, an active-matrix organic EL display device according to a second embodiment of the present invention will be described. In the present embodiment, the configuration of the voltage fluctuation compensation line drive circuit is different from that in the first embodiment, and a pull down signal CPD used in the first embodiment as a control signal of the voltage fluctuation compensation line drive circuit is not used; however, the other configurations are similar to those in the first embodiment. Therefore, in the configuration of T3 the present embodiment, identical or corresponding parts to those in the first embodiment are followed by the identical reference signs, and the detailed description thereof is omitted. Note that, an operation of the present embodiment in a frame period including a current measurement period is similar to that in the first embodiment, and hence, hereinafter, the present embodiment will be described on the premise of an operation in a frame period not including a current measurement period.

In the first embodiment, a voltage fluctuation compensation control signal CCTL generated by the gate control signal generation circuit 117 (FIG. 1 and FIG. 6) in the drive control unit 110 in the display control circuit 100 includes a pull down signal CPD (FIG. 20); however, in the present embodiment, a voltage fluctuation compensation control signal CCTL does not include a pull down signal CPD. The configuration of the display control circuit 100 in the present embodiment is similar to that of the display control circuit 100 in the first embodiment except that this pull down signal CPD is not generated therein.

Figure 34:
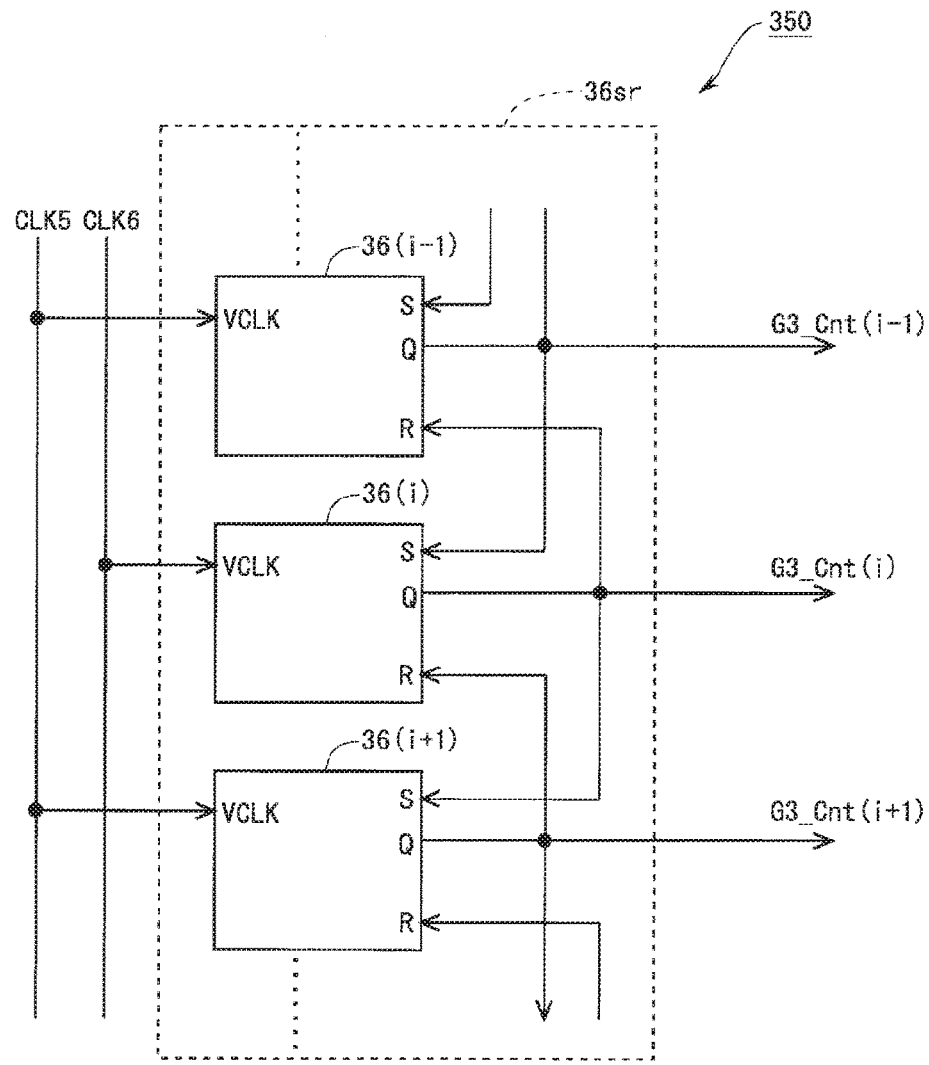
FIG. 34 is a block diagram illustrating a configuration of a voltage fluctuation compensation line drive circuit in an organic EL display device according to a second embodiment of the present invention.

FIG. 34 is a block diagram illustrating a configuration of the voltage fluctuation compensation line drive circuit 350 in the present embodiment. This voltage fluctuation compensation line drive circuit 350 is realized by using a shift register 36sr. Each stage of the shift register 36sr is arranged to correspond one-to-one with each voltage fluctuation compensation line G3_Cnt in the display unit 500. Also in the present embodiment, the shift resistor 36sr includes 1080 stages; however, in FIG. 34, only unit circuits 36 (i−1) to 36 (i+1) including from the (i−1)th stage to the (i+1)th stage out of 1080 stages are illustrated. In each stage (each unit circuit) of the shift resistor 36sr, an input terminal for receiving a clock signal VCLK, an input terminal for receiving a set signal S, an input terminal for receiving a reset signal R, and an output terminal for outputting a state signal Q are provided; however, unlike the shift resistor 35sr (FIG. 18) in the first embodiment, neither the input terminal for receiving a clear signal CLR nor the output terminal for outputting an output signal Q2 is provided therein.

As illustrated in FIG. 34, signals applied to the input terminals of each stage (each unit circuit) of the shift register 36sr are configured as follows. In the odd-numbered stages, a clock signal CLK5 is applied as a clock signal VCLK, and in the even-numbered stages, a clock signal CLK6 is applied as a clock signal VCLK (see FIG. 34). Furthermore, for any stage, a state signal Q output from a previous stage is applied as a set signal S, and a state signal Q output from a next stage is applied as a reset signal R. However, in the first stage (not illustrated in FIG. 34), a start pulse signal CSP is applied as a set signal S. Note that the low-level power supply voltage VSS and the counter voltage VCNT (not illustrated in FIG. 34) are commonly applied to all unit circuits 36. The state signal Q output from each stage of the shift resistor 36sr is output to the corresponding voltage fluctuation compensation line G3_Cnt.

Figure 35:
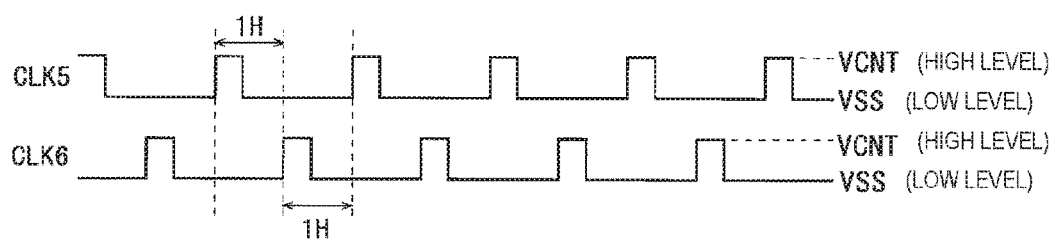
FIG. 35 is a signal waveform chart of the clock signal CLK5 and the clock signal CLK6 during the normal operation period in the second embodiment.

As illustrated in FIG. 35, in the present embodiment, in the clock signals CLK5 and CLK6 supplied to the shift resistor 36sr included in the voltage fluctuation compensation line drive circuit 350, in order to change the voltage of the voltage fluctuation compensation line G3_Cnt from a high level to a low level at a timing described later, a falling timing is different from that of the clock signals CLK5 and CLK6 (FIG. 19) in the first embodiment, and a duty ratio (a ratio of the high-level period in the clock cycle) is 1/6, or a value slightly smaller than 1/6. Furthermore, as illustrated in FIG. 35, the high levels of the clock signals CLK5 and CLK6 in the present embodiment are the counter voltage VCNT. Note that, also in the present embodiment, similar to the first embodiment, in the frame period including the current measurement period, all the output signals of the voltage fluctuation compensation line drive circuit 350 go into a high impedance state at low level, and hence, in the frame period, the clock signals CLK5 and CLK6 are maintained at low level, unlike the waveform illustrated in FIG. 35.

Figure 36:
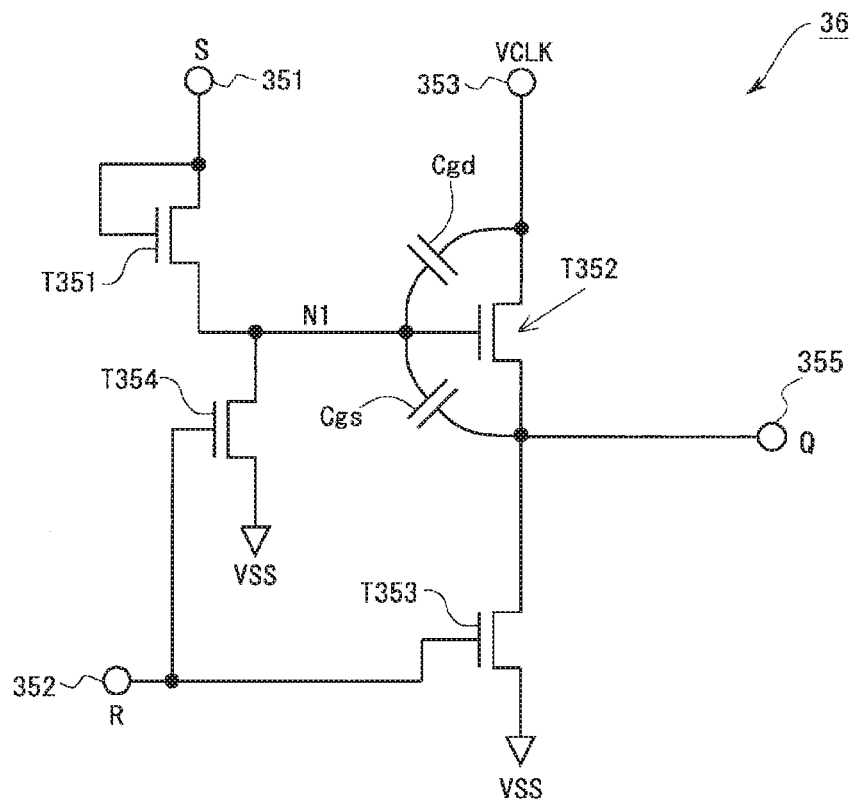
FIG. 36 is a circuit diagram illustrating a configuration of a unit circuit of a shift register constituting a voltage fluctuation compensation line drive circuit in the second embodiment.

FIG. 36 is a circuit diagram illustrating a configuration of the unit circuit 36 of the shift resistor 36sr (configuration of one stage of the shift resistor 36sr) included in the voltage fluctuation compensation line drive circuit 350 in the present embodiment. As compared with the unit circuit 35 (FIG. 20) of the shift resistor 35sr included in the voltage fluctuation compensation line drive circuit 350 in the first embodiment, this unit circuit 36 does not have transistors T355 and T356, an input terminal 354, 357, or an output terminal 355, however, the other configurations are identical to those in the unit circuit 35 (FIG. 20), and identical or corresponding parts are followed by identical reference signs. Furthermore, as can be seen by comparing FIG. 34 and FIG. 36 with FIG. 11 and FIG. 12, the shift resistor 36sr and unit circuit 36 thereof have a configuration similar to the unit circuit 30 of the shift resistor 3 included in the write control line drive circuit 300. Therefore, the voltage fluctuation compensation line drive circuit 350 in the present embodiment basically operates similarly to the write control line drive circuit 300. However, as the timing and voltage level of the clock signal to be input are different between them, (see FIG. 8 and FIG. 35) the timing and the voltage level of the output signal also differ between them in accordance therewith. That is, in the present embodiment, as the clock signals CLK5 and CLK6 having the waveforms illustrated in FIG. 35 are applied to the shift resistor 36sr, the unit circuit 36 operates as illustrated in a signal waveform chart in FIG. 37, unlike the operation (FIG. 13) of the unit circuit 30 of the shift resistor 3 in the first embodiment. As described above, the duty ratio of the clock signals CLK5 and CLK6 in the present embodiment is 1/6 or a value slightly smaller than 1/6, so that a pulse width of the state signal Q output from the output terminal 355 of the unit circuit 36 has a length of approximately 1/3 of one horizontal interval, more specifically, a length of 1/3 or slightly shorter than 1/3 (see FIG. 37).

Figure 37:
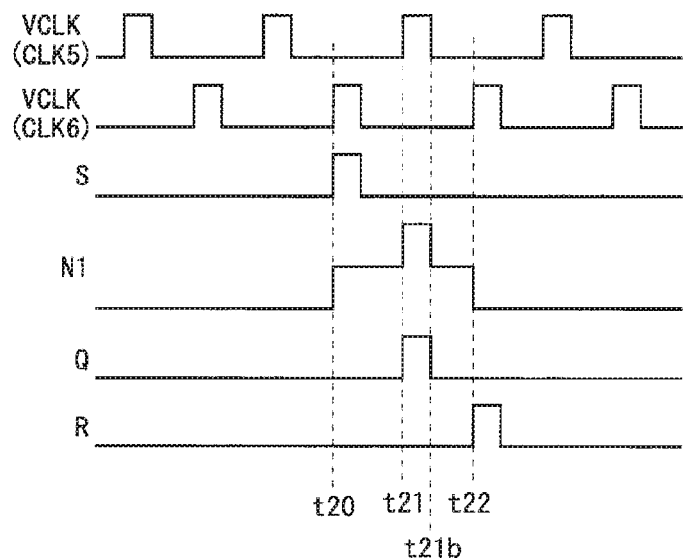
FIG. 37 is a timing chart for describing a basic operation of the unit circuit of the shift register constituting the voltage compensation line drive circuit in the second embodiment.
Figure 38:
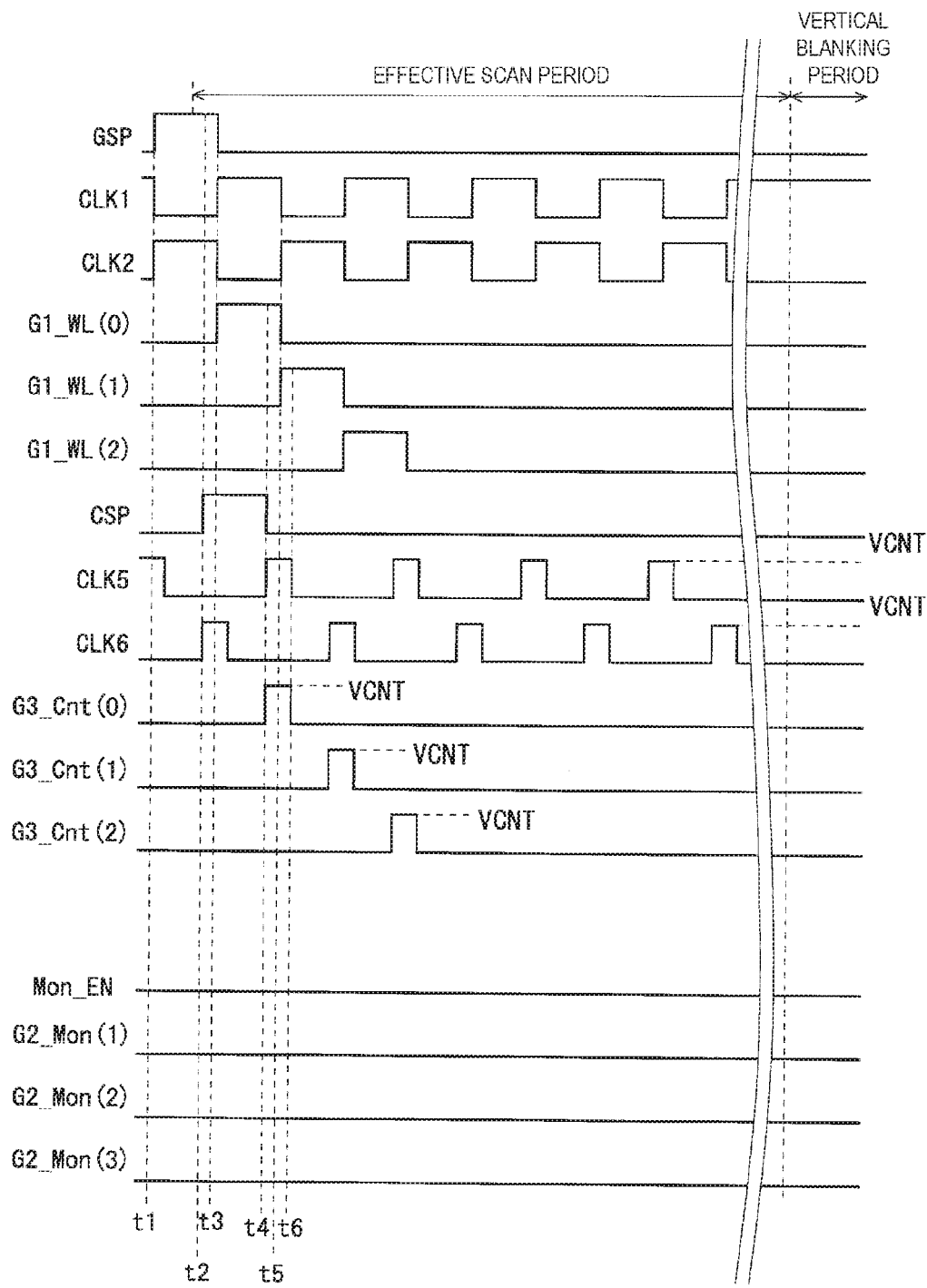
FIG. 38 is a timing chart for describing an operation of the voltage fluctuation compensation line drive circuit in the second embodiment.

In the present embodiment, the voltage fluctuation compensation line drive circuit 350 is configured as illustrated in FIG. 34 and FIG. 36, and the unit circuit 36 operates as illustrated in FIG. 37, based on the clock signals CLK5 and CLK6 illustrated in FIG. 35, thereby 1080 output signals which become successively high level (the voltage VCNT) for each interval with a length of approximately 1/3 of one horizontal interval (hereinafter, referred to as "approximately 1/3 horizontal interval") are applied to the voltage fluctuation compensation lines G3_Cnt (0) to G3_Cnt (1079), respectively. As a result, the voltage fluctuation compensation lines G3_Cnt (0) to G3_Cnt (1079) are successively selected for each approximately 1/3 horizontal interval at a timing as illustrated in FIG. 38. That is, at a time point slightly before the time point at which the ith row of the write control line G1_WL (i) is selected, the selected state (high level) is maintained in one horizontal interval, and then the write control line G1_WL (i) goes into the non-selected state (low level), the corresponding voltage fluctuation compensation line G3_Cnt (i) changes from a low level to a high level (voltage VCNT), and returns to the low level approximately 1/3 horizontal interval after the time point (i=0 to 1079). In the example illustrated in FIG. 38, for example, the 0th row of the write control line G1_WL (0) goes into a selected state (high level) at a time point t3, and then goes into a non-selected state (low level) at a time point t5, and the voltage of the voltage fluctuation compensation line G3_Cnt (0) corresponding thereto changes from the low level to the high level (VCNT) at a time point t4 slightly before the time point t5, and returns to the low level at a time point t6 being approximately 1/3 horizontal interval after the time point t4. As such, in the present embodiment, the voltage of each voltage fluctuation compensation line G3_Cnt (i) returns to low level approximately 1/3 horizontal interval after changing from a low level to a high level, and hence, the pull down signal CPD (FIG. 23) used in the first embodiment is unnecessary.

Note that, FIG. 38 illustrates an operation in a frame period (frame period not including a current measurement period) in which the characteristic compensation of the drive transistor T2 in the pixel circuit 50 is not performed, and also in the present embodiment, in a frame period including a current measurement period, the voltage fluctuation compensation line drive circuit 350 stops an operation and all the output signals of the voltage fluctuation compensation line drive circuit 350 go into a high-impedance state at low level.

Figure 39:
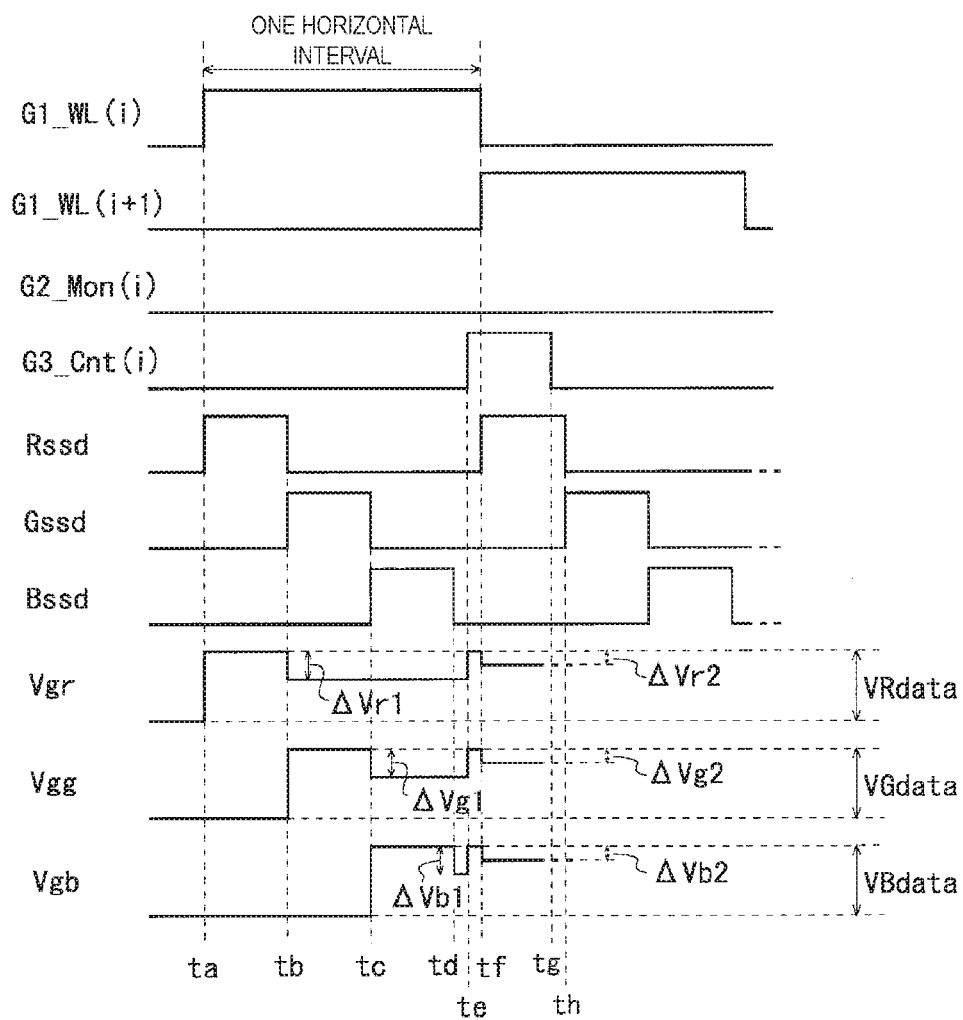
FIG. 39 is a signal waveform chart for describing an operation for writing pixel data into a pixel circuit in the second embodiment.

FIG. 39 is a signal waveform chart for describing an operation for writing pixel data into the pixel circuit 50. This operation is performed in the frame period (frame period not including a current measurement period) in which the voltage fluctuation compensation line drive circuit 350 operates. As can be seen by comparing this FIG. 39 with FIG. 24, an operation of writing pixel data in the present embodiment does not require a pull down signal CPD, and the fact that the voltage fluctuation compensation line G3_Cnt (i) corresponding to the row to be written returns to low level approximately 1/3 horizontal interval after the voltage fluctuation compensation line G3_Cnt (i) becoming high level (voltage VCNT) is different from that in the operation of writing pixel data in the first embodiment. More specifically, as illustrated in FIG. 39, the time point tg at which the voltage of the voltage fluctuation compensation line G3_Cnt (i) corresponding to the row to be written returns from a high level to a low level is a time point before the time point (time point at which the red pixel connection control signal Rssd changes from a high level to a low level) th at which the first transistor SWr of the demultiplexer 252 which is switched on first in the selection period of the write control line G1_WL (i+1) to be selected next starts changing to the off state. This first transistor SWr first changes from an on state to an off state among the transistors SWr, SWg, and SWb in each demultiplexer 252 in the selection period of the write control line G1_WL (i+1), and at the time point tg, the analog video signal Dj is supplied to the data line SLrj via the switched-on first transistor SWr from (the data voltage output unit circuit 211d of) the data line drive circuit 210 (see FIG. 4). Therefore, the voltage of the date line SLrj is not affected by the change of the voltage of the voltage fluctuation compensation line G3_Cnt (i) from the high level to the low level.

The operation of writing pixel data in the present embodiment is similar to the operation of writing pixel data in the first embodiment, except for the fact that the voltage fluctuation compensation line G3_Cnt (i) corresponding to the row to be written changes as described above, and the waveforms of the selected red pixel gate voltage Vgr, the selected green pixel gate voltage Vgg, and the selected blue pixel gate voltage Vgb indicating pixel data written into the selected red pixel circuit 50r, the selected green pixel circuit 50g, and the selected blue pixel circuit 50b respectively, are also similar. Therefore, also in the present embodiment, in the operation of writing pixel data into each pixel circuit 50x (x=r, g, b), the field through voltage ΔVx1 generated by the change from the on state to the off state of the transistor SWx in the demultiplexer 252 for the SSD scheme (decrease in the gate voltage Vgx of the drive transistor T2) is canceled out or compensated by the potential change of the voltage fluctuation compensation line G3_Cnt (i) connected to the pixel circuit 50x. That is, the field through compensation action can be obtained also in the present embodiment.

In addition thereto, in the present embodiment, the pull down signal CPD is not required, and the configuration of the voltage fluctuation compensation line drive circuit 350 is simplified (see FIG. 34 and FIG. 36), thereby reducing power consumption. Specifically, in the unit circuit 36 of the shift resistor 36sr included in the voltage fluctuation compensation line drive circuit 350, the transistors T355 and T356 used in the unit circuit 35 in the first embodiment are not required (see FIG. 36 and FIG. 20), thereby reducing power consumption. Furthermore, in the first embodiment, once the voltage of each voltage fluctuation compensation line G3_Cnt (i) changes to high level, the voltage is maintained at high level until the pull down signal CPD becomes active (high level) in the vertical blanking period (see FIG. 23), so that the high-level voltage will be applied to the gate terminal of the TFT as the transistor T4 of each pixel circuit 50 for a long time. Therefore, there is a possibility that the reliability may be decrease due to the shift of the threshold value of the transistor T4. However, according to the present embodiment, the time during which the high-level voltage is applied to the gate terminal of the transistor T4 is shortened, that is, the duty ratio of the voltage (ratio of the time during which the high level is maintained) to be applied to the gate terminal of the transistor T4 decreases, so that the threshold shift of the transistor T4 can be suppressed. From this point of view, the present embodiment is particularly effective when, for example, a transistor having a large shift on the positive voltage side of the threshold value Vt, such as a TFT in which the channel layer is formed of amorphous silicon, is used in the pixel circuit 50 as a transistor of the pixel circuit 50.

Note that, a characteristic compensation process of the drive transistor T2 of the pixel circuit 50 and the configuration and operation for the current measurement for the process in the present embodiment are similar to those in the first embodiment. Therefore, also in the present embodiment, a similar effect to that related to the measurement of the drive current of the pixel circuit in the first embodiment is obtained (see FIG. 28 to FIG. 33).

3. Third Embodiment

Next, an active-matrix organic EL display device according to a third embodiment of the present invention will be described. The organic EL display device according to the first and second embodiment is configured, in the operation of writing pixel data into each pixel circuit 50x (x=r, g, b), to compensate the field through voltage ΔVx1 generated by change from an on state to an off state of the transistor SWx in the demultiplexer 252 for the SSD scheme. In the first and second embodiments, the counter voltage VCNT used for compensating this field through voltage ΔVx1 is an identical fixed value as a power supply voltage VDD used in the other drive circuits 200, 300, and 400, and the voltage amplitude of the voltage fluctuation compensation line G3_Cnt is described only when it is identical to the voltage amplitude Vpp of the write control line G1_WL or the like. On the other hand, in the present embodiment, the counter voltage VCNT is configured to be changeable, and the counter voltage VCNT can take a value that is different from the power supply voltage VDD. Except for a configuration for variable counter voltage, the organic EL display device according to the present embodiment has a configuration similar to that in the first embodiment. Therefore, in the configuration in the present embodiment, identical or corresponding parts to those in the first embodiment are followed by the identical reference signs, and the detailed description thereof is omitted.

Figure 40:
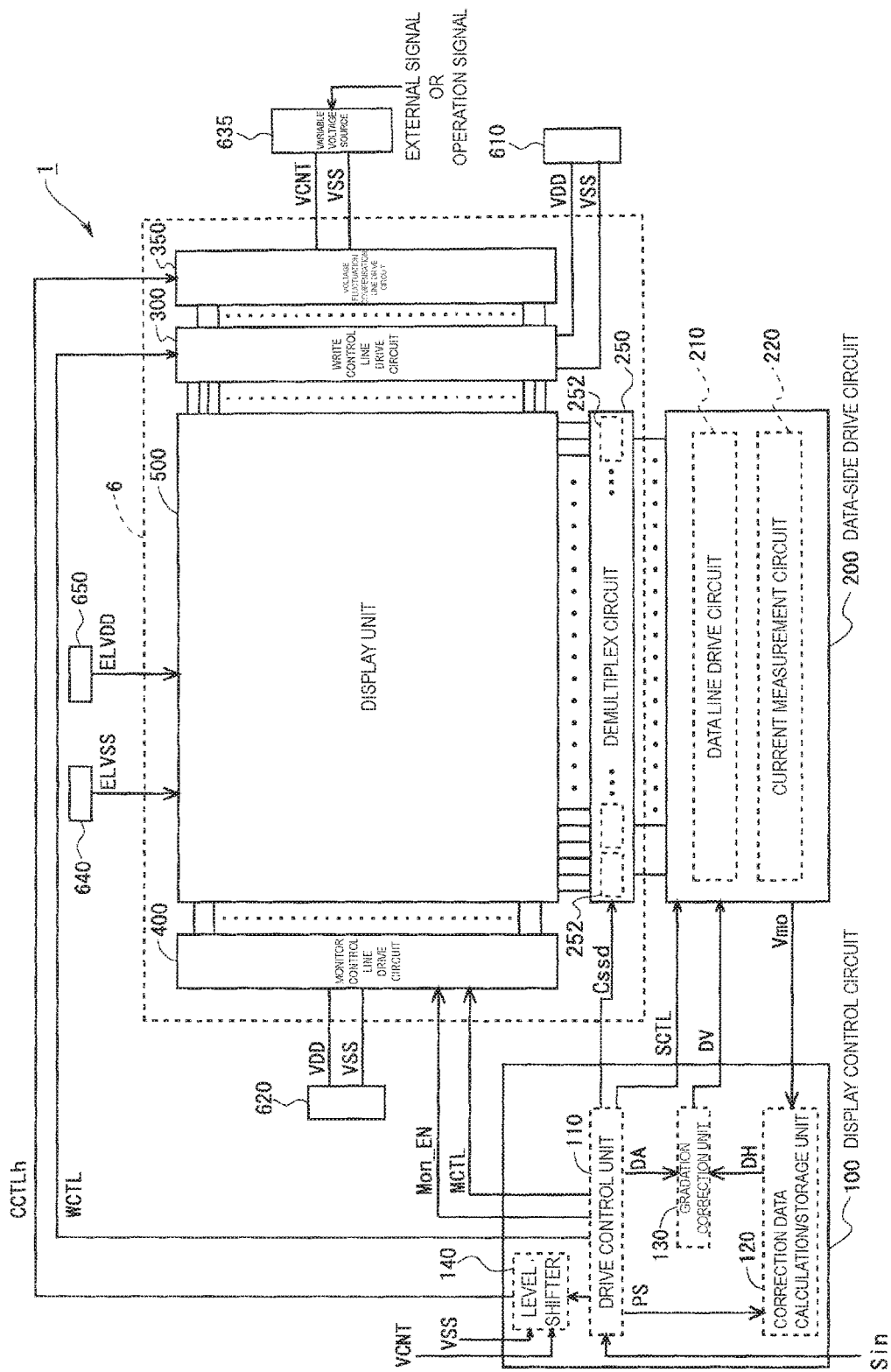
FIG. 40 is a block diagram illustrating an overall configuration of an organic EL display device according to a third embodiment of the present invention.
Figure 41:
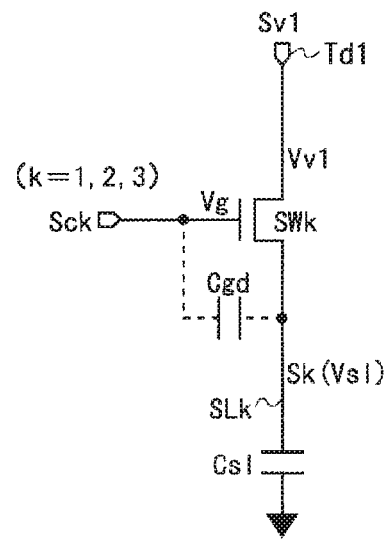
FIG. 41 is a circuit diagram illustrating a configuration of a unit sample hold circuit in the related art.
Figure 42:
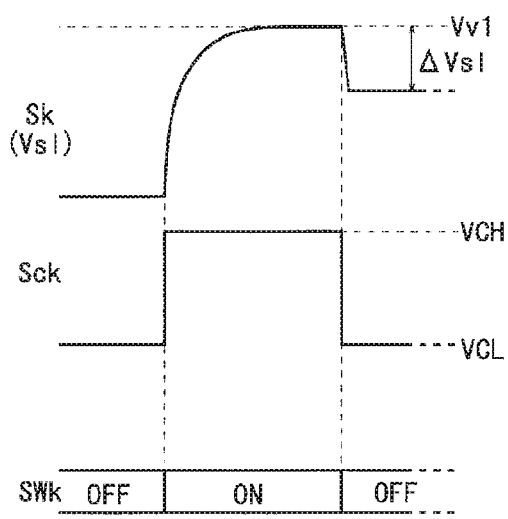
FIG. 42 is a signal waveform chart illustrating an operation of the unit sample hold circuit in the related art.

FIG. 40 is a block diagram illustrating the overall configuration of the organic EL display device according to the present embodiment. In this organic EL display device, unlike the first embodiment (FIG. 1), a variable voltage source 635 is provided as a voltage source for supplying a power supply voltage to the voltage fluctuation compensation line drive circuit 350. A counter voltage VCNT as a high-level power supply voltage and a low-level power supply voltage VSS are supplied from the variable voltage source 635 to the voltage fluctuation compensation line drive circuit 350, and the voltage fluctuation compensation line drive circuit 350 operates based on these power supply voltages VCNT and VSS. This variable voltage source 635 is configured so that a value of the counter voltage VCNT is changeable by an external control signal of the organic EL display device 1 (for example, a control signal included in the input signal Sin) or an operation to an adjustment operation unit not illustrated.

Furthermore, corresponding to the above-mentioned configuration, as illustrated in FIG. 40, the display control circuit 100 in the present embodiment includes a level shifter 140 converting the voltage level of signals such as a start pulse signal CSP, a clock signal CLK5, a clock signal CLK6, and a pull down signal CPD configuring the voltage fluctuation compensation control signal CCTL to be supplied to the voltage fluctuation compensation line drive circuit 350. This level shifter 140 converts the voltage level of the voltage fluctuation compensation control signal CCTL generated in the gate control signal generation circuit 117 (FIG. 6) in the drive control unit 110, and generates a voltage fluctuation compensation control signal CCTLh that sets the low-level power supply voltage VSS to a low level and the counter voltage VCNT to a high level. The generated voltage fluctuation compensation control signal CCTLh is input to the voltage fluctuation compensation line drive circuit 350.

Although the present embodiment having the above configuration functionally operates similarly to the first embodiment, the counter voltage VCNT can be set to a value different from the power supply voltage VDD used in the other drive circuits 200, 300, and 400, and hence, a specific operation and effect as follows can be exhibited.

Also in the present embodiment, the operation of writing pixel data into each pixel circuit 50 is similar to that in the first embodiment. That is, as illustrated in FIG. 24, the red pixel connection control signal Rssd, the green pixel connection control signal Gssd, and the blue pixel connection control signal Bssd applied to each demultiplexer 252 successively become active (high level) in one horizontal interval, whereby the analog video signal Dj is written as red pixel data voltage VRdata, green pixel data voltage VGdata, and blue pixel data voltage VBdata, respectively, into the selected red pixel circuit 50r, the selected green pixel circuit 50g, and the selected blue pixel circuit 50b. Here, focusing on the writing of pixel data into the red pixel circuit 50r, as illustrated in FIG. 24, similarly to the first embodiment, at the time point tb, due to the change from the on voltage (high level) to the off voltage (low level) of the red pixel connection control signal Rssd applied to the demultiplexer 252, the selected red pixel gate voltage Vgr decreases from the red pixel data voltage VRdata by the first field through voltage $\Delta Vr1$ obtained by the following equation.

$$\Delta Vr1 = Vssd \times Cssdr/Ctot1 \quad (21)$$

Here, Vssd is a voltage amplitude (a difference between the on voltage and the off voltage) of the red pixel connection control signal Rssd. On the other hand, at the time point te, due to the change from the low level (VSS) to the high level (VCNT) of the voltage of the voltage fluctuation compensation line G3_Cnt (i), the selected red pixel gate voltage Vgr increases by the compensation voltage $\Delta Vr3$ obtained by the following equation (note that VSS=0).

$$\Delta Vr3 = VCNT \times Ccnt/Ctot1 \quad (22)$$

Furthermore, at the time point tf, the selected red pixel gate voltage Vgr decreases by the second field through voltage $\Delta Vr2$ obtained by the following equation due to the change from the high level to the low level of the voltage of the write control line G1_WL (i) connected to the selected red pixel circuit 50r.

$$\Delta Vr2 = VG1 \times Cgd2/Ctot2 \quad (23)$$

Here, VG1 is a voltage amplitude of the write control line G1_WL (i). Similar to the first embodiment, Vssd=VG1, however when Vpp=Vssd=VG1, VCNT≠Vpp in the present embodiment.

Therefore, the selected red pixel gate voltage Vgr at the time point f at which the write control line G1_WL (i) changes from being in a selected state to being in a non-selected state is obtained by the following equation.

$$\begin{aligned} Vgr &= VRdata - \Delta Vr1 + \Delta Vr3 - \Delta Vr2 \quad (24) \\ &= VRdata - Vpp(Cssdr/Ctot1 + Cgd2/Ctot2) + \\ &\quad VCNT \times Ccnt/Ctot1 \end{aligned}$$

On the other hand, in a case where it is assumed that the transistor T4 for voltage fluctuation compensation is not provided in each pixel circuit 50, each pixel circuit 50 has a configuration (Ccnt=0) as illustrated in FIG. 25, and the selected red pixel gate voltage Vgr is obtained by $$Vgr = VRdata - Vpp(Cssdr/Ctot1 + Cgd2/Ctot2) \quad (25).$$

In this case, decrease in voltage is large due to the parasitic capacitance Cssdr of the first transistor of the demultiplexer 252 and the parasitic capacitance Cgd2 of the input transistor T1 of the pixel circuit 50 for the SSD scheme.

As can be seen from comparison between Equations (24) and (25), according to the present embodiment, the decrease in the selected red pixel gate voltage Vgr due to the parasitic capacitance Cssdr in the circuit for the SSD scheme can be suppressed, and the counter voltage VCNT is changed to a value larger than the Vpp, thereby this suppress effect can be enhanced further than that of the first embodiment. This applies not only to the writing of the pixel data into the red pixel circuit 50r, but also to the writing of the pixel data into the green pixel circuit 50g and the blue pixel circuit 50b.

Next, the above-mentioned effect of the present embodiment is described by using specific numerical values. However, the following numerical values and the numerical values indicating the specification of the organic EL panel as the display panel are merely examples, and the present invention is not limited thereto.

Hereafter, the following numerical conditions are assumed.

(a) The resolution of the display panel is WVGA (800×480×RGB).

(b) Both values of the parasitic capacitance Cgd2 between the gate and the drain and the parasitic capacitance Cgd2 between the gate and the source of the input transistor T1 in the pixel circuit 50 are 10 [a.u.]. Here, the unit [a.u.] is an arbitrary unit (the same applies hereafter).

(c) The value of the parasitic capacitance Cssdr of the first transistor SWr in the demultiplexer 252 is 20 [a.u.].

(d) Both of the amplitude Vssd of the connection control signal for the SSD and the voltage amplitude VG1 of the write control line G1_WL (i) are 12 [a.u.] (Vpp=Vssd=VG1=12 [a.u.]).

(e) The voltage amplitude of the voltage fluctuation compensation line G3_Cnt (i), that is, the counter voltage VCNT, is 24 [a.u.].

The above-mentioned numerical conditions are identical to the numerical conditions (a) to (c) described previously for explaining the effect of the first embodiment except for the (d), (e).

Equation (24) indicates the selected red pixel gate voltage Vgr which determines the drive current IoelR in the selected red pixel circuit 50r in the present embodiment (see FIG. 4), and Equation (25) indicates the selected red pixel gate voltage Vgr which determines the drive current IoelR in the selected red pixel circuit 50r in the related art (see FIG. 25). Among them, the compensation voltage $\Delta Vr3 = VCNT \times (Ccnt/Ctot1)$ included in Equation (24) represents an amount of increase in voltage by the voltage fluctuation compensation line G3_Cnt (i) and the first field through voltage $\Delta Vr1 = Vpp \times Cssdr/Ctot1 = Vssd \times Cssdr/Ctot1$ included in Equations (24) and (25) represents an amount of decrease in voltage caused by the parasitic capacitance Cssdr in the circuit for the SSD scheme. Values of the compensation voltage $\Delta Vr3$ for the amount of increase in voltage and the first field through voltage $\Delta Vr1$ for the amount of decrease in voltage are obtained as follows based on the (a) to (e). That is, the total sum of the capacitance parasitic to the drain side of the first transistor SWr, that is, the red pixel data line total capacitance Ctot1 can be approximately represented as follows by using the capacitance Cgs2 between the gate and the source, the voltage fluctuation compensation capacity Ccnt and the like, in the input transistor T1 of each red pixel circuit 50r.

$$Ctot1 = (Cgs2 + Ccnt) \times 800 \text{ (number of vertical pixels)} + Cssdr \qquad (26)$$
$$= (10 + 10) \times 800 + 20$$
$$= 16020 \text{ [a.u.]}$$

Therefore, the compensation voltage $\Delta Vr3$ for the amount of increase in voltage is obtained by $$\Delta Vr3 = VCNT \times (Ccnt/Ctot1) \qquad (27)$$
$$= 24 \times (10/16020)$$
$$= 0.015 \text{ [a.u.]}$$

and the first field through voltage $\Delta Vr1$ for the amount of decrease in voltage is obtained by $$\Delta Vr1 = Vssd \times Cssdr/Ctot1 \qquad (28)$$
$$= 12 \times 20/16020$$
$$= 0.015 \text{ [a.u.]}.$$

Therefore, in the examples based on the numerical conditions (a) to (e), 100% of the amount of decrease in voltage (Equation (28)) of the pixel data by the field through phenomenon in the circuit for the SSD is canceled out by the field through compensation action based on the voltage change in a voltage fluctuation compensation line G3_Cnt (i).

According to the present embodiment, based on the counter voltage VCNT, the effect due to such a field through compensation action can be obtained, and the data line drive circuit 210 (see FIG. 1 and FIG. 4) can also be compensated by setting this counter voltage VCNT in a case where the output voltage (the voltage of the analog video signal Dj) is insufficient.

As described above, the present embodiment is a modification of the first embodiment so as to have a configuration for variable counter voltage VCNT; however, instead of this, in the second embodiment, the level shifter 140 may be added in the display control circuit 100 and the power supply 630 for the voltage fluctuation compensation line drive circuit 350 may be changed to the variable voltage source 635 (see FIG. 40), thereby having a configuration for the variable counter voltage VCNT.

Note that, in the above-mentioned embodiment, instead of the configuration for the variable counter voltage VCNT, the counter voltage VCNT may be configured to be set to a fixed value that can sufficiently cancel out the first field through voltage $\Delta Vr1$ or the like. That is, the power source 630 for supplying the fixed voltage may be used instead of the above-mentioned variable voltage source 635, and the counter voltage VCNT may be set to a value that is different from the power source voltage VDD used in the other drive circuits 200, 300 and 400, and is a fixed value that fully cancels out the first field through voltage Vr1 (or both of the first field through voltage $\Delta Vr1$ and the second field through voltage $\Delta Vr2$) by the above-mentioned compensation voltage $\Delta Vr3$.

4. Modifications

The present invention is not limited to each of the above-mentioned embodiments, and various modifications can be applied without departing from the scope of the present invention. For example, in each of the above-mentioned embodiments, an organic EL display device has been described as an example; however, as long as a display device includes a display element driven with a current, the present invention can also be applied to a display device other than the organic EL display device.

In addition, in each of the above-mentioned embodiments, the characteristic detection process period including the current measurement period is provided during the effective scan period to display one frame of the image (FIG. 27), however, the present invention is not limited thereto, and instead of this, for example, a configuration may be adopted in which the characteristic detection process including the current measurement is performed for each predetermined number of lines in the vertical blanking period (see PTL 2 (WO 2014/021201)). The content of this PTL 2 is incorporated herein by reference. Furthermore, the pixel circuit 50 is not limited to the configuration illustrated in FIG. 4, and a configuration may be adopted in which the monitor control transistor T3 for the current measurement is provided between the connection point of the organic EL element OLED with the drive transistor T2, and the data line SL.

Furthermore, in each of the above-mentioned embodiments, the transistors used in the pixel circuit 50 and the demultiplexer 252 are each N-channel type transistors; however, instead of this, a configuration may be adopted in which P-channel type transistors may be used. When N-channel type transistors are used as in each of the above-mentioned embodiments, the voltage Vsl held in the data line SLxj (x=r, g, b) or the gate voltage Vgx of the drive transistor T2 in the pixel circuit 50 may decrease due to the field through phenomenon; however, when P-channel type transistors are used, the voltage Vsl held in the data line SLjx and the gate voltage Vgx of the drive transistor T2 in the pixel circuit 50 may increase due to the field through phenomenon. When N-channel type transistors are used, in order to cancel out the decrease in voltage due to the field through phenomenon, the voltage fluctuation compensation line drive circuit 350 is configured so that the voltage of the voltage fluctuation compensation line G3_Cnt (i) at the time point tf is changed from a low level to a high level (the counter voltage VCNT) as illustrated in FIG. 24; however, when P-channel type transistors are used, in order to cancel out the increase in voltage due to the field through phenomenon, the voltage fluctuation compensation line drive circuit 350 is configured so that the voltage of the voltage fluctuation compensation line G3_Cnt (i) is changed from a high level to a low level at a time point corresponding to the time point te. Note that, at this time, the voltage of the voltage fluctuation compensation line G3_Cnt (i) will be changed in a direction opposite to the voltage change of the connection control signals Rssd, Gssd, and Bssd to change the transistor in the demultiplexer 252 from an on state to an off state, which is similar to the case in which the N-channel type transistor is used.

INDUSTRIAL APPLICABILITY

The present invention can be applied to a display device including a display element driven with a current, a method of driving the display device, and a pixel circuit in such display device, and is particularly suitable to an active-matrix organic EL display device employing the SSD scheme, or the like.

REFERENCE SIGNS LIST

1 Organic EL display device
6 Organic EL panel
3, 4, 35sr, 36sr Shift register
30, 35, 36, 40 Unit circuit (in shift register)
50, 50r, 50g, 50b Pixel circuit
100 Display control circuit
110 Drive control unit
116 Image data/source control signal generation circuit
117 Gate control signal generation circuit
120 Correction data calculation/storage unit
130 Gradation correction unit
210 Data line drive circuit
211 Data-side unit circuit
220 Current measurement circuit
252 Demultiplexer
300 Write control line drive circuit
350 Voltage fluctuation compensation line drive circuit
400 Monitor control line drive circuit
500 Display unit
635 Variable voltage source
T1 Input transistor
T2 Drive transistor
T3 Monitor control transistor
T4 Voltage fluctuation compensation transistor
SWr, SWg, SWb Transistor (connection control transistor) for SSD
Cst Capacitor (voltage holding capacity)
Ccnt Capacitor (voltage fluctuation compensation capacity)
Cssdr, Cssdg, Cssdb Parasitic capacitance of transistor
SL, SLrj, SLgj, SLbj Data line (j=0 to M)
G1_WL, G1_WL (0) to G1_WL (1079) Write control line
G2_Mon, G2_Mon (0) to G2_Mon (1079) Monitor control line
G3_Cnt, G3_Cnt (0) to G3_Cnt (1079) Voltage fluctuation compensation line
CLK1 to CLK6 Clock signal
Mon_EN Monitor enable signal
Rssd, Gssd, Bssd Connection control signal
VCNT Counter voltage (second voltage)
VSS Low-level power supply voltage (first voltage)

The invention claimed is:

1. A pixel circuit in a display device, the display device including a plurality of data lines through which a plurality of analog voltage signals representing an image to be displayed are transmitted; a plurality of write control lines crossing the plurality of data lines; and a plurality of display elements driven by a current and arranged in a matrix along the plurality of data lines and the plurality of write control lines, the display device including a function of measuring a drive current to be applied to each display element, and the pixel circuit being arranged to correspond to any one of the plurality of data lines and correspond to any one of the plurality of write control lines, the pixel circuit comprising:
    an electro-optical element with a brightness controlled by a current, the electro-optical element being one of the plurality of display elements;
    a voltage holding capacitor that holds a data voltage to control a drive current of the electro-optical element;
    an input transistor including a control terminal connected to a corresponding write control line, the input transistor being a switching element that controls a voltage supply from a corresponding data line to the voltage holding capacitor;
    a drive transistor that applies a drive current corresponding to the data voltage to the electro-optical element;
    a monitor control transistor including a control terminal connected to a predetermined monitor control line arrayed along the corresponding write control line, the monitor control transistor being arranged between the drive transistor and the corresponding data line to allow a current flowing through the drive transistor to pass through;
    a voltage fluctuation compensation transistor including a control terminal connected to a predetermined voltage fluctuation compensation line arrayed along the corresponding write control line and a first conduction terminal connected to the corresponding data line, the voltage fluctuation compensation transistor being connected in series to the monitor control transistor; and
    a voltage fluctuation compensation capacitor defined between the first conduction terminal in the voltage fluctuation compensation transistor and the control terminal in the voltage fluctuation compensation transistor, wherein
    the voltage fluctuation compensation transistor changes from an off state to an on state in a period during which the input transistor is in an on state.

2. A display device including a plurality of data lines through which to transmit a plurality of analog voltage signals representing an image to be displayed; a plurality of write control lines crossing the plurality of data lines; and a plurality of display elements driven by a current and arranged in a matrix along the plurality of data lines and the plurality of write control lines, the display device including a function of measuring a drive current to be applied to each display element, the display device comprising:
    a plurality of the pixel circuits according to claim 1 arranged in the matrix along the plurality of data lines and the plurality of write control lines with each of the plurality of pixel circuits being corresponded to any one of the plurality of data lines and corresponded to any one of the plurality of write control lines;
    a plurality of monitor control lines arrayed along the plurality of write control lines to correspond to each of the plurality of write control lines;
    a plurality of voltage fluctuation compensation lines arrayed along the plurality of write control lines to correspond to each of the plurality of write control lines;
    a plurality of connection control transistors corresponding to each of the plurality of data lines, each of the plurality of connection control transistors including a first conduction terminal connected to a corresponding data line, a second conduction terminal that receives an analog voltage signal to be applied to the corresponding data line, and a control terminal that receives a connection control signal to control switching on and off;
    a data line drive circuit that applies the analog voltage signal to the second conduction terminal of each of the plurality of connection control transistors;
    a write control line drive circuit that selectively drives the plurality of write control lines;
    a monitor control line drive circuit that selectively drives the plurality of monitor control lines;
    a voltage fluctuation compensation line drive circuit that selectively drives the plurality of voltage fluctuation compensation lines;
    a current measurement circuit that measures, via the plurality of data lines and the plurality of connection control transistors, a drive current to be applied to a display element in each pixel circuit; and
    drive control circuitry that controls the plurality of connection control transistors, the write control line drive circuit, the monitor control line drive circuit, and the voltage fluctuation compensation line drive circuit; wherein
    the data line drive circuit includes a predetermined number of output terminals respectively corresponding to a plurality of sets of data line groups obtained by grouping the plurality of data lines with one set includes a predetermined number of two or more data lines, each output terminal is connected to a second conduction terminal of a predetermined number of connection control transistors corresponding to a predetermined number of data lines of a corresponding set,
    the drive control circuitry generates a predetermined number of connection control signals respectively corresponding to a predetermined number of data lines of each set and respectively applies the predetermined number of connection control signals to the control terminals of the predetermined number of connection control transistors corresponding to a predetermined number of data lines of each set to thereby successively switch on the predetermined number of connection control transistors of each set for each predetermined period in a first selection period during which any one of the plurality of write control lines is in a selected state, and
    in the first selection period, the voltage fluctuation compensation line drive circuit changes, after the plurality of connection control transistors are changed from an on state to an off state, a voltage to be applied to a voltage fluctuation compensation line corresponding to a write control line in the selected state from a first voltage to a second voltage to thereby change a voltage of the corresponding voltage fluctuation compensation line in direction opposite to a change of a voltage to be applied to the control terminals of the plurality of connection control transistors to change the plurality of connection control transistors from an on state to an off state.

3. The display device according to claim 2, wherein the voltage fluctuation compensation line drive circuit returns, in a period during which the plurality of write control lines are in a non-selected state after the first selection period, the voltage of the voltage fluctuation compensation line corresponding to the write control line in the selected state in the first selection period from the second voltage to the first voltage.

4. The display device according to claim 2, wherein the voltage fluctuation compensation line drive circuit returns, in a period during which a write control line selected subsequently to the write control line in the selected state in the first selection period is in the selected state, the voltage of the voltage fluctuation compensation line corresponding to the write control line in the selected state in the first selection period from the second voltage to the first voltage, before the connection control transistor first changing from an on state to an off state starts the change to the off state.

5. The display device according to claim 2, further comprising:
    a voltage source that supplies the first voltage and the second voltage to the voltage fluctuation compensation line drive circuit, wherein a difference between the first voltage and the second voltage is changeable.

6. The display device according to claim 2, wherein the first voltage and the second voltage are set to cancel out a voltage fluctuation in the plurality of data lines occurring as a result of the plurality of connection control transistors being changed from an on state to an off state in the first selection period, by a change from the first voltage to the second voltage of the voltage of the voltage fluctuation compensation line corresponding to the write control line in the selected state in the first selection period.

7. The display device according to claim 2, wherein
    upon measurement of a drive current to be applied to a display element in a pixel circuit corresponding to any one write control line of the plurality of write control lines,
    the drive control circuitry:
        controls, in a non-selection period, during the non-selection period the plurality of write control lines being in a non-selected state, the non-selection period occurring immediately after a second selection period, during the second selection period the one write control line being selected, the monitor control line drive circuit and the voltage fluctuation compensation line drive circuit to cause a monitor control transistor and a voltage fluctuation compensation transistor in the pixel circuit corresponding to the one write control line to be switched on; and applies the predetermined number of connection control signals to the control terminals of the predetermined number of connection control transistors corresponding to a predetermined number of data lines of each set to thereby successively switch on the predetermined number of connection control transistors of each set for each predetermined period in the non-selection period, and the current measurement circuit measures a current flowing through a drive transistor in the pixel circuit corresponding to the one write control line via a switched-on transistor out of the monitor control transistor, the voltage fluctuation compensation transistor, and the predetermined number of connection control transistors of each set.

8. The display device according to claim 2, wherein a transistor included in each pixel circuit and the plurality of connection control transistors are thin film transistors with a channel layer made of an oxide semiconductor.

9. A driving method of a display device, the display device including a plurality of data lines through which to transmit a plurality of analog voltage signals representing an image to be displayed; a plurality of write control lines intersecting the plurality of data lines; a plurality of display elements driven by a current and arranged in a matrix along the plurality of data lines and the plurality of write control lines; and a plurality of connection control transistors arranged to correspond to each of the plurality of data lines, each of the plurality of connection control transistors including a first conduction terminal connected to a corresponding data line, a second conduction terminal that receives an analog voltage signal to be applied to the corresponding data line, and a control terminal that receives a connection control signal to control switching on and off, the display device including a function of measuring a drive current to be applied to each display element, the method comprising:

a connection control step of controlling switching on and off of the plurality of connection control transistors;

a data line driving step of applying the analog voltage signal to the second conduction terminal of each of the plurality of connection control transistors;

a write control line driving step of selectively driving the plurality of write control lines;

a monitor control line driving step of selectively driving a plurality of monitor control lines arrayed to correspond to each of the plurality of write control lines; and a voltage fluctuation compensation line driving step of selectively driving a plurality of voltage fluctuation compensation lines arrayed to correspond to each of the plurality of write control lines, wherein the display device includes a plurality of pixel circuits arranged in the matrix along the plurality of data lines and the plurality of write control lines, each pixel circuit corresponding to any one of the plurality of data lines and corresponding to any one of the plurality of write control lines, each pixel circuit includes:
an electro-optical element as a display element with a brightness controlled by a current;
a voltage holding capacitor that holds a data voltage controlling a drive current of the electro-optical element;
an input transistor including a control terminal connected to a corresponding write control line, the input transistor being a switching element that controls a voltage supply from a corresponding data line to the voltage holding capacitor;
a drive transistor that applies a drive current corresponding to the data voltage to the electro-optical element;
a monitor control transistor including a control terminal connected to a monitor control line corresponding to the corresponding write control line, the monitor control transistor being arranged between the drive transistor and the corresponding data line to allow a current flowing through the drive transistor to pass through;
a voltage fluctuation compensation transistor including a control terminal connected to a voltage fluctuation compensation line corresponding to the corresponding write control line and a first conduction terminal connected to the corresponding data line, the voltage fluctuation compensation transistor being connected in series to the monitor control transistor; and
a voltage fluctuation compensation capacitor defined between the first conduction terminal in the voltage fluctuation compensation transistor and the control terminal in the voltage fluctuation compensation transistor, in the data line driving step, the analog voltage signal is output from each output terminal of a data line drive circuit including a predetermined number of output terminals respectively corresponding to a plurality of sets of data line groups obtained by grouping the plurality of data lines where one set includes a predetermined number of two or more data lines, each output terminal is connected to a second conduction terminal of a predetermined number of connection control transistors corresponding to a predetermined number of data lines of a corresponding set, in the connection control step, a predetermined number of connection control signals respectively corresponding to a predetermined number of data lines of each set are generated and the predetermined number of connection control signals are respectively applied to the control terminals of the predetermined number of connection control transistors corresponding to a predetermined number of data lines of each set to thereby successively switch on the predetermined number of connection control transistors of each set for each predetermined period in a first selection period during which any one of the plurality of write control lines is in a selected state, and in the voltage fluctuation compensation line driving step, in the first selection period, after the plurality of connection control transistors are changed from an on state to an off state, a voltage to be applied to a voltage fluctuation compensation line corresponding to a write control line in the selected state changes from a first voltage to a second voltage to thereby change a voltage of the corresponding voltage fluctuation compensation line in direction opposite to a change of a voltage to be applied to a control terminal of the plurality of connection control transistors to change the plurality of connection control transistors from an on state to an off state.

10. The driving method according to claim 9, further comprising:
a current measurement step of measuring, via the plurality of data lines and the plurality of connection control transistors, a current flowing through a drive transistor in each pixel circuit, wherein, when measuring a drive current to be applied to a display element in a pixel circuit corresponding to any one write control line of the plurality of write control lines, in the monitor control line driving step, in a non-selection period, during the non-selection period the plurality of write control lines being in a non-selected state, the non-selection period occurring immediately after a second selection period, during the second selection period the one write control line being selected, the plurality of monitor control lines are driven to cause a monitor control transistor in the pixel circuit corresponding to the one write control line to be switched on, in the voltage fluctuation compensation line driving step, in the non-selection period, the plurality of voltage fluctuation compensation lines are driven to cause a voltage fluctuation compensation transistor in the pixel circuit corresponding to the one write control line to be switched on, in the connection control step, the predetermined number of connection control signals are respectively applied to the control terminals of the predetermined number of connection control transistors corresponding to a predetermined number of data lines of each set to thereby successively switch on the predetermined number of connection control transistors of each set for each predetermined period in the non-selection period, and in the current measurement step, a current flowing through a drive transistor in the pixel circuit corresponding to the one write control line is measured via a switched-on transistor out of the monitor control transistor, the voltage fluctuation compensation transistor, and the predetermined number of connection control transistors of each set.

* * * * *